United States Patent [19]
Sano et al.

[11] Patent Number: 6,040,605
[45] Date of Patent: Mar. 21, 2000

[54] SEMICONDUCTOR MEMORY DEVICE

[75] Inventors: Toshiaki Sano, Tachikawa; Tomoyuki Ishii, Hachioji; Kazuo Yano, Hino; Toshiyuki Mine, Fussa, all of Japan

[73] Assignee: Hitachi, Ltd., Tokyo, Japan

[21] Appl. No.: 09/236,630

[22] Filed: Jan. 26, 1999

Related U.S. Application Data

[63] Continuation-in-part of application No. 09/126,437, Jul. 30, 1998.

[30] Foreign Application Priority Data

Jan. 28, 1998 [JP] Japan ................................. 10-015369

[51] Int. Cl.⁷ ........................... H01L 29/76; H01L 29/94; H01L 31/062; H01L 31/113
[52] U.S. Cl. ........................... 257/369; 257/66; 257/314; 257/368; 257/390
[58] Field of Search ............................ 257/66, 314, 368, 257/369, 390, 617

[56] References Cited

U.S. PATENT DOCUMENTS

| | | |
|---|---|---|
| 5,411,905 | 5/1995 | Acovic et al. . |
| 5,412,600 | 5/1995 | Nakajima . |
| 5,576,570 | 11/1996 | Ohsawa et al. ........................ 257/369 |
| 5,654,577 | 8/1997 | Nakamura et al. . |
| 5,793,087 | 8/1998 | Chevallier ............................. 257/390 |

FOREIGN PATENT DOCUMENTS

| | | |
|---|---|---|
| 0504946 | 9/1992 | European Pat. Off. . |
| 0642173 | 8/1994 | European Pat. Off. . |
| 9-213822 | 8/1997 | Japan . |
| 1297899 | 11/1972 | United Kingdom . |

OTHER PUBLICATIONS

Yano et al., "Room–Temperature Single–Electron Memory", IEEE Transactions on Electron Devices, vol. 41, No. 9, Sep. 1994.

*Primary Examiner*—Ngân V. Ngô
*Attorney, Agent, or Firm*—Antonelli, Terry, Stout & Kraus, LLP

[57] ABSTRACT

A memory cell with a small surface area is fabricated by forming source lines and data lines above and below and by running the channels to face up and down. The local data lines for each vertically stacked memory cell are connected to a global data line by way of separate selection by a molecular oxide semiconductor, and use of a large surface area is avoided by making joint use of peripheral circuits such as global data lines and sensing amplifiers by performing read and write operations in a timed multiplex manner. Moreover, data lines in multi-layers and memory cells (floating electrode cell) which are non-destructive with respect to readout are utilized to allow placement of memory cells at all intersecting points of word lines and data lines while having a folded data line structure. An improved noise tolerance is attained by establishing a standard threshold voltage for identical dummy cells even in any of the read verify, write verify and erase verify operations. A register to temporarily hold write data in a memory cell during writing is also used as a register to hold a flag showing that writing has ended during write verify. Also, a circuit comprised of one nMOS transistor is utilized as a means to change values on the write-end flag.

34 Claims, 48 Drawing Sheets

FIG. 13(a)
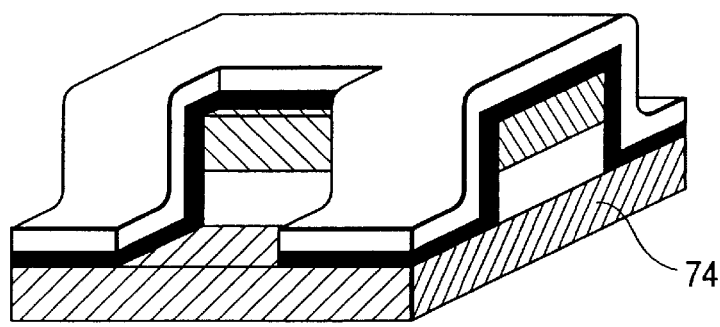
FIG. 13(b)
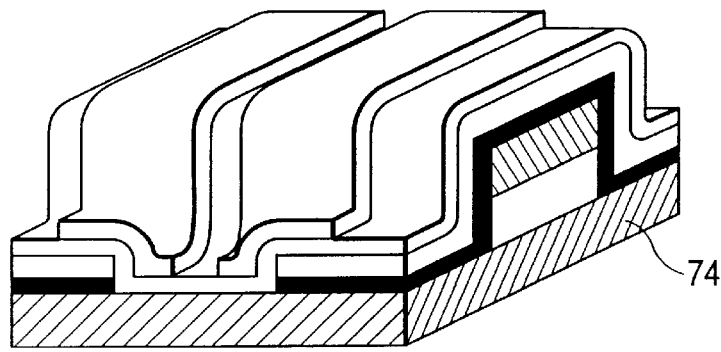
FIG. 14
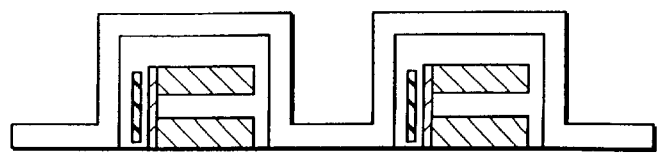
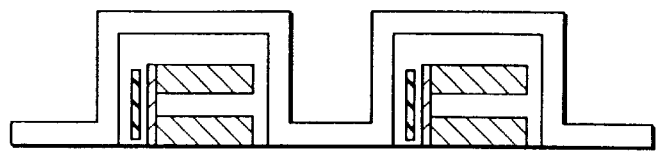

■ LOW POTENTIAL AREA (A39) (A42) (A40) (A41)

| READ OUT SEQUENCE | ERASE SEQUENCE | PROGRAM SEQUENCE |
|---|---|---|
| STEP1: PRE CHARGE 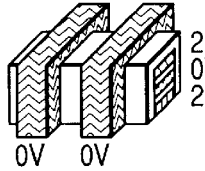 2.5V / 0V / 2.5V / 0V  0V | STEP1: PRE WRITE  0V / 0V / 0V / 15V  0V <br> ERASE CELL LIST={CELL1, CELL2} | STEP1: DATA INPUT  0V / 5V / 5V / 0V  0V <br> "1" PROGRAM CELL LIST={CELL1} |
| STEP2: READ/SENSE 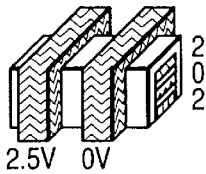 2.5V / 0V / 2.5V / 2.5V  0V | STEP2: READ DATA 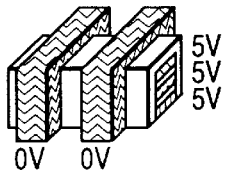 5V / 5V / 5V / 0V  0V <br> ERASE CELL LIST={CELL1, CELL2} | STEP2: PROGRAM  0V / 5V / 5V / 15V  0V <br> "1" PROGRAM CELL LIST={CELL1} |
|  | STEP3: ERASE 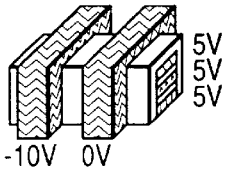 5V / 5V / 5V / -10V  0V <br> ERASE CELL LIST={CELL1, CELL2} | STEP3: PRE CHARGE 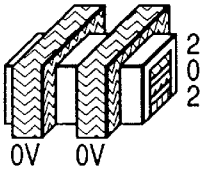 2.5V / 0V / 2.5V / 0V  0V <br> "1" PROGRAM CELL LIST={CELL1} |
|  | STEP4: PRE CHARGE 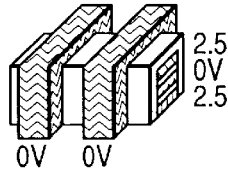 2.5V / 0V / 2.5V / 0V  0V <br> ERASE CELL LIST={CELL1, CELL2} | STEP4: PROGRAM VERIFY 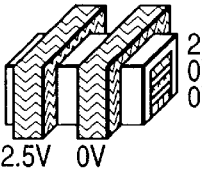 2.5V / 0V / 0V / 2.5V  0V <br> "1" PROGRAM CELL LIST={CELL1} |
|  | STEP5: ERASE VERIFY 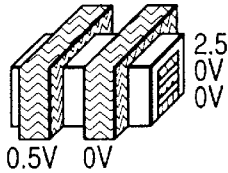 2.5V / 0V / 0V / 0.5V  0V <br> ERASE CELL LIST={CELL1, CELL2} | STEP5: CELL LIST RENEWAL <br> if(data line voltage high) <br> then <br>   delete from cell list <br> end if <br> "1" PROGRAM CELL LIST={CELL1} <br> ("1" PROGRAMMING FOR CELL1 IS FINISHED) |
|  | STEP6: CELL LIST RENEWAL <br> if(voltage of data line low) <br> then <br>   delete from cell list <br> end if <br> ERASE CELL LIST={CELL1} <br> (CELL2 DELETED, CELL1 UNDELETED) | STEP6: DETERMINATION OF ENDING PROGRAMMING LOOP <br> if(cell list empty) <br> then loop end <br> else return to step 1 <br> end if |
|  | STEP7: DETERMINATION OF ENDING ERASE LOOP <br> if(cell list empty) <br> then loop end <br> else return to step 2 <br> end if |  |

 STEP FLOW

FIG. 35

| READ OUT SEQUENCE | ERASE SEQUENCE | PROGRAM SEQUENCE |
|---|---|---|
| STEP1: PRE CHARGE<br>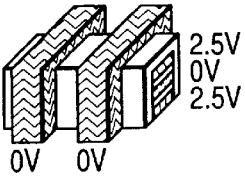<br>2.5V / 0V / 2.5V<br>0V  0V | STEP1: PRE WRITE<br>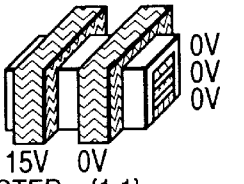<br>0V / 0V / 0V<br>15V  0V<br>REGISTER = {1,1} | STEP1: DATA INPUT<br>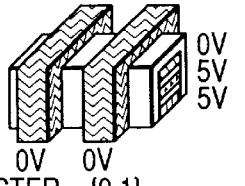<br>0V / 5V / 5V<br>0V  0V<br>REGISTER = {0,1} |
| STEP2: READ/SENSE<br>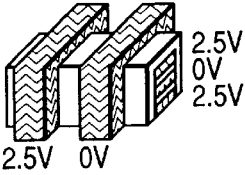<br>2.5V / 0V / 2.5V<br>2.5V  0V | STEP2: READ DATA<br>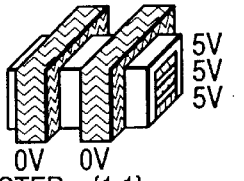<br>5V / 5V / 5V<br>0V  0V<br>REGISTER = {1,1} | STEP2<br>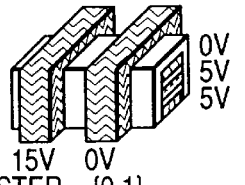<br>0V / 5V / 5V<br>15V  0V<br>REGISTER = {0,1} |
|  | STEP3: ERASE<br>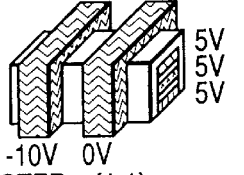<br>5V / 5V / 5V<br>-10V  0V<br>REGISTER = {1,1} | STEP3: PRE CHARGE<br>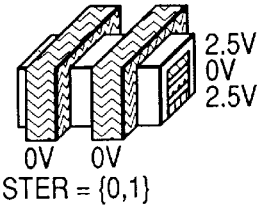<br>2.5V / 0V / 2.5V<br>0V  0V<br>REGISTER = {0,1} |
|  | STEP4: PRE CHARGE<br>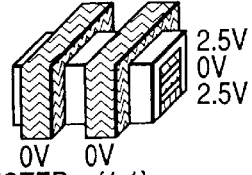<br>2.5V / 0V / 2.5V<br>0V  0V<br>REGISTER = {1,1} | STEP4: PROGRAM VERIFY<br>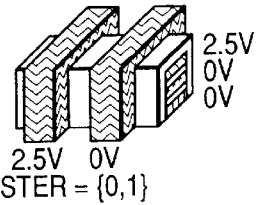<br>2.5V / 0V / 0V<br>2.5V  0V<br>REGISTER = {0,1} |
|  | STEP5<br>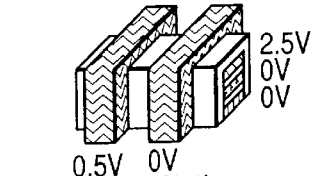<br>2.5V / 0V / 0V<br>0.5V  0V<br>REGISTER = {1,1} | STEP5: CELL LIST RENEWAL<br>if(data line voltage high)<br>&(register bit "0")<br>then<br>substitute "1" for register bit<br>end if<br>REGISTER = {1,1}<br>(PROGRAMMING FOR CELL 1 IS FINISHED) |
|  | STEP6: CELL LIST RENEWAL<br>if(data line voltage low)<br>&(register bit "1")<br>then<br>substitute "0" for register bit<br>end if<br>REGISTER = {1,0}<br>(CELL 2 DELETED, CELL 1 UNDELETED) | STEP6: DETERMINATION OF ENDING PROGRAMMING LOOP<br>if(all of the register bits "1")<br>then loop end<br>else return to step 1<br>end if |
|  | STEP7: DETERMINATION OF ENDING ERASE LOOP<br>if(all of the register bits "0")<br>then loop end<br>else return to step 2<br>end if |  |

STEP FLOW ↓

FIG. 37

| READ OUT SEQUENCE | ERASE SEQUENCE | PROGRAM SEQUENCE |
|---|---|---|
| STEP1: PRE CHARGE<br>2.5V / 0V / 2.5V<br>0V  0V | STEP1: PRE WRITE<br>0V / 0V / 0V<br>−15V  0V | STEP1: DATA INPUT<br>0V / 0V / 5V<br>0V  0V<br>REGISTER = {0,1} |
| STEP2: READ/SENSE<br>2.5V / 0V / 2.5V<br>2.5V  0V | STEP2: ERASE<br>0V / 0V / 0V<br>−15V  0V | STEP2: PROGRAM<br>0V / 5V / 5V<br>15V  0V<br>REGISTER = {0,1} |
| | STEP4: PRE CHARGE<br>2.5V / 0V / 2.5V<br>0V  0V | STEP3: PRE CHARGE<br>2.5V / 0V / 2.5V<br>0V  0V<br>REGISTER = {0,1} |
| | STEP5: ERASE VERIFY<br>2.5V / 0V / 0V<br>0.5V  0V | STEP4: PROGRAM VERIFY<br>2.5V / 0V / 0V<br>2.5V  0V<br>REGISTER = {0,1} |
| | STEP6: DETERMINATION OF ENDING ERASE LOOP<br>if(all of the voltage of the data lines are high)<br>then loop end<br>else return to step 2<br>end if | STEP5: CELL LIST RENEWAL<br>if(data line voltage high)<br>&(register bit "0")<br>then<br>substitute "1" for register bit<br>end if<br>REGISTER = {1,1}<br>(PROGRAMMING FOR CELL1 IS FINISHED) |
| | | STEP6: DETERMINATION OF ENDING PROGRAMMING LOOP<br>if(all of the register bits "1")<br>then loop end<br>else return to step 1<br>end if |

STEP FLOW ↓

FIG. 39

| | REFRESH SEQUENCE | | |
|---|---|---|---|
| STEP FLOW → | READ OUT/HOLD | ERASE | REPROGRAM |
| | STEP1: PRE CHARGE 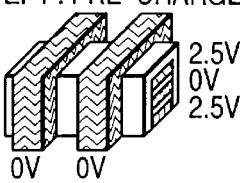 2.5V / 0V / 2.5V ; 0V  0V | STEP4: PRE WRITE 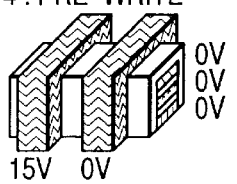 0V / 0V / 0V ; 15V  0V  REGISTER 2 = {1,1} | STEP11: DATA INPUT 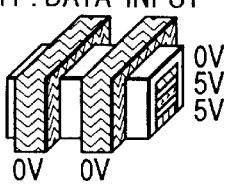 0V / 5V / 5V ; 0V  0V  REGISTER 1 = {0,1} |
| | STEP2: READ/SENSE 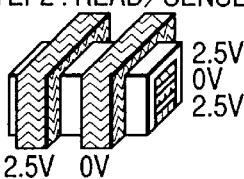 2.5V / 0V / 2.5V ; 2.5V  0V | STEP5: READ DATA 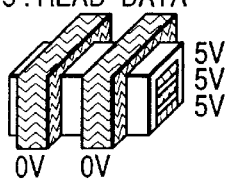 5V / 5V / 5V ; 0V  0V  REGISTER 2 = {1,1} | STEP12: PROGRAM 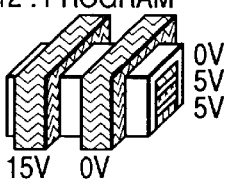 0V / 5V / 5V ; 15V  0V  REGISTER 1 = {0,1} |
| | STEP3: HOLD DATA<br>if(data line voltage low)<br>　substitute "1" for register1 bit<br>else<br>　substitute "0" for register1 bit<br>end if<br>REGISTER 1 = {0,1}<br>{DATA OF CELL 1 "1", DATA OF CELL 2 "0"} | STEP6: ERASE 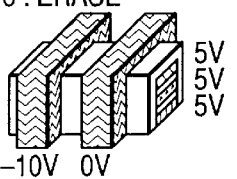 5V / 5V / 5V ; -10V  0V  REGISTER 2 = {1,1} | STEP13: PRE CHARGE 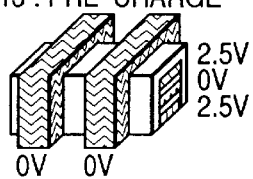 2.5V / 0V / 2.5V ; 0V  0V  REGISTER 1 = {0,1} |
| | | STEP7: PRE CHARGE 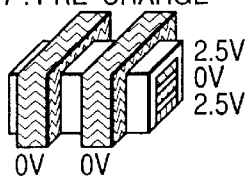 2.5V / 0V / 2.5V ; 0V  0V  REGISTER 2 = {1,1} | STEP14: PROGRAM VERIFY 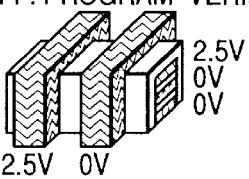 2.5V / 0V / 0V ; 2.5V  0V  REGISTER 1 = {0,1} |
| | | STEP8: ERASE VERIFY 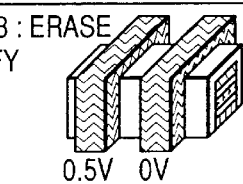 2.5V / 0V / 0V ; 0.5V  0V  REGISTER 2 = {1,1} | STEP15: CELL LIST RENEWAL<br>if(data line voltage high)<br>　&(register1 bit "0")<br>then<br>　substitute "1" for register1 bit<br>end if<br>REGISTER 1 = {1,1}<br>(FINISHED PROGRAMMING CELL 1) |
| | | STEP9: CELL LIST RENEWAL<br>if(data line voltage low)<br>　&(register2 bit "1")<br>then<br>　substitute "0" for register2 bit<br>end if<br>REGISTER 2 = {1,0}<br>(CELL 2 DELETED, CELL 1 UNDELETED) | STEP16: DETERMINATION OF ENDING REPROGRAM LOOP<br>if(all of the register2 bits "1")<br>then next word line<br>else return to step 11<br>end if |
| | | STEP10: DETERMINATION OF ENDING ERASE LOOP<br>if(all of the register2 bits "0")<br>then go to step 11<br>else return to step 5<br>end if | |

FIG. 41

| REFRESH SEQUENCE | | |
|---|---|---|
| READ OUT/HOLD | ERASE | REPROGRAM |
| STEP1: PRE CHARGE<br>2.5V / 0V / 2.5V<br>0V  0V | STEP4: PRE WRITE<br>0V / 0V / 0V<br>15V  0V | STEP10: DATA INPUT<br>0V / 5V / 5V<br>0V  0V<br>REGISTER = {0,1} |
| STEP2: READ/SENSE<br>2.5V / 0V / 2.5V<br>2.5V  0V | STEP5: READ DATA<br>5V / 5V / 5V<br>0V  0V | STEP11: PROGRAM<br>0V / 5V / 5V<br>15V  0V<br>REGISTER = {0,1} |
| STEP3: HOLD DATA<br>if(data line voltage low)<br>  substitute "1" for register bit<br>else<br>  substitute "0" for register bit<br>end if<br>REGISTER = {0,1}<br>{DATA OF CELL 1 "1",<br>DATA OF CELL 2 "0"} | STEP6: ERASE<br>5V / 5V / 5V<br>−10V  0V | STEP12: PRE CHARGE<br>2.5V / 0V / 2.5V<br>0V  0V<br>REGISTER = {0,1} |
| | STEP7: PRE CHARGE<br>2.5V / 0V / 2.5V<br>0V  0V | STEP13: PROGRAM VERIFY<br>2.5V / 0V / 0V<br>2.5V  0V<br>REGISTER = {0,1} |
| | STEP8: ERASE VERIFY<br>2.5V / 0V / 0V<br>0.5V  0V | STEP14: CELL LIST RENEWAL<br>if(data line voltage high)<br>  &(register bit "0")<br>then<br>  substitute "1" for register bit<br>end if<br>REGISTER = {1,1}<br>(FINISHED PROGRAMMING CELL 1) |
| | STEP9: DETERMINATION OF ENDING ERASE LOOP<br>if(all of the voltage of the data lines are high)<br>then go to step 10<br>else return to step 5<br>end if | STEP15: DETERMINATION OF ENDING REPROGRAM LOOP<br>if(all of the register bits "1")<br>then next word line<br>else return to step 10<br>end if |

STEP FLOW ↓

FIG. 44

| | REFRESH SEQUENCE | | |
|---|---|---|---|
| | READ OUT/HOLD | ERASE | REPROGRAM |
| FLOW ↓ | STEP1: PRE CHARGE<br>2.5V / 0V / 2.5V<br>0V  0V | STEP4: PRE WRITE<br>0V / 0V / 0V<br>15V  0V | STEP6: DATA INPUT<br>0V / 5V / 5V<br>0V  0V<br>REGISTER = {0,1} |
| | STEP2: READ/SENSE<br>2.5V / 0V / 2.5V<br>2.5V  0V | STEP5: ERASE<br>0V / 0V / 0V<br>−15V  0V | STEP7: REPROGRAM<br>0V / 5V / 5V<br>15V  0V<br>REGISTER = {0,1} |
| | STEP3: HOLD DATA<br>if(data line voltage low)<br>  substitute "1" for register bit<br>else<br>  substitute "0" for register bit<br>end if<br>REGISTER = {0,1}<br>{DATA OF CELL 1 "1",<br>DATA OF CELL 2 "0"} | | |

FIG. 47

|  | MEMORY CELL | DUMMY MEMORY CELL |
|---|---|---|
| READ OUT | W1 2.5V — MM1 — MM2<br>LDL 2.5V(F)   MS 0V   LDU (F)<br>READ MM1 | DW1 2.5V — DMM1 — DMM2<br>DLDL 2.5V(F)   DMS 0V   DLDU (F) |
| ERASE | W1 −10V — MM1 — MM2<br>LDL 5V   MS 5V   LDU 5V | NO USE |
| PROGRAM | W1 15V — MM1 — MM2<br>LDL 0V   MS 5V   LDU 5V<br>MM1 WILL STORE "1"<br>MM2 WILL STORE "0" | NO USE |

"F" INDICATES FLOATING

WHEN MM1 WILL STORE "0", MM2 WILL STORE "1"

SEMICONDUCTOR MEMORY DEVICE

CROSS-REFERENCE TO RELATED APPLICATION

The present invention is a continuation-in-part application of a copending application Ser. No. 09/126,437 filed on Jul. 30, 1998; which is incorporated by reference herein its entirely.

BACKGROUND OF THE INVENTION

1. Field of the Invention

The present invention relates to a semiconductor memory element, semiconductor memory device and control method therefore.

2. Prior Art

In the conventional art, non-volatile memory devices have been achieved such as flash EEPROM devices by utilizing MOSFET devices having floating gates and control gates. In such devices, information storage and readout are performed by utilizing the fact that the MOSFET threshold voltage changes when carriers accumulate on the floating gate. Polycrystalline silicon was generally utilized in the floating gate. Utilizing a MOSFET with floating gate allowed one bit of information to be stored for extended periods of time by use of only one transistor. A conventional structure and a contact-less cell structure are described in Nikkei Electronics, no.444, pp.151–157 (1988), as examples of flash EEPROM memory cell structures.

Technology of the conventional art relating to this invention is disclosed in K. Yano et al, 1993 IEEE International Electron Devices Meeting, Digest of technical papers, pp.541–545 and also in K. Yano et al, 1996 IEEE International Solid-State Circuits Conference, Digest of technical papers, pp.266–267 and p.458, describing single-electron memories utilizing polycrystalline silicon. In this technology, the channel which is an electrical path and a storage region to capture electrons are simultaneously formed of thin-film, polycrystalline silicon. Storage of information is performed by utilizing the change in threshold voltages when electrons are captured in the storage region. A feature of this method is that one bit is stored with the deposit of one electron. A smaller structure can be obtained, compared with a structure obtained by machining utilizing the crystal grains of polycrystalline silicon and the device of this method can also operate at room temperature.

In order to achieve the desired change in threshold voltage in flash EEPROM devices at carrier injection and drain (write, erase operation) to the floating gate, the memory state is monitored after application of a high voltage (or low voltage) and a verify operation is performed to once again apply a voltage to adjust the threshold values in cells where the desired threshold value was not obtained.

In the conventional art, technology for verify operations is disclosed in T. Tanaka et al. IEEE J. Solid-State Circuits, Vol. 29, No. 11, pp.1366–1372 (1994) and in K. Kimura et al. IEICE Transactions on Electronics, Vol. E78-C No.7, pp.832–837 (1995).

Previous technology by the inventors of the present invention is disclosed in Japanese Patent Laid-open No. Hei 7-111295, No. Hei 8-288469, No. Hei 9-213822 and in Japanese Patent Laid-open No. Hei 9-213898.

SUMMARY OF THE INVENTION

Much progress by means of advances in lithographic technology has been made in reducing the surface area of memory cells for memory types such as DRAM, SRAM and flash memories. Memory cells configured with a smaller surface area offer many advantages such as decreasing the size of the chip to improve chip production yield and are effective in reducing costs since many chips can be obtained from the same wafer. A further advantage is that wiring length is kept short so that high-speed operation is possible.

The processing dimensions and cell size are generally determined by the memory method. If the basic machining dimension is set as F, then memory cell units are formed in a size such that a folding bit line type DRAM size is 8F2 and an AND type flash memory size is 6F2. Currently, the smallest cell sizes that can be fabricated have one cell of flash memory in one transistor and this standard is the approximate limit when forming MOS device structures on a substrate surface. When fabrication of even smaller memory cells is attempted, a cubic shaped structure becomes necessary. Further, once a smaller memory has been obtained by utilizing a cubic shape and the data line pitch or the word line pitch has been reduced to become shorter than a minimum of 2F, then how to arrange the data lines and word lines, how to connect to the peripheral circuits or how to control these cell arrays by means of the peripheral circuits become critical problems.

On the other hand, when inserting and extracting electrons in microscopic sized dots of metallic or semiconductor material, the coulomb repulsion force can be effectively utilized and a single electron element for controlling electrons in individual units are theoretically capable of operation in extremely small structures of approximately 10 nm and have advantages such as extremely small electric power consumption. A single-electronic memory consisting of a single-electron device is a memory capable of storing information as an accumulation of a small number of electrons. The single-electron memory can store one or more bits of information in one element and since control of the stored electrical charge can be performed in individual units, operation even down to the nanometer level is possible. Further, since the number of stored or accumulated electrons is small, a large improvement can be expected in terms of the rewrite time and the number of rewrites. However, in actual fabrication of the elements, the processing dimensions are subject to the current limits of lithographic technology. Still further, in elements of the conventional art, the size of extraction portions such as the drain region and source region is large and an element structure offering the advantage of integration providing a smaller size has not been proposed.

The inventors fabricated a single-electron memory operating at room temperatures and performed a device evaluation. However in that evaluation, various different times were measured for accumulating an electrical charge even if the same write voltage was applied to the same device for the same amount of time. Conversely, when the same write voltage was applied for the same amount of time, a phenomenon was discovered in which the number of electrons at one time was found to vary. This phenomenon was interpreted as occurring from probabilistic behaviors such as tunnel effect or heat excitation due to the small number of electrons utilized in operation of the single-electron memory.

Progress made in integration of semiconductor memories allowed improving the memory density and increasing the device capacity however the greater the integration of memory cells that was achieved in the device, the greater the equipment costs for manufacturing became. By performing multi-value storage for storing two or more bits in one cell, greater memory density becomes possible without performing further integration of memory cells. In multi-value storage, the ability to clearly distinguish the many memory states in write, read and erase operations is of the utmost importance.

Use of single-electron memories requires that the electrical charge be small and that the peripheral circuits generate little noise. Differential amplifiers are often utilized as sensing amplifiers for semiconductor memories. Here, methods are known for positioning the sensing amplifier and data line relative to each other so that the matching data lines are placed in an open configuration on both sides of the sensing amplifier, or in a folding configuration positioned in the same direction. The open configuration has the advantages that memory cells can be positioned at all cross points of the data lines and word lines and high integration can be obtained, however a disadvantage is that much noise is generated in the word lines. The folded configuration conversely, has the advantage that little noise is generated in driving the word lines yet also has the drawbacks that memory cells cannot be placed at all cross points of data lines and word lines; and further cannot offer high integration.

Peripheral circuits other than the sensing amplifier that have a large surface area are the register which temporarily holds write data in the memory cell during writing, a register to hold the flag showing write has ended during write verify, and a circuit to compare the value read out from the memory cell with the write-end flag value after the write operation and rewrite the flag value.

Whereupon this invention, in order to expand the limits on the conventional art, has the objective of providing a single-electron memory cell ideal for high integration with a small surface area, a semiconductor memory device and control method thereof strongly resistant to irregularities in operation due to probabilistic phenomenon likely to occur, a semiconductor memory device and control method thereof ideal for holding a plurality of storage values, and further a small surface area peripheral circuit having no degradation of device characteristics of a small surface area and high integration single-electron memory as well as a low noise peripheral circuit and control method thereof ideal for single-electron memories handling small electrical charges and susceptible to noise.

This invention is characterized in that a memory cell with a small surface area can be fabricated by forming source regions and drain regions established above and below and by running the channels to face up and down.

More specifically, the semiconductor element according to the typical embodiment of the present invention has source and drain regions, the drain region is formed above or below the source region by means of an insulating film, the source region is connected to the drain region by means of a channel region, the channel region is connected to a gate electrode by way of a gate insulating film, and also has a electric charge trap area in the vicinity of the channel region. Information storage is performed by changing the threshold voltage of the semiconductor device by holding carriers in the electric charge trap area.

Further, the memory cell of this embodiment capable of being fabricated with a small surface area by forming a plurality of gate electrodes facing up and down and forming channels in the stepped side surface of those gate electrodes is characterized in having source and drain regions, a plurality of gate provided above and below by way of mutual insulation films, channel regions formed on side surfaces of the gate electrodes by way of the insulating films, source regions connected to the drain regions by way of the channel regions, and electric charge trap areas in the vicinity of the channel regions, and performing information storage by changing the threshold voltage of the semiconductor element by holding the carrier in the electric charge trap area. The electric charge trap area is comprised of minute particles of metal or semiconductor material with a typical shorter diameter of less than 10 nm.

This invention is further characterized in that the semiconductor memory device performs verify operations to ensure accurate memory storage operation utilizing memory storage elements in which adverse phenomenon are likely to occur.

More specifically, the control method for the semiconductor memory element of the typical embodiment of the present invention has a source region, a drain region, a source region connected to the drain region by way of a channel region, a channel region connected to the gate electrode by way of an insulating film, a electric charge trap area in the vicinity of the electrical current path of the channel region, a semiconductor memory element to perform storage by changing the threshold voltage by holding the carriers in the electric charge trap area; and the semiconductor memory device of the present invention has a structure comprised of a plurality of semiconductor memory elements arranged in series and characterized in having three steps consisting of a first step to apply a write voltage to the semiconductor memory element, a second step to read out the information stored in the element after the first step and, a third step to again apply a write voltage to the semiconductor element when the writing of information in the second step was insufficient.

Further, the inventors made their own unique investigation of multi-value memories and discovered that rather than an element that changes continuously versus the number of accumulated electrons as characterized by flash memories, an element that changes according to the particular step status is more advantageous from the point of identifying the element status. The inventors thus hit upon the idea of utilizing the characteristics of a single-electron element. In other words, this invention is characterized by a multi-value memory element or a memory device utilizing a multi-value memory element to allow clear identification of the memory (or storage) state by making use of the features of a single-electron memory.

The semiconductor device according to the typical embodiment of the present invention has a source region, a drain region, the source region is connected to the drain region by means of a channel region, the channel region is connected to a gate electrode by way of an insulating film, and the semiconductor device further has a electric charge trap area in the vicinity of the channel region, a semiconductor element for performing information storage by changing the threshold voltage by holding carriers in the electric charge trap area, and a structure comprised of a plurality of semiconductor memory elements arranged in series; and characterized in that the plurality of semiconductor memory elements are controlled by way of the data lines and word lines, and that two or more bits can be stored in one semiconductor memory element by utilizing a plurality of values in the write voltage applied to the word line.

Still further, in order to obtain peripheral circuits with a small surface area yet strong tolerance to noise, the local data lines for each of the vertically stacked memory cells are connected to a global data line by way of separate MOS selection devices, and use of a large surface area is avoided by making joint use of peripheral circuits such as global data lines and sensing amplifiers by performing read and write operations in a timed multiplex manner. Moreover, a data line ranking and non-volatile readout by a memory cell (floating electrode cell) are utilized to allow placement of memory cells at all intersecting points of word lines and data lines while maintaining a folded data line structure. More specifically, during readout of a one global data line of a pair for a sensing amplifier, the local data line connecting to the other global data line can be shut off by a selective MOS device to eliminate effects from noise. This arrangement allows readout with low noise without having to sacrifice the high integration of memory cells stacked in layers.

Yet further, the tolerance to noise can be further improved by utilizing a dummy cell as a reference threshold voltage in any of the readout, write verify and erase operations.

A register to temporarily hold write data in a memory cell during write, and a register to hold a flag showing the end of write during write-verify have been combined as a method to achieve even further miniaturization of the peripheral circuits. A specific description of the operation is related as follows. In the following description, a "1" indicates a high threshold voltage in the memory cell while a "0" indicates a low threshold voltage. Further, a high logic level is shown by a "1" and a low logic level is shown by a "0". Also, the write operation lowers (erases) all the threshold voltages at once, then applies a high voltage to the word lines, and finally raises the memory cell threshold voltage. At this time, in memory cells where a "0" must be written, the voltage is raised on the data lines and source lines, while the difference in voltage versus the relative word line is reduced and a rise in threshold voltage suppressed. The voltage polarity can of course be inverted if required.

During write, the data for writing in the memory cell is temporarily held as an inverted "1" and "0" in the register and input. This unchanged input is interpreted as a write-end flag. In other words, the value in the register is "0" when a "1" is to be written. This inverted value signifies that the writing of "1" has not ended. Conversely, the register holds a "1" value when a "0" is to be written. This inverted value signifies that writing of "1" has ended or was not required from the beginning. Accordingly, a "1" need only be written as is, into the register only when the memory cell value is "1" after the write operation.

This arrangement makes it unnecessary to rewrite the write-end flag value after obtaining and comparing the values for both the write data temporarily stored in the register and the write-end flag. One nMOS is used as this "1 only pass circuit". The global data line is connected to the gate for the nMOS, the drain is connected to the high level side of the power supply, and the source is connected to the input of the register. In this arrangement the nMOS turns on when the value of the global data line is "1", and a "1" is then input to the register. If the value on the global data line is a "0" then the nMOS stays off and there is no change of values in the register. This "1 only pass circuit" therefore allows the write-end flag to be rewritten with just one nMOS (or two MOS if a pMOS for control purposes is inserted between the high level side of the power supply and the nMOS.).

The memory device of the present invention has a memory cell block containing a plurality of memory cells placed at cross points of intersecting word lines and data lines, and a peripheral circuit for supplying signals to the data lines and word lines. The memory cell has a substrate, and a first region 76, an insulating film 82, a second region 77, a channel region 78 connected between the first region and the second region, a gate electrode 79 to apply an electrical field to the channel region, and an electric charge trap area all laminated on the substrate. Information storage is performed by changing the threshold voltage of the semiconductor element by controlling the amount of carriers in the electric charge trap area. At least a portion of the peripheral circuits is a CMOS circuit comprised of nMOS transistors and pMOS transistors (as in FIGS. 1(*a*) and 1(*b*)).

Further, the memory device of the present invention has a laminated structure comprising a first local data line 13, a first intermediate layer 13 above the first local data line 13, a source line 14 above the first intermediate layer, a second intermediate layer above the source line, and a second local data line 15 above the second intermediate layer; and the memory device further has a first channel region 16 positioned on the side of the laminated structure and connecting the first local data line and the source line, a second channel region 88 positioned on the side of the laminated structure and connecting the source line and the second local data line, an electric charge trap areas 16, 88 enclosed by potential barriers positioned inside or in the vicinity or at the periphery of the channel region, and a word line 17 connected by way of the channel region and gate insulating film, and two semiconductor elements are formed above and below the cross points of the local data lines and word lines, and these semiconductor elements perform memory storage by changing the threshold voltage by means of varying the amount of carriers in the above mentioned electric charge trap areas, and the semiconductor elements are arrayed in series along with the arrangement of the plurality of local data lines and word lines, and the first and second local data lines are connected to the identical global data lines by way of the selection transistor (as in FIGS. 3(*a*), 3(*b*) and FIG. 25).

Other elements, objects and characteristics of the present invention will become clear upon relating the description of the embodiment later on.

BRIEF DESCRIPTION OF THE DRAWINGS

FIG. 1(*a*) is an upper oblique view. FIG. 1(*b*) is a cross sectional view.

FIG. 2(*a*) is an upper oblique view. FIG. 2(*b*) is a cross sectional view.

FIG. 3(*a*) is an upper oblique view. FIG. 3(*b*) is a cross sectional view of the semiconductor element.

FIG. 4(*a*) is an upper oblique view. FIG. 4(*b*) is a cross sectional view including a cross section of the channels. FIG. 4(*c*) is a cross sectional view including a cross section of the source.

FIG. 5(*a*) is an upper oblique view during channel forming. FIG. 5(*b*) is an upper oblique view after forming of the gate.

FIGS. 7(*a*) and 7(*b*) are structural views of the semiconductor element of the eighth embodiment of the present invention.

FIG. 9(a) is an upper oblique view. FIG. 9(b) is a top view.

FIGS. 13(a) and 13(b) are structural views of the semiconductor element of the twelfth embodiment of the present invention.

FIG. 14 is a structural view of the semiconductor element of the thirteenth embodiment of the present invention.

FIG. 15(a) is an upper oblique view. FIG. 15(b) is a cross sectional view.

FIG. 18(a) is a view after channel forming. FIG. 18 (b) is an upper oblique view after forming of the word lines.

FIG. 30(a) is a top view after forming of the channels. FIG. 30(b) is a top view after forming of the word lines.

FIG. 31(a) is a top view of a semiconductor memory element after forming of the channels. FIG. 31(b) is an upper oblique view of that semiconductor memory element after forming of the word lines.

FIG. 34 is a series of drawings showing the operation sequence for readout, erase and write operations of the semiconductor device of the sixteenth embodiment of the present invention.

FIG. 35 is a series of drawings showing the operation sequence for readout, erase and write operations of the semiconductor device of the seventeenth embodiment of the present invention.

FIG. 37 is a series of drawings showing the sequence for readout, erase and write operations of the semiconductor device of the eighteenth embodiment of the present invention.

FIG. 39 is a series of drawings showing operations in the refresh sequence in the semiconductor device of the nineteenth embodiment of the present invention.

FIG. 41 is a series of drawings showing operations in the refresh sequence in the semiconductor device of the twentieth embodiment of the present invention.

FIG. 44 is a series of drawings showing the refresh sequence operation in the semiconductor device of the twenty-second embodiment of the present invention.

FIG. 47 is a drawing showing application of a voltage to a memory cell during readout, erase and write in the twenty-third embodiment of the present invention.

DETAILED DESCRIPTION OF THE PREFERRED EMBODIMENTS

First Embodiment

Hereafter, specific embodiments of the semiconductor memory element, semiconductor memory device and control method of the present invention will be described in detail while referring to the accompanying drawings. To simplify the description, an explanation will be related for one portion of the semiconductor memory device however in actual operation functions are achieved for a memory device also incorporating contacts and peripheral circuits.

Figure 1A:
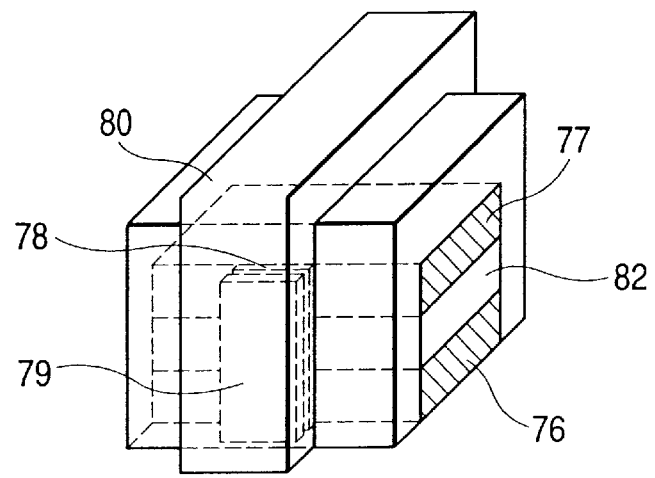
FIGS. 1(*a*) and 1(*b*) are structural views of the semiconductor element of the first embodiment of the present invention.
Figure 1B:
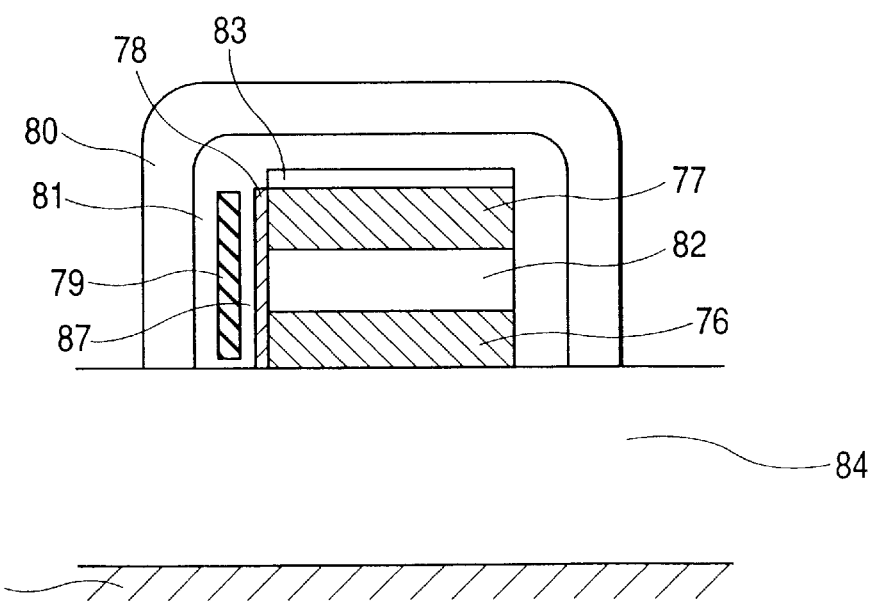

FIGS. 1(a) and 1(b) are structural views of the semiconductor memory element of the first embodiment of the present invention. FIG. 1(a) is an upper oblique view and FIG. 1(b) is a cross sectional view. A source 76 and a drain 77 are regions made from N type polycrystalline silicon with a high concentration of impurities. An $SiO_2$ insulating film 82 is formed between the source 76 and a drain 77 regions. A channel 78 having a thickness of 20 nm and width of 150 nm is formed from P type polycrystalline silicon on the side surface of this $SiO_2$ insulating film 82. An electric charge trap area 79 is formed from polycrystalline silicon and isolated by the thin insulating film 87. The channel 78 and the electric charge trap area 79 are connected to a gate electrode 80 by way of an $SiO_2$ insulating film 81. The distance between the gate electrode 80 and the electric charge trap area 79 is set at 30 nm.

Compared to the structure of the third embodiment related later on in which the channel and the electric charge trap area are formed together, the arrangement in the first embodiment which forms the channel 78 and the electric charge trap area 79 separately, gives a greater degree of freedom since more design and forming possibilities are obtained. A particular advantage is that the height and width of the potential barrier area can be artificially determined by selecting the material and layer thickness of the insulating film 87 between the electric charge trap area 79 and the channel 78. In this embodiment, the potential area is formed lower than the source and drain but can also be formed in the opposite position. Further, in this embodiment, electrons are utilized as the carriers and in the subsequent embodiments electrons are also used however positive holes may also be utilized as the carriers.

In the semiconductor memory element of this embodiment, the source 76 and drain 77 are vertically overlapped which decreases the surface area. The size of the element surface area is also reduced by providing a structure in which the channel region 78 runs vertically. In this embodiment, by aligning the memory elements in series, a greater memory storage can be obtained. The memory elements hereafter in the following embodiment are also arranged in the same way.

The operation of the memory elements of this embodiment is next explained. The voltage potential on the gate electrode 80 is changed in the write and erase operations. A certain voltage is added between the source 76 and the drain 77 and when the gate voltage is applied, electrons occur in the polycrystalline silicon thin layer of the channel 78 and an electrical current starts to flow. When a large gate voltage is applied, the difference in potential between the electric charge trap area 79 and the channel region 78 becomes large, and due to the tunnel effect or thermal excitation, electrons cross the potential barrier of the insulating film 87 and are injected into the electric charge trap area 79. As a result, a shift towards the larger threshold value occurs and the electrical current value decreases even with the same gate voltage. Readout of information is performed by means of the size of this electrical current value. Erase is performed by a swing in the gate voltage in the reverse direction.

Figure 16A:
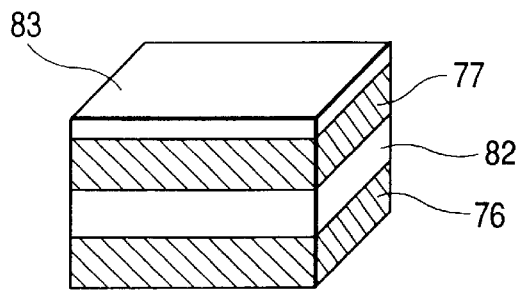
FIGS. 16(a) and 16(b) are upper oblique views of the manufacturing process for the semiconductor device of the first embodiment of the present invention.
Figure 16B:
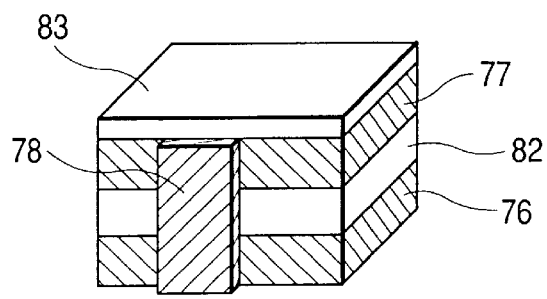

The manufacturing process of this embodiment is explained next by using FIGS. 16(a) and 16(b). After oxidizing the surface of the P type substrate 86 and forming an $SiO_2$ layer 84, an $SiO_2$ layer, an n type polycrystalline silicon layer, and $SiO_2$ layer are formed in that order. Photoresist masking is performed, collective etching of these four layers carried out and a source 76, drain region 77 and $SiO_2$ layers 82, 83 then formed as in FIG. 16(a). When formed collectively (in a batch) as above, there is no increase in the lithography process even in a laminated (layered) structure. Next, after forming a 20 nm amorphous —Si layer, crystallization is performed by heat treatment. Photoresist masking of other crystalline silicon is performed, etching carried out, and a channel 78 formed (FIG. 16(b)) by forming a line connecting the drain 77 and the source 76. During this etching process, the $SiO_2$ layer 83 covering the drain region 77, prevents excessive cutting of the drain region 77. Afterwards, a thin $SiO_2$ layer 87 is formed (deposited), the polycrystalline silicon for the electron trap region 79 then deposited and etching performed. Next, after forming the $SiO_2$ layer 81, an n type polycrystalline silicon layer is formed, photoresist masking and etching performed and the gate electrode 80 then formed.

Second Embodiment

Figure 15A:
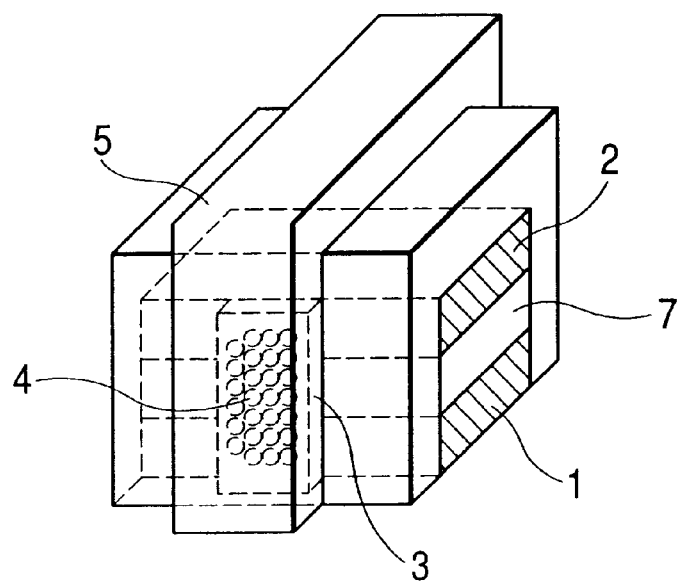
FIGS. 15(a) and 15(b) are structural views of the semiconductor element of the second embodiment of the present invention.
Figure 15B:
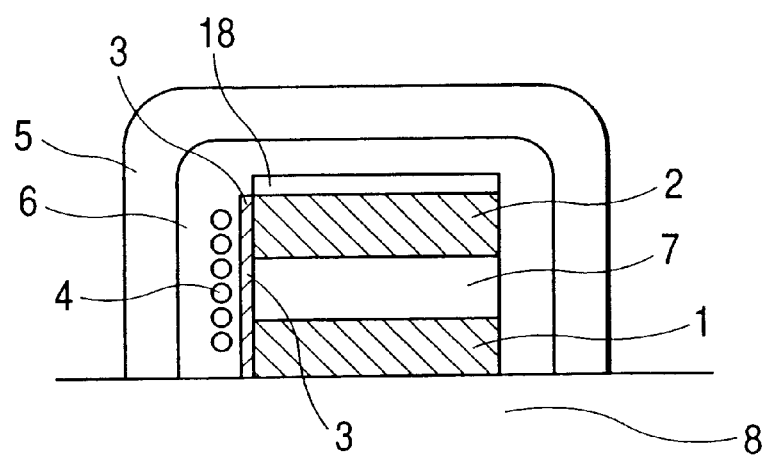

FIGS. 15(a) and 15(b) are structural views of the memory element of another embodiment of the present invention. A source 1 and a drain 2 are regions comprising N type polycrystalline silicon with a high concentration of impurities. An SiO$_2$ insulating film 7 is formed between the source 1 and a drain 2 regions. A channel 3 is formed with a width of 20 nm and thickness of 10 nm from non-doped polycrystalline silicon on the side of the SiO$_2$ insulating film 7. An electric charge trap area 4 is formed from a plurality of polycrystalline silicon particles with an average size of 6 nm and isolated by means of an insulating film. The channel 3 and electric charge trap area 4 are connected to the gate electrode 4 by way of the SiO$_2$ insulating film 6. The distance between the gate electrode and the electric charge trap area 4 is set as 30 nm. The element is installed in the SiO$_2$ insulating film 8. The point where the element is installed on the insulating film is installed in the same way for subsequent embodiments unless particular restrictions exist. The channel 3 and the electric charge trap area 4 are formed separately in this embodiment however a method for forming the channel 3 and electric charge trap area in an integrated form is known and that may be employed. The separate forming method is also the same in the subsequent embodiments. Also, the SiO$_2$ layer 18, machined to the same width as the drain 2 and the source 1 positioned above the drain 2, prevents excessive cutting away of the drain 2 just the same as related for the SiO$_2$ layer in the first embodiment.

The portions of this embodiment differing from operation of the memory element of the first embodiment are explained next. In this embodiment, after the carriers are captured in the electric charge trap area 4, the available capacity between the gate electrode 5 and the channel 3 becomes small due to the narrowness of the channel 3 and small accumulated electrical charges are read out. In this embodiment, three stored (or accumulated) electrical charges can be read out as a threshold voltage shift of approximately one volt. However, by enlarging the channel width and preparing more silicon crystalline particles for the electric charge trap area, the number of stored electrical charges can be increased and the desired threshold voltage shift obtained. Enlarging the channel width allows a larger electrical current to flow and makes the lithography process simpler. The size of the electric charge trap area is within 10 nm and the total peripheral capacity is within 3aF. Accordingly, the room temperature is estimated and even when disturbances due to heat are taken into account, a stable number of carriers for the electric charge trap area can be determined within one unit. Consequently, phenomenon such as injection of an excess number of carriers or extraction of the stored (accumulated) carriers is not prone to occur. Erase is performed by a swing in the gate voltage in the reverse direction.

Third Embodiment

Figure 2A:
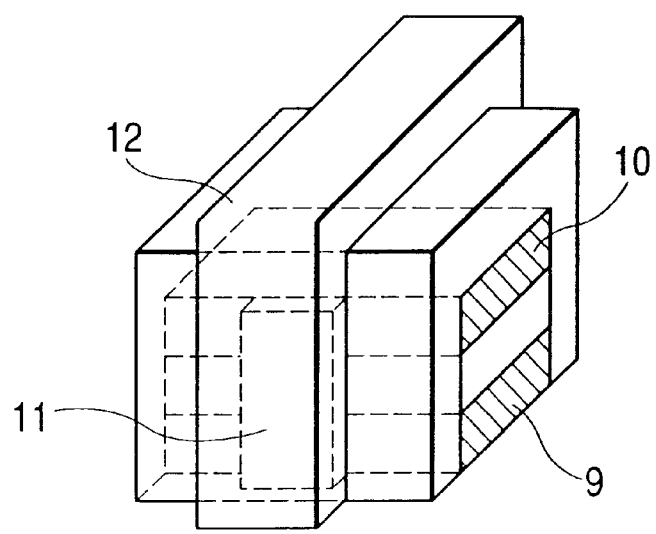
FIGS. 2(*a*) and 2(*b*) are structural views of the semiconductor element of the third embodiment of the present invention.
Figure 2B:
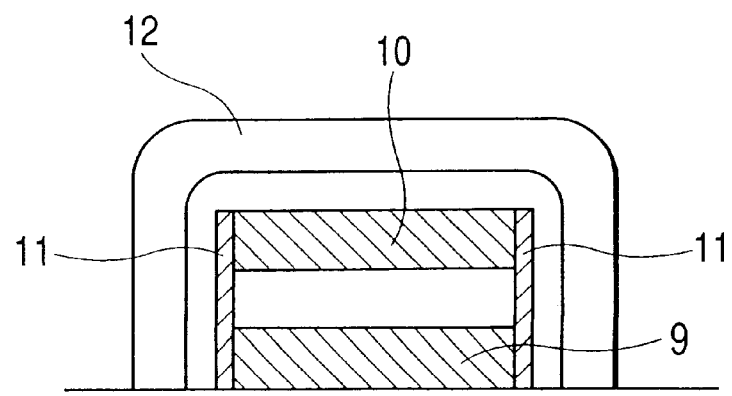

FIGS. 2(*a*) and 2(*b*) show the third embodiment of the present invention. This embodiment differs from the second embodiment only in that the channel and the electric charge trap area 11 are integrated into one unit and that the channel 11 is formed on both sides of the source 9 and the drain 10. The material for the channel and electric charge trap area 11 is non-doped polycrystalline silicon in a thin layer with an average thickness of approximately 3 nm. In this embodiment, the drastic undulation of potential within the thin layer of polycrystalline silicon of less than 5 nm average thickness is utilized and the natural forming of a channel and an electric charge trap area within the thin film (11) is also utilized to provide the benefit of a small structure ideal for operation at room temperature that can be manufactured with a simple process. The size of the crystalline particles in this embodiment are approximately 3 nm so that the size can be kept within about 10 nm even in the sideways direction, and the size of the respective electric charge trap areas is about the same (10 nm).

A particular feature is that by forming the channel and electric charge trap area 11 on both sides of the source 9 and the drain 10, and by controlling the gate electrode 12, the width of the channel can be effectively doubled and a large channel current can be obtained. Increasing the channel line width and increasing the electrical current value generally results in a larger surface area (size) but there is no increase in size in the structure of this embodiment. In particular, structures that integrate the channel and the electric charge trap area have the problem that simply increasing the size of the channel width tends to shrink threshold voltage fluctuations due to capture of carriers. This problem however does not occur in the structure of this embodiment since a plurality of channels are mutually isolated.

Fourth Embodiment

Figure 3A:
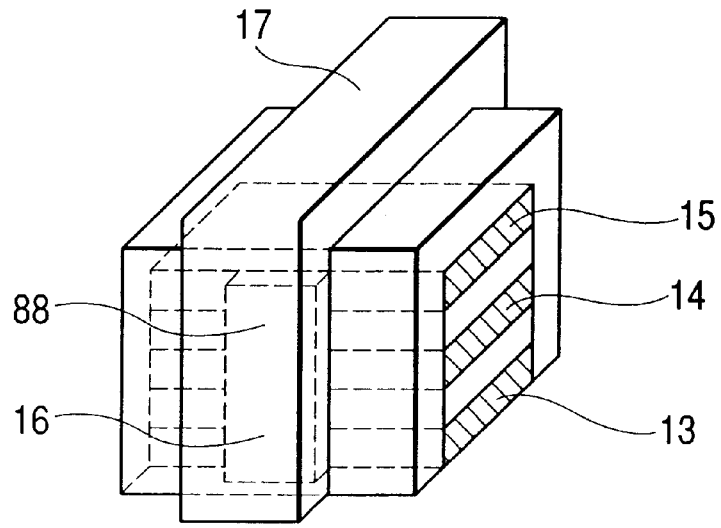
FIGS. 3(*a*) and 3(*b*) are structural views of the semiconductor element of the fourth embodiment of the present invention.
Figure 3B:
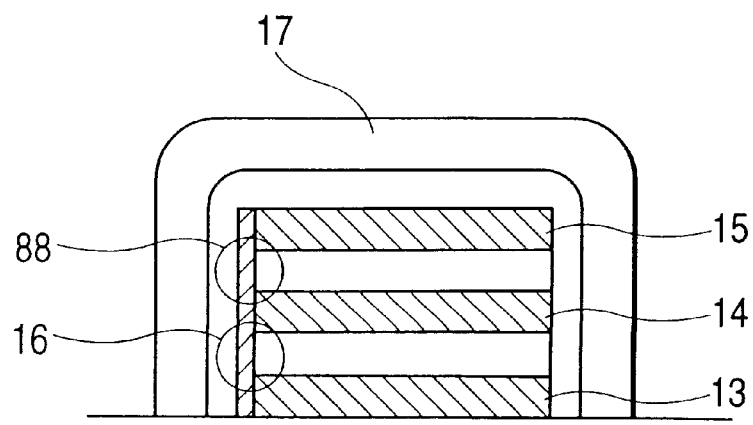

The fourth embodiment is next explained while referring to FIGS. 3(*a*) and 3(*b*).

This embodiment differs from the third embodiment in having two drains, and a three-layer structure of a drain (1) 13, a source 14, and a drain (2) 15. In the structure of this embodiment, a memory storage amount twice that of the first embodiment can be obtained without increasing the surface area (size). In addition to joint use of the source 14, memory storage is performed by the source 14, the drain 1 (13) and the channel and electric charge trap area 16 connecting to said drain and source; memory storage is also performed by the source 14, drain (2) 15 and the channel and electric charge trap area 88 connecting to said drain and source. The two channels and electric charge trap areas 16, 88 are formed (deposited) simultaneously. Their functions differ just by the positional relationship with source and drain. These jointly use the gate electrode 17 but only one side is capable of write and erase operation by changing the voltage on the drain (1) 13 and the drain (2) 15. Further, the source 14, as well as the drain 1 (13) and drain (2) 15 can be formed in one batch (collectively) and since the channel and electric charge trap areas 16, 88 are also capable of being collectively formed, this structure has the advantage that the number of process steps can be kept small. In this embodiment, the channel and electric charge trap area were integrated together but the channel and electric charge trap area may also be formed separately.

Fifth Embodiment

Figure 4A:
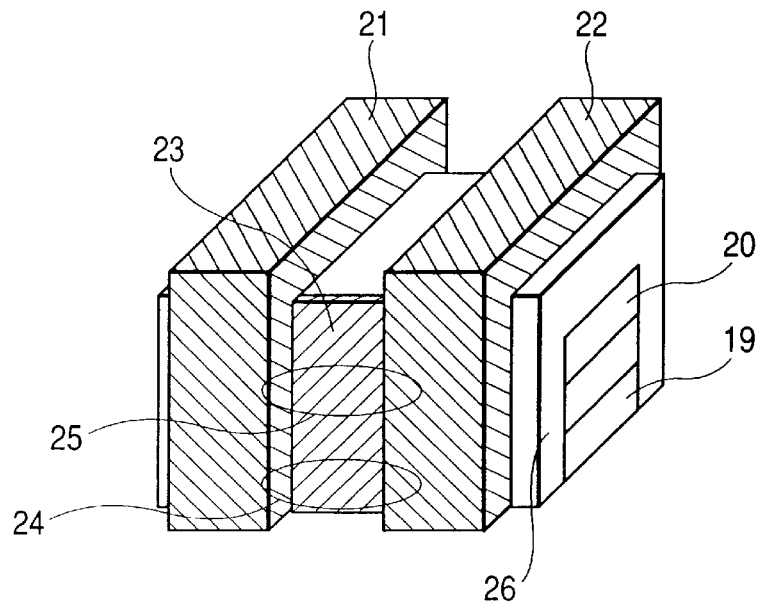
FIGS. 4(*a*), 4(*b*) and 4(*c*) are structural views of the semiconductor element of the fifth embodiment of the present invention.
Figure 4B:
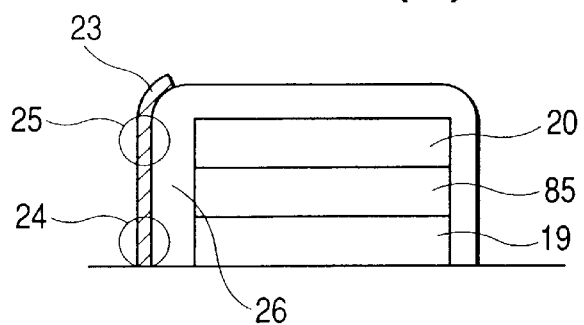
Figure 4C:
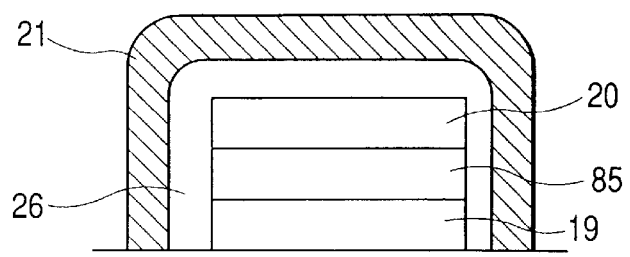

The fifth embodiment of the present invention is shown in FIGS. 4(*a*), 4(*b*) and 4(*c*).

This embodiment differs from the first through fourth embodiments in that the source and drains are a laminated structure and that the gate electrode is characterized in having a laminated structure. A source 21 and drain 22 are formed and isolated by the SiO$_2$ insulating film 26 on the outer side of the laminated gate electrode (1) 19 and a gate electrode (2) 20. A non-doped polycrystalline silicon thin-film 23 is formed in a thickness of approximately 3 nm in a shape joining the source 21 and the drain 22 on side surface of the SiO$_2$ insulating film. The functions of the channel and electric charge trap area are fulfilled by a thin-film 23. The polycrystalline silicon thin-film 23 has extremely thin round-shaped crystalline particles and the threshold voltage is high.

During application of a gate voltage, only the thin film portion at the side of the gate electrode shows electrical conductivity, and even though thin-film 24 of the side of the gate electrode 1 (19) and the thin-film 25 on the side of the gate electrode 2 (20) are isolated by means of etching, these thin films form the respective channels and electric charge trap areas. Consequently, storage of at least two bits of information in an element can be performed. The gate electrodes in this embodiment are laminated in two layers but more layers may be added. This structure has laminated sources and drains just as in the third embodiment however use of a structure which collectively laminates (stacks) more than four layers is difficult because operation is usually not satisfactory when drains are jointly used. The structure of this embodiment however, offers the advantage that the memory storage capacity can be increased according to the number of added gate electrode layers.

Sixth Embodiment

Figure 5A:
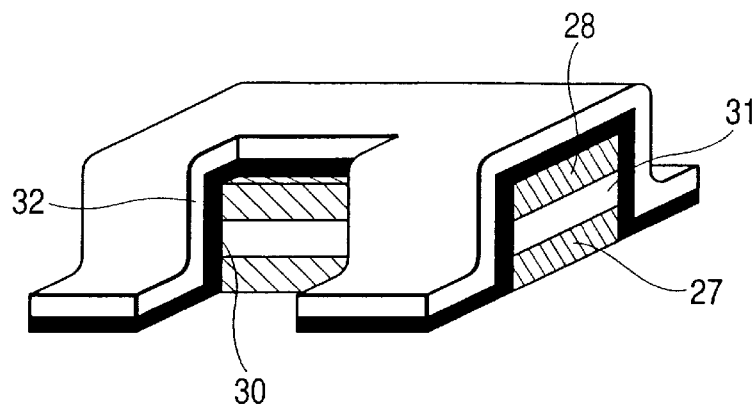
FIGS. 5(*a*) and 5(*b*) are structural views of the semiconductor element of the sixth embodiment of the present invention.
Figure 5B:
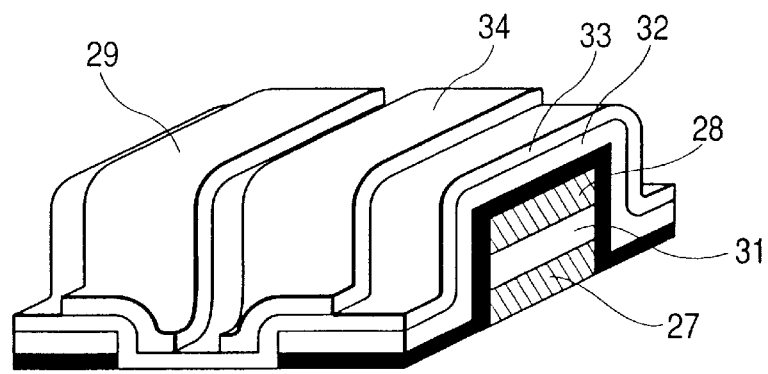

The sixth embodiment of the present invention is next described while referring to FIGS. 5(*a*) and 5(*b*).

This embodiment is a memory element for storing at least two bits of information. The element structure of this embodiment is essentially the same as the element of the third embodiment except that the element is formed in two pieces, however the manufacturing process to achieve this element is different.

The manufacturing process of this embodiment is next explained. The n type polycrystalline silicon layer, the $SiO_2$ layer, and the n type polycrystalline silicon layer are formed (deposited) in succession after oxidizing of the p type substrate surface, photoresist masking is then performed and the source 27, the drain 28 and the $SiO_2$ layer 32 for isolating the source and drain, are then formed. Next, a thin Si3N4 layer with a thickness of 15 nm is deposited (formed) and an $SiO_2$ layer 32 also deposited. Afterwards, etching of the $SiO_2$ layer and the Si3N4 layer is performed after photoresist on the mask of the hole pattern including the stepped portion of the edge of the drain 27 (FIG. 5(*a*)). The side surface of the Si3N4 layer (30) then appears at this time. Next, a 3-nm deposit of a-Si is formed on this Si3N4 layer (30). At this time, when the lower layer is Si3N4 compared to when the lower layer is $SiO_2$, the time is long from the start of source gas flow until the silicon actually starts to attach to the wafer surface, so that almost no a-Si is deposited on the $SiO_2$ layer surface. Accordingly, a fine a-Si line with a width of about 15 nm can be formed in a shape joining the source 27 and the drain 28 on the surface of the Si3N4 layer 30 surface. Crystallization is performed by heat treatment of the a-Si; and the channel and electric charge trap area are integrated into one piece. After depositing (forming ) of the $SiO_2$ layer 33, the n type polycrystalline silicon layer is deposited, etching performed using the photoresist mask and a gate electrode (1) 29 and gate electrode (2) 34 are formed (FIG. 5(*b*)).

In this embodiment, memory storage can be performed using each of the two gate electrodes 29, 34 and a minimum of two bits can be stored. Many bits can be stored by using multi-value storage. The example of this embodiment is characterized by being able to form fine lines with good control. Along with reducing non-uniformity occurring among semiconductor elements, a large threshold voltage shift can be made with a small number of stored electrons. In this embodiment, a hole was formed in the shape containing the stepped portion on one side of the edge of the drain 29 however, holes can also be formed on both sides, and two channels and electric charge trap areas formed and control achieved with the same electrodes. This structure is characterized in that a large electrical current can be obtained. Further, in this embodiment the source 27 and the drain 28 were stacked in two layers however a three layer structure for the drain 1, source and drain 2 as in the fourth embodiment may also be used, capable of higher density memory storage.

Seventh Embodiment

Figure 6:
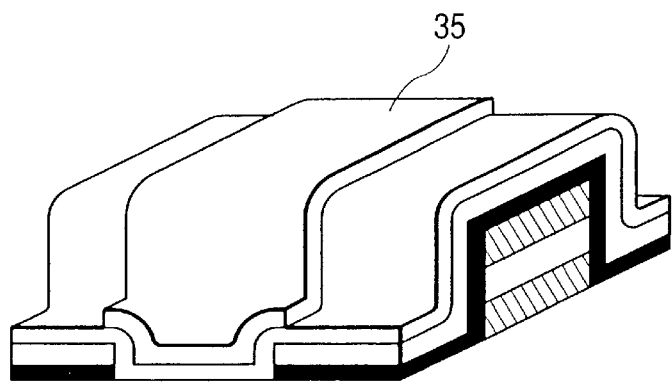
FIG. 6 is a structural view of the semiconductor element of the seventh embodiment of the present invention.

The seventh embodiment of the present invention is next described while referring to FIG. 6.

This embodiment differs from embodiment 6 in respect to two points; one is that the channel and the electric charge trap area are formed separately, and the other point is that both of the channels are controlled by the same gate electrode 35. The advantage of separately forming the channel and the electric charge trap area is the same as that related for the first embodiment. Further, a characteristics of this embodiment is that machining of the gate electrode 35 is simplified by means of a structure in which one gate electrode 35 controls both channels formed within the same hole pattern. The difference in this manufacturing process versus that of the sixth embodiment are the steps in which the thin $SiO_2$ layer is deposited immediately after depositing of the channel, and the silicon crystal particles for the electric charge trap area are formed.

Eighth Embodiment

Figure 7A:
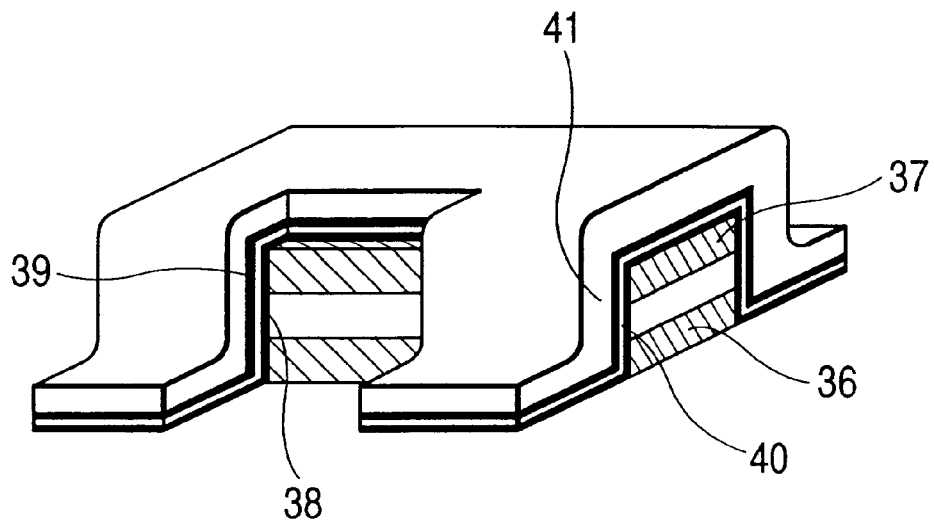
FIG. 7(a) is an upper oblique view during channel forming.
Figure 7B:
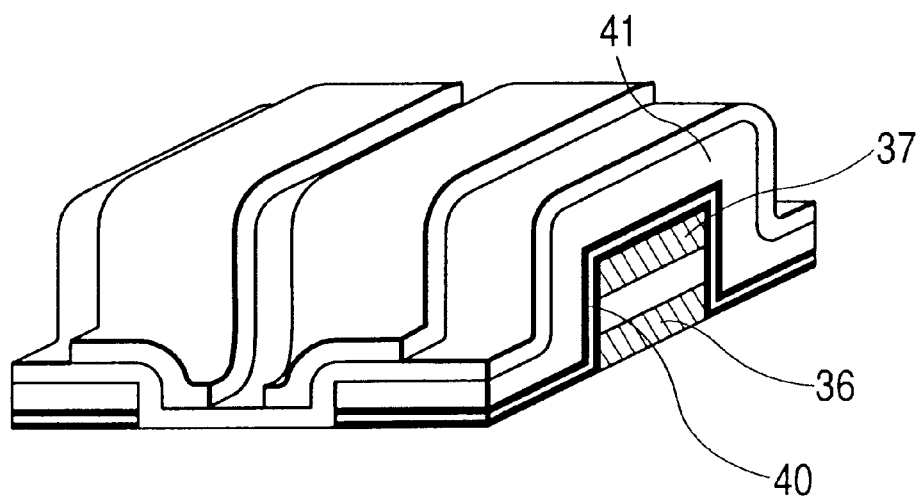
FIG. 7(b) is an upper oblique view after forming of the gate.

The eighth embodiment of the present invention is next described while referring to FIGS. 7(*a*) and 7(*b*).

In this embodiment, the manufacturing process and relative positions of the channel and the electric charge trap area are different from the seventh embodiment. The points in which the manufacturing process differs from the sixth embodiment are described next. A thin Si3N4 layer 34 with a thickness of 15 nm is formed after first forming a source 36 and drain 37. An $SiO_2$ layer 40 is deposited in an amount of 5 nm and differs in the further step of depositing an Si3N4 layer 39 in an amount of 10 nm. Afterwards, an $SiO_2$ layer 41 is deposited, photoresist masking of the hole pattern containing the stepped portion in the end of the drain 37 is performed and after etching, the manufacturing process is the same as for the sixth embodiment. The thickness of the a-Si deposit is set as 5 nm. In this structure, in the process for depositing the a-Si, at the side of the channel in a shape that joins the drain 37 and source 36 on the side surface of the Si3N4 layer 38, an electric charge trap area is formed at the side of the other Si3N4 layer 39. This structure is characterized by having good control of the distance between the channel and the electric charge trap area.

Ninth Embodiment

Figure 8A:
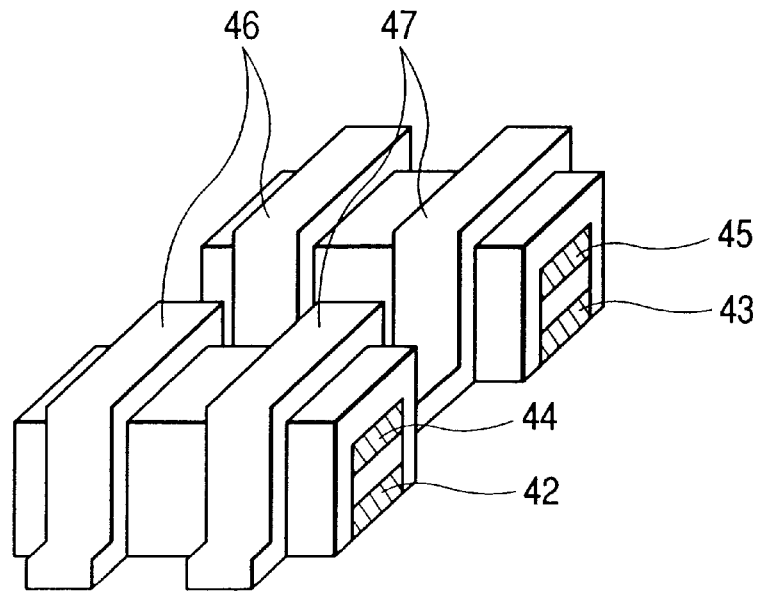
FIG. 8(a) is an upper oblique view of the semiconductor device of the ninth embodiment.
Figure 8B:
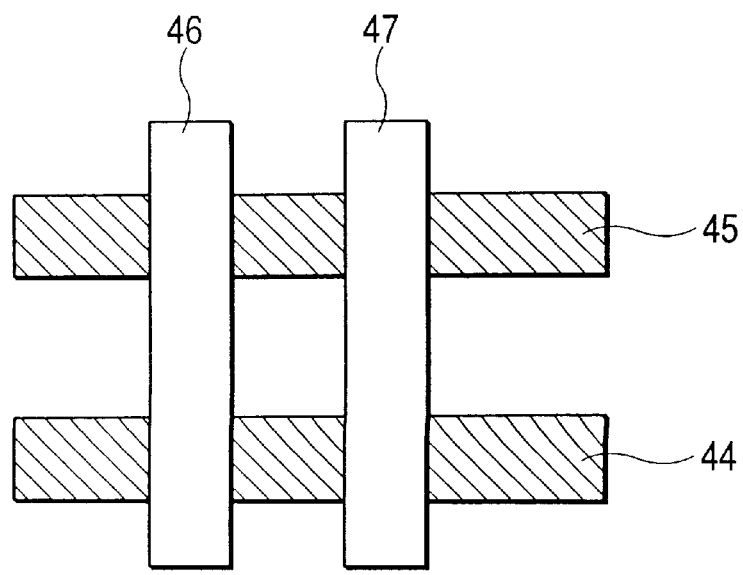
FIG. 8(b) is a top view showing the semiconductor device of the ninth embodiment.

The ninth embodiment of the present invention is next described while referring to FIGS. 8(*a*) and 8(*b*).

In this embodiment four of the memory elements of the first embodiment are arrayed, two of these elements are jointly for the sources and drains and two are jointly for the gate electrodes. Control of rows and lines is possible using the two drains 42, 43 for the data lines, and the two gates 46, 47 for the word lines. The number of elements jointly using sources and drains may be increased or restated, the number of elements controlled by the data lines may be increased. Further, the number of elements jointly using the gate electrodes may be increased or restated, the number of elements controlled by the word lines may be increased. Increasing the number of elements as above also yields the same results in the other embodiments. A method for back stamping using metal material (for instance Al, W, TiN, $WSi_2$, MoSi, TiSi, etc.) is available as a method to lower resistance in the data line. This back-stamping method may be utilized in this invention. Back-stamping (repoussage) of metal material may also be utilized to lower resistance in the word lines in this and the other embodiments of the present invention.

Tenth Embodiment

Figure 9A:
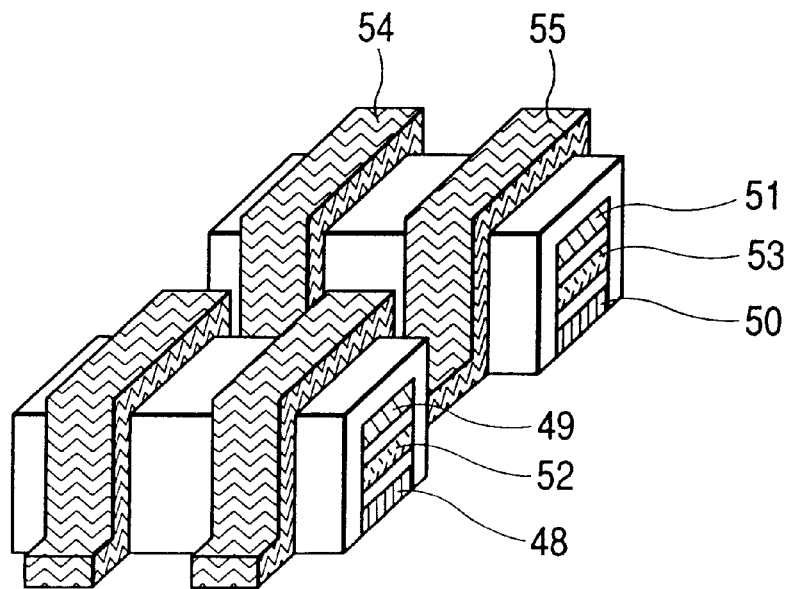
FIGS. 9(a) and 9(b) are structural views of the semiconductor element of the tenth embodiment of the present invention.
Figure 9B:
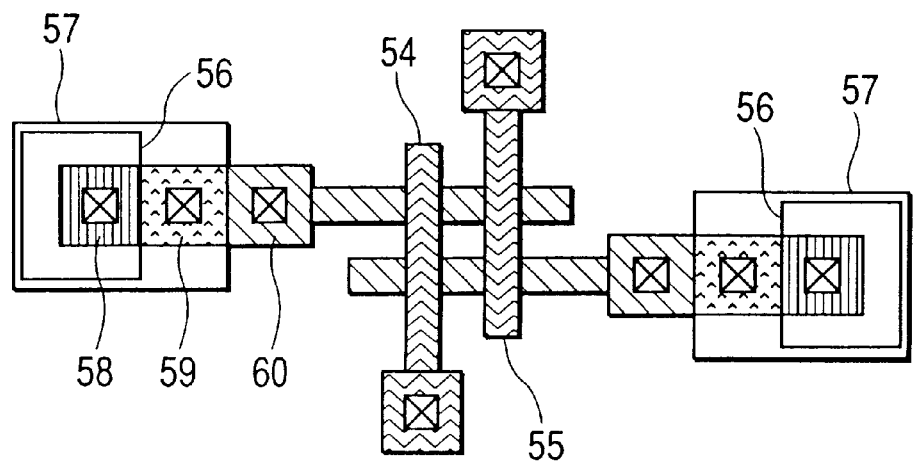
Figure 10A:
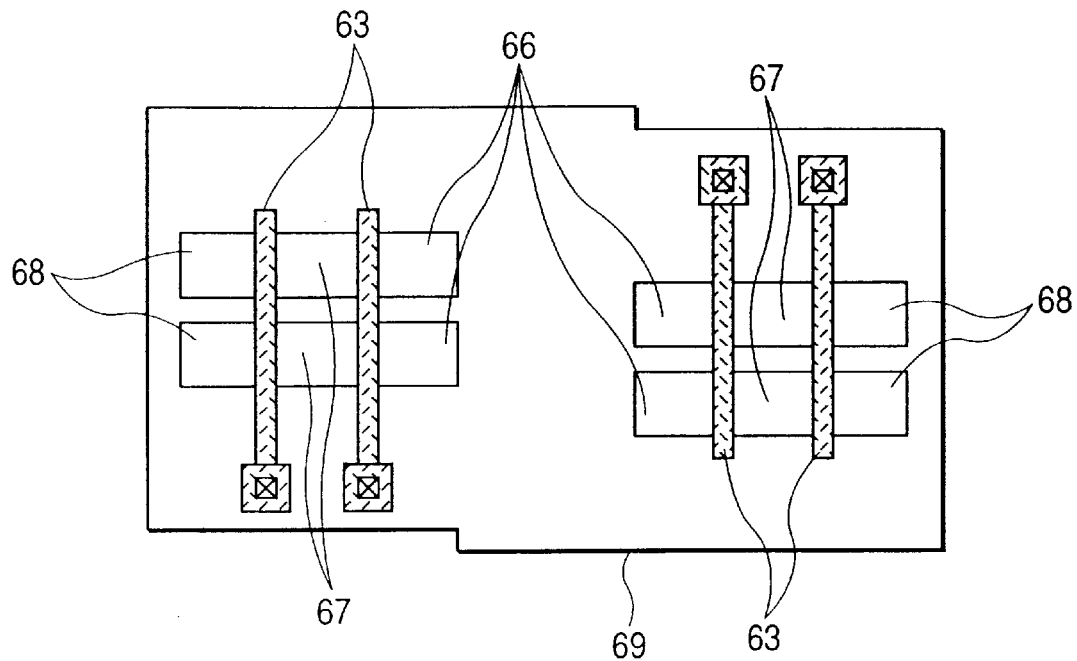
FIGS. 10(a) and 10(b) are top views showing the manufacturing process of the semiconductor device of the eleventh embodiment of the present invention.
Figure 10B:
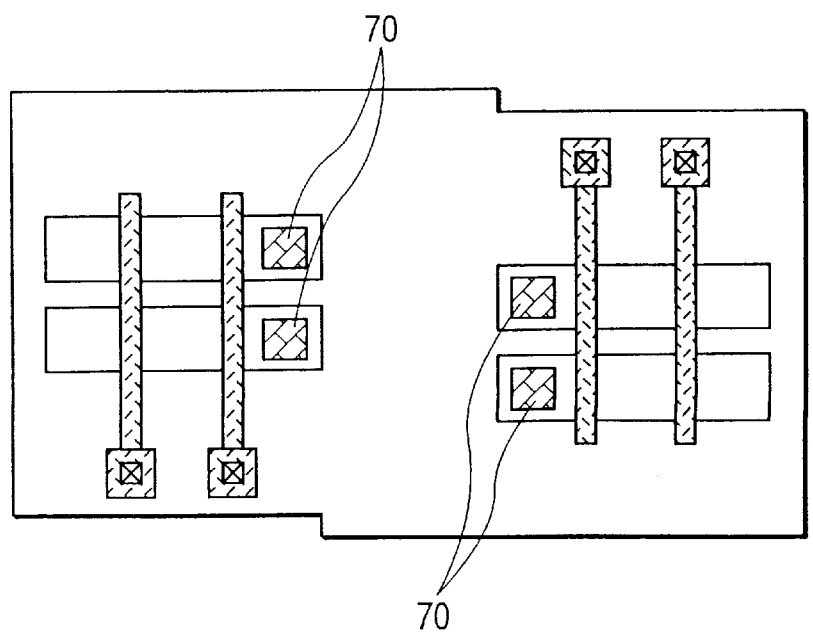

The tenth embodiment of the present invention is next described while referring to FIGS. 9(a) and 9(b).

In this embodiment, four of the memory elements of the fourth embodiment are arrayed, two of these elements are jointly for the source, drain 1 and drain 2 and two elements are jointly for the gate electrodes. The polycrystalline silicon for the jointly used drains and gates can be utilized as is for the data lines and word lines. In this embodiment, control is performed with a total of four data lines (1–4) 48–51 and word line (1) 54 and word line (2) 55 allowing eight bits or more of information to be stored. The data lines 1 through 4 correspond to the numbers 48 through 51 on the drawing in the order of smallest number first, as is the same for subsequently related embodiments. In this embodiment, the lowest layer of the n type polycrystalline silicon laminated in three layers has the data lines (1) 48 and 3 (50). The next layer has the source line (1) 52 and (2) 53, and the highest layer has the data line (2) 49 and (4) 51.

The contact portions of this embodiment are also shown in the drawing. The manufacturing process for the contacts is explained next. In order to first form the data line (1) 48 and data line (3) 50, the n type polycrystalline silicon layer and SiO$_2$ layer are deposited and in order to form the source line (1) 52 and source line (2) 53, the n type polycrystalline silicon layer is deposited. Here, a hole is made by cutting a first hole pattern 56 in the n type polycrystalline silicon layer for forming the source lines (1) 52, and (2) 53. Next, after forming the n type polycrystalline silicon layer for forming the data lines (2) 49 and (4) 51, a second hole pattern 57 is cut in the polycrystalline silicon use for forming these data lines (2) 49 and (4) 51. Next, after forming the SiO$_2$ layer, when collectively forming the data lines and source lines, the shapes (patterns for 58, 59, 60) are machined for connecting each contact pattern in the contact section. As a result, the data line 2 for shape 60 is the topmost layer of polycrystalline silicon but for shape 59 the polycrystalline silicon is cut away and no longer present so the polycrystalline silicon of the source line is the topmost layer. Further, in shape 58, the polycrystalline silicon for the data line 2 as well as the polycrystalline silicon for the source line are both no longer present and the polycrystalline silicon of data line 1 now forms the topmost layer. Accordingly, there is no need to prepare a separate process step when forming the contact hole on each layer. The manufacturing process for the contacts is also valid for other layered (laminated) structures and for instance maybe utilized in a layered structure such as for the gate electrodes in the fifth embodiment. Of course other contact manufacturing methods other than mentioned here may be utilized here and for the other embodiments.

Eleventh Embodiment

The eleventh embodiment of the present invention is next described while referring to FIGS. 10(a) through 12(b) and FIG. 17.

Here, eight memory elements of the fourth embodiment are arrayed in 4×2 patterns. The source, the drain 1 and the drain 2 are each jointly shared by four elements, while the gate electrodes are jointly shared by two elements each. The polycrystalline silicon jointly used by the gate and drain just as in the tenth embodiment, can be utilized unchanged, as data lines and word lines. the polycrystalline silicon for depositing the three layers for batch (collective) etching is layered from the bottom layer in the order of data line 1, source line and data line 2. This embodiment also shows inclusion of the transistor section for selecting the data line. The cell is the portion 61 enclosed by the dotted line. Control in this embodiment is performed by the four data lines 62, the four (selection) transistor gates 63 and the word line 64 to allow storing information of 16 bits or more. The size (surface area) of the contacts and peripheral circuits must be reduced as the size of the memory cell decreases. In particular when forming the source, drain and gate as a layered structure as in this embodiment, it must be taken into account that forming large contacts and peripheral circuits will make layout impossible.

The structure is next explained simultaneously with the manufacturing process. First of all, the selection transistors are formed on the silicon substrate (FIG. 10(a)). The reference numerals 66, 67 and 68 denote diffusion layers. Other peripheral circuits are also formed at the same time but only the transistors to select the data lines are shown here. An oxidized layer is deposited (formed) after forming the gate electrode 63 for the selection transistors and a memory cell is then formed on the field-oxidized layer 69. The method for forming the cell portion is the same as in the fourth embodiment and hereafter only the differing points are related. Before depositing the n type polycrystalline silicon layer for the bottom layer data line 1, photoresist masking of the oxidized layer and etching is performed and a segment 70 of the diffusion layer 66 for the selection transistor is exposed (FIG. 10(b)).

Figure 11A:
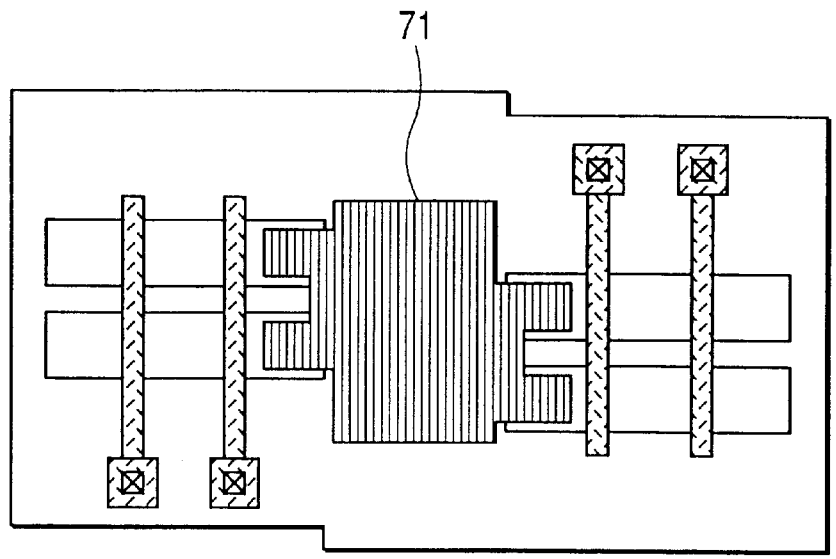
FIGS. 11(a) and 11(b) are top views showing the manufacturing process of the semiconductor device of the eleventh embodiment of the present invention.
Figure 11B:
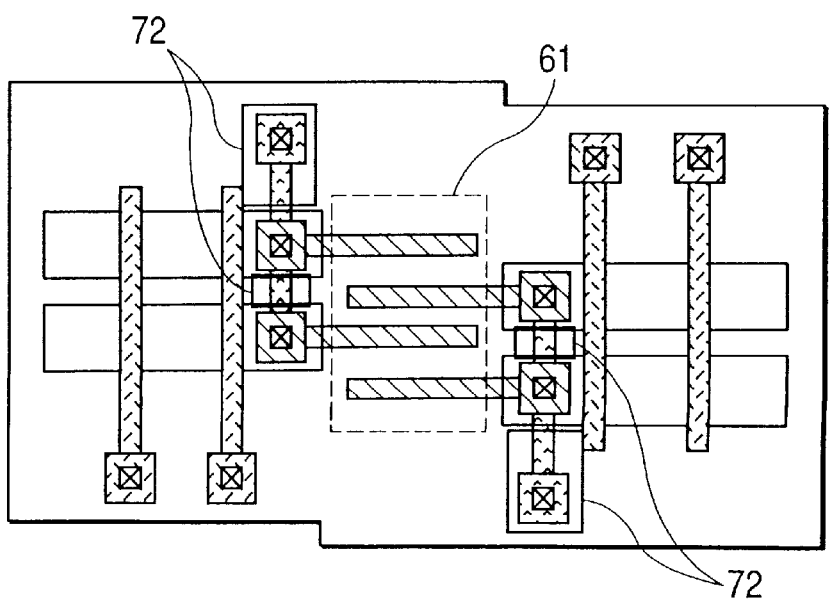

The continuation of the manufacturing process is shown in FIGS. 11(a) and 11(b). After forming the n type polycrystalline silicon layer for the bottom layer data line 1, photoresist masking and then etching is performed on the oxidized layer prior to forming the n type polycrystalline silicon layer for the source line 71 in FIG. 11(a). Further, after forming the n type polycrystalline silicon layer for the source line, the SiO$_2$ layer and the n type polycrystalline silicon layer for the data line (2) 49, etching is performed of the polycrystalline silicon layer for the data line (2) 49 in the hole pattern 72 shown in the drawing prior to collective etching of the data and source lines. Consequently, during collective etching of the source and data lines, there in no polycrystalline silicon on the data line (1) 52 on the external side of the pattern shown by reference numeral 71. The polycrystalline silicon is also disappearing from the data line (2) 49 in the pattern section shown by reference numeral 72.

After collective forming of the source and data lines by means of the above manufacturing process, the data line (1) is directly connected to the diffusion layer 66 of the selection transistor without a metallic connection so there is no need for separate wiring and contact forming processes and the structure can be made small while at the same time using a simple manufacturing process. The shared source lines are mutually joined by polycrystalline silicon and the polycrystalline silicon of the data line 2 has been removed on a section (65). Consequently, wiring need not be performed on that section and the surface area (size) of the structure can be kept small.

Figure 12A:
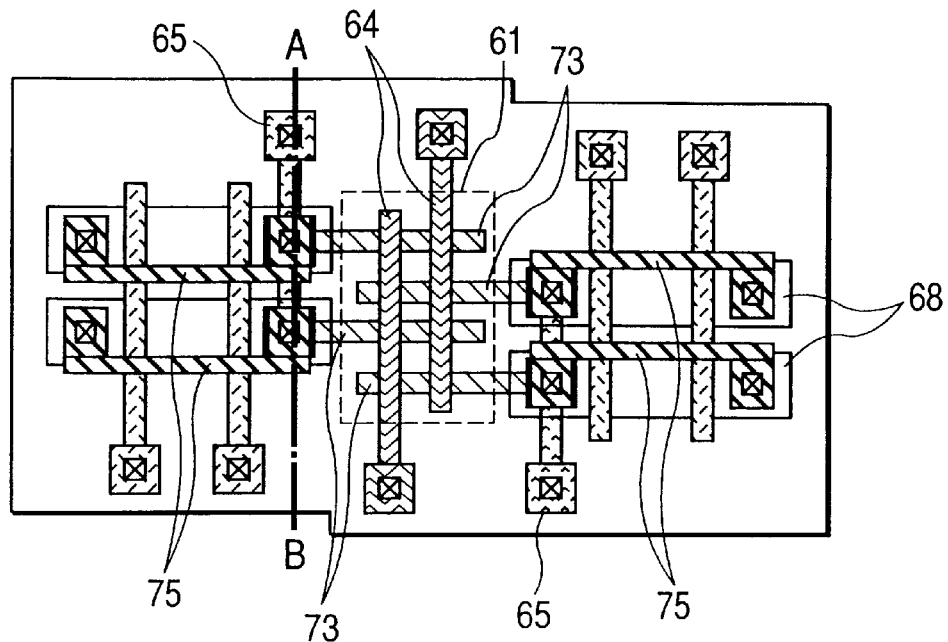
FIGS. 12(a) and 12(b) are top views showing the semiconductor device and the manufacturing process of the semiconductor device of the eleventh embodiment of the present invention.
Figure 12B:
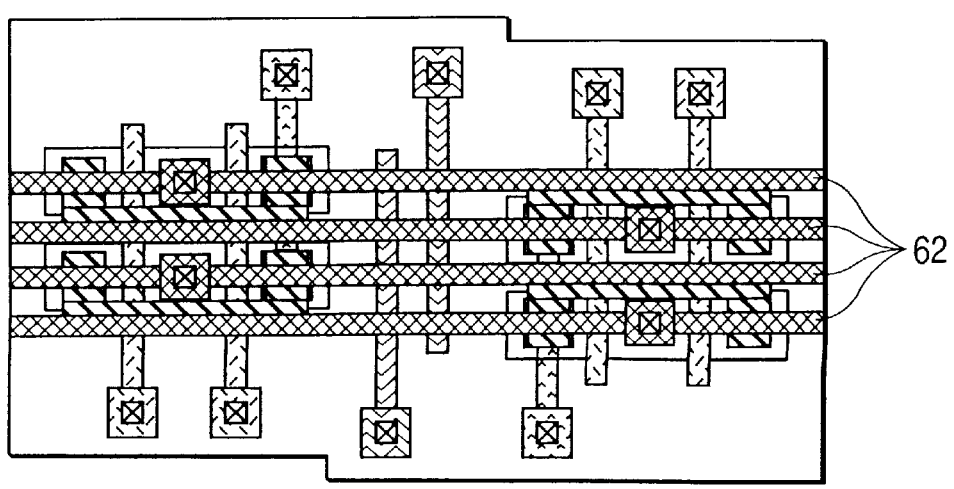

The continuation of the manufacturing process is shown in FIGS. 12(a) and 12(b). After forming the oxidized layer, the polycrystalline silicon and machining the word lines, a leveling process and forming of an oxidized layer are performed. Once the contact hole has been made, the metallic wire line 75 of one layer is formed as shown in the drawing FIG. 12(a). The data line (2) 73 and diffusion layer 68 for the selection transistor are thus connected.

Figure 17:
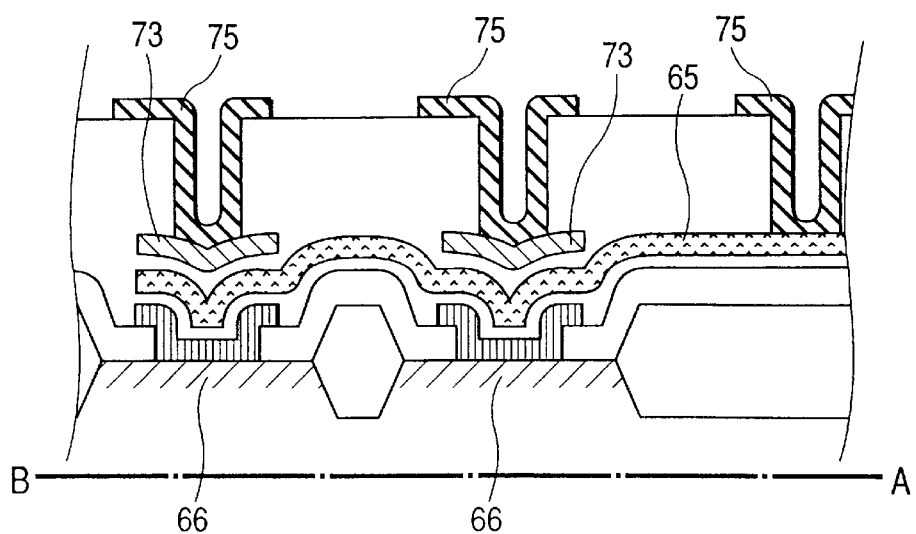
FIG. 17 is a cross sectional view showing the contact portion of the semiconductor device of the eleventh embodiment of the present invention.

FIG. 17 is a cross section drawn along line A–B of FIG. 12(a). However, in order to avoid complicating FIGS. 12(a) and 12(b), the metallic wiring for the selection transistor of gate 63 and the word line 64 are omitted. Further, a contact hole is formed in the diffusion layer 67 of the selection transistor and the second metallic wiring 75 performed as shown in the figure. As a result, by application of a voltage to the two gate electrodes of the selection transistors, the metallic data line 62 is electrically connected to either the data line (1) or to the data line (2).

The structure of this embodiment is on a small scale to easily illustrate the structure however in an actual memory device the data lines and word lines are much more numerous. The data lines and source lines of a typical arrangement will number 1000 lines, and the word lines will number 16 lines, with data lines formed for the selection transistors as shown in this embodiment. This structure for purposes of convenience is referred to as a block. A plurality of blocks with word lines repetitively arrayed in vertically constitute the memory device. The set of stacked (laminated) data lines (1, 2) can be controlled with one data line on the external side of the block by using the selection transistors. A plurality of metallic data lines for a block can be mutually connected. As a result, the number of metallic data lines equal to the number of data lines for one block will be sufficient. A particular feature of a structure such as in this embodiment which is separated into block units is that data lines for the polycrystalline silicon can be kept short and the resistance will not increase.

Twelfth Embodiment

The structure of the twelfth embodiment of the present invention is shown in FIGS. 13(a) and 13(b).

This embodiment differs from the fifth embodiment only in that the diffusion layer of the substrate is utilized as the source line 74, rather than the polycrystalline silicon. The source line, utilizing the substrate surface is easily shared in each cell. This embodiment is characterized in that there is little resistance in the source line 74 so that the polycrystalline silicon is reduced by one layer thus shortening the manufacturing process. Thus, this structure having a source line made of the diffusion layer of the substrate can even utilize the element of the first embodiment.

Thirteenth Embodiment

The structure of the thirteenth embodiment of the present invention is shown in FIG. 14.

This embodiment has a structure comprised of two overlapping layers and an array of memory elements of the first embodiment. FIG. 14 shows a cross section of the data line. The memory element and memory device of the present invention are formed on an insulating film so that a stacking or overlapping is achieved that is different from memory elements formed on the substrate surface. Another characteristics is that the stacked structure allows a further high degree of integration. Further, when employing this kind of stacked or overlapping structure, the channels of the memory element and memory device of the present invention run upright so that compared to a flat structure, the upper and lower levels are not easily susceptible to adverse effects from the gate electrodes of the cells.

Fourteenth Embodiment

The structure of the fourteenth embodiment of the present invention is shown in FIGS. 18(a) through 24.

Figure 18A:
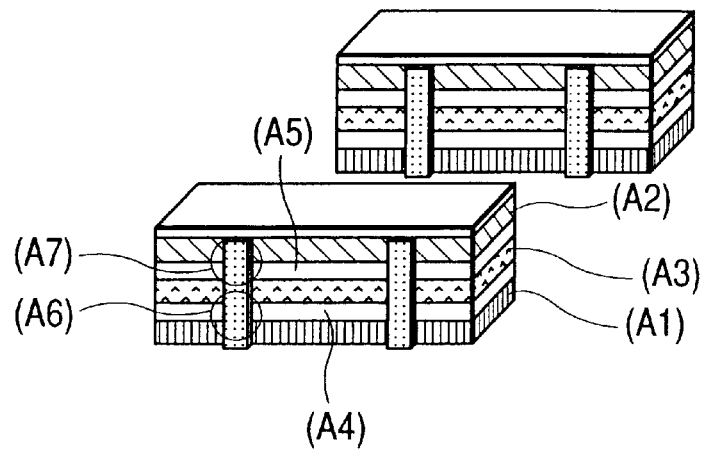
FIGS. 18(a) and 18(b) are structural views of the semiconductor memory element as a structural element of the semiconductor device of the fourteenth embodiment of the present invention.
Figure 18B:
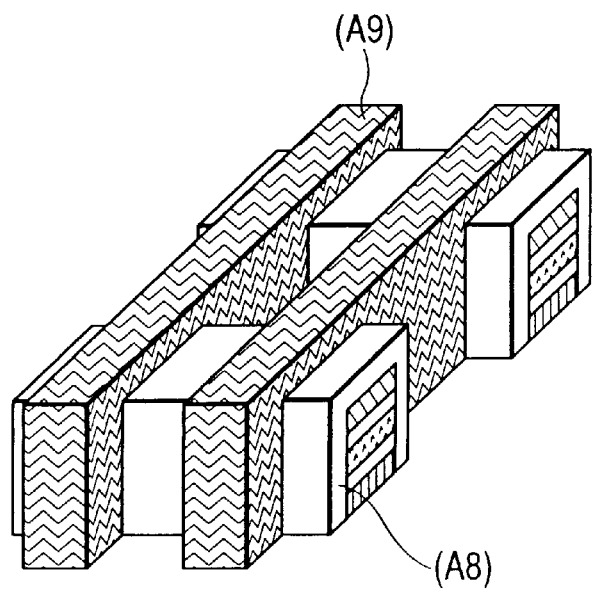

A structural view of a portion of the memory cell array comprising the memory device of this embodiment is shown in FIGS. 18(a) and 18(b). The state after forming the channel is shown in FIG. 18(a) while the state after forming the word lines is shown in FIG. 18(b). A data line (1) A1, a source line (A3) and a data line (2) A2 are made of n type polycrystalline silicon having a high concentration of impurities and these respective lines enclose the $SiO_2$ insulating films A4, A5 in order from the bottom. Channels A6, A7 are formed in a thickness of 2.5 nm and width of 50 nm of non-doped polycrystalline silicon on the side of these $SiO_2$ insulating films A4, A5. A word line A9 is formed jointly at top and bottom of polycrystalline silicon and isolated by a gate insulating film A8 with a layer thickness of 25 nm. A data line structure layer having two lines and a basis array structure using two word lines is shown here but the memory cell that is actually used has many data lines and word lines. The memory cell is formed of two upper and lower levels each with four cross points and is capable of storing at least eight bits even without using multi-bit storage.

Figure 19:
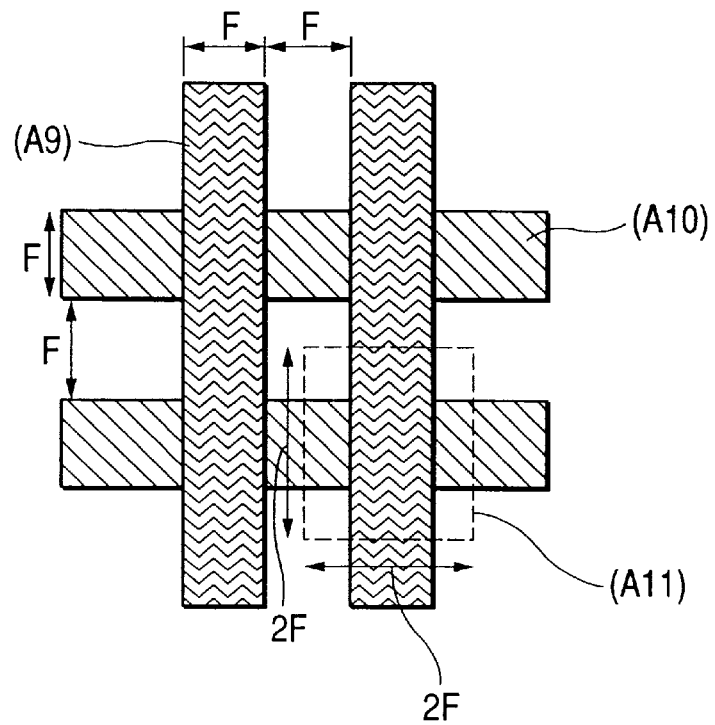
FIG. 19 is a top view of the semiconductor memory element as a structural element of the semiconductor device of the fourteenth embodiment of the present invention.

A view of this structure from the top is shown in FIG. 19. The data line (1) A1, the source line A3, and the data line (2) A3 are stacked vertically (A10), allowing the surface area to be reduced by a corresponding amount. The A11 unit structure is 4 F2. This structure holds two cells so that the surface area (size) for one cell is 2 F2.

Figure 20:
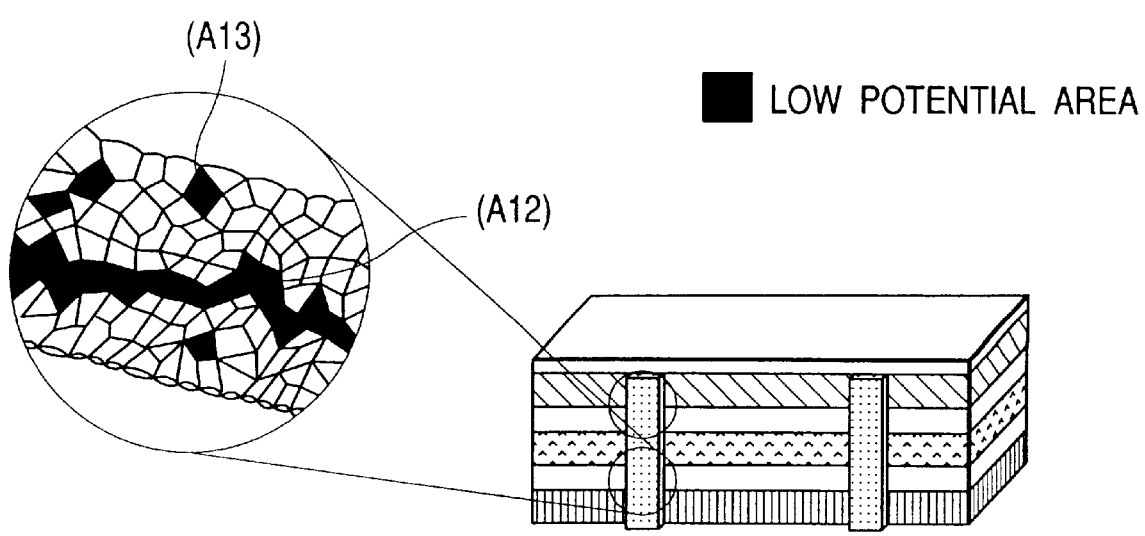
FIG. 20 is a drawing illustrating the operating principle of the semiconductor memory element comprising a structural element of the semiconductor device of the fourteenth embodiment of the present invention.

The operation of this memory element is explained using FIG. 20. The undulations (rise and fall) of potential within the extremely thin layer of the polycrystalline silicon are drastic so that an continuous low potential area constituting an electrical path A12 and an isolated low potential area constituting an electric charge trap area A13 are naturally formed within the thin layer. The sizes of the crystal particles of this layer are suppressed within a thickness of approximately 2.5 nm and so that the horizontal dimension is limited to about 10 nm. The size of the respective carriers in the electric charge trap area A13 is about the same dimension. This structure therefore has the advantage of an ideally small size, capable of room temperature operation and a simple manufacturing process. The electric charge trap area and the electrical path can of course be formed separately from each other.

In this case if the particles in the electric charge trap area are 10 nm or less, then a coulomb blockades effect can be obtained even at room temperature. Write and erase operation is performed by changing the electric potential on the word line A9. A specific voltage is applied between the data line (1) A1 and the source line A3, and when a voltage is applied to the word line, electrons are induced in the polycrystalline silicon thin film of the channel A6, and electrical current starts to flow. When a large gate voltage is applied, the difference in potential between the electrical current path A12 and the electric charge trap area A13 becomes large, and finally the electrons cross over the high potential portion of the barrier by means of the tunnel effect or heat excitation and are injected into the electric charge trap area A13. As a result, the threshold voltage shift to the larger potential and the electrical current value becomes small even with the same gate voltage. Readout of information is performed by means of the size of this electrical current value. Erase is performed by a swing in the gate voltage in the reverse direction.

The structure of the memory mat which is a basic unit comprising large scale cell arrays using memory cells is explained next.

The layout of a memory mat is shown in FIG. 21, FIG. 22, FIG. 23, FIG. 24, FIG. 25, FIG. 26, and FIG. 27. These figures respectively show different stage of the manufacturing process for the same section.

The above mentioned memory cell has a configuration suited for element array and is capable of being arrayed as is on a large scale. However, the memory cell uses long polycrystalline silicon data lines, so the resistance becomes too large. Therefore, contacts of a certain scale were used and wiring over long distances performed with low resistance materials such as metal. A small-scale unit for such an arrangement is referred to as a memory mat. In this embodiment, 8 lines each are arrayed for the data lines and word lines, two cells for each of the 64 cross points, so the memory mat is comprised of a total of 128 cells.

Further, for purposes of identification, the polycrystalline silicon data line 1, data line 2 for performing for internal mat wiring are referred to as local data lines, while the low resistance data lines for performing wiring between mats are referred to as global data lines. Since the two lines comprising the data line 1 and the data line 2 overlap on each other, the MOS transistor for selecting the upper and lower mat units is installed on the substrate surface. This arrangement avoids trouble with the pitch and allows the global data line outside the mat to be limited to one wire. Since the pitch of the selection transistor is made larger than the pitch of the data line to take into account the element isolation region, the selection transistor for adjacent data lines functions while separating the memory mat into top and bottom portions.

Figure 21:
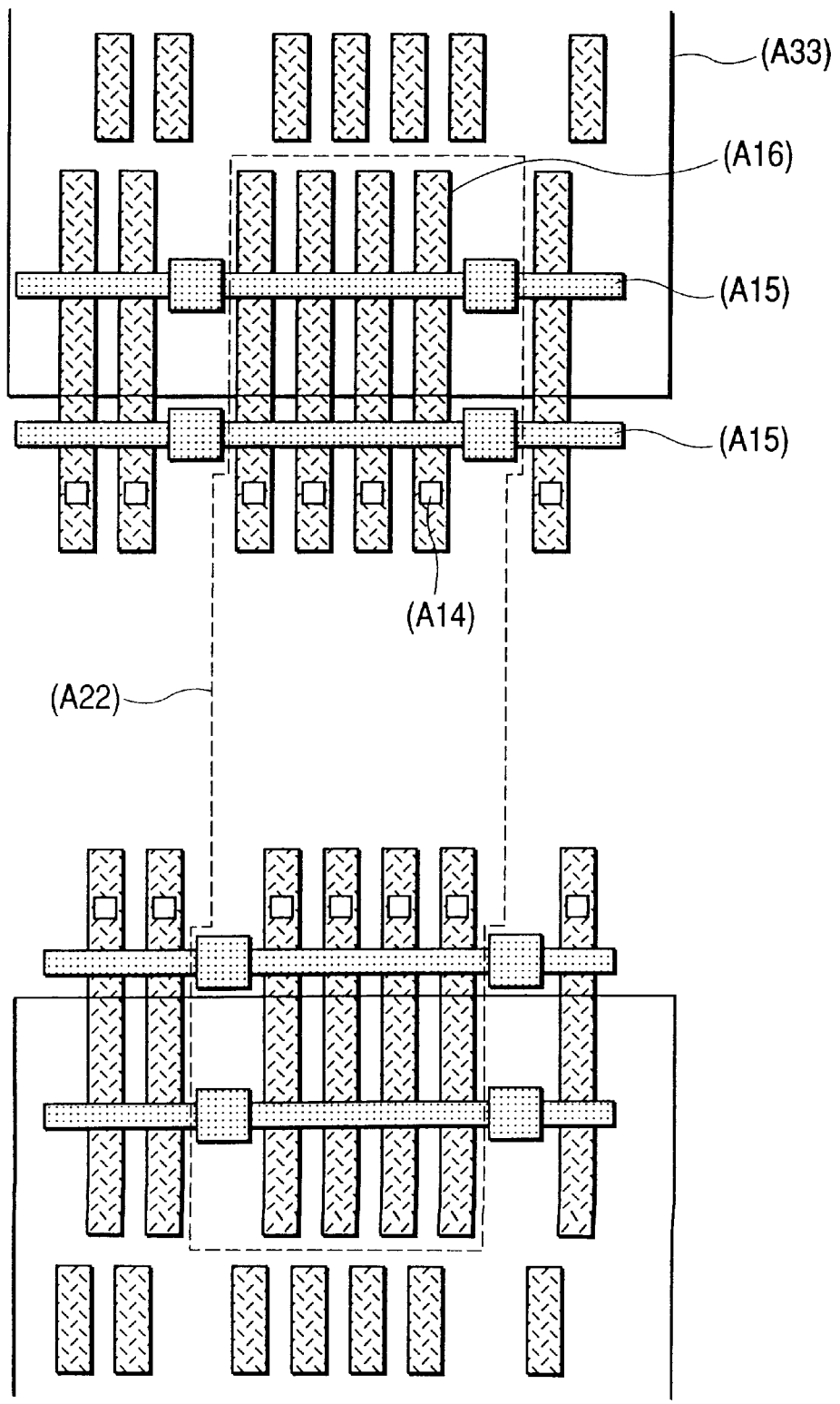
FIG. 21 is a top view of the memory mat constituting a structural element of the semiconductor device of the fourteenth embodiment of the present invention and shows the state prior to forming the memory cell.
Figure 22:
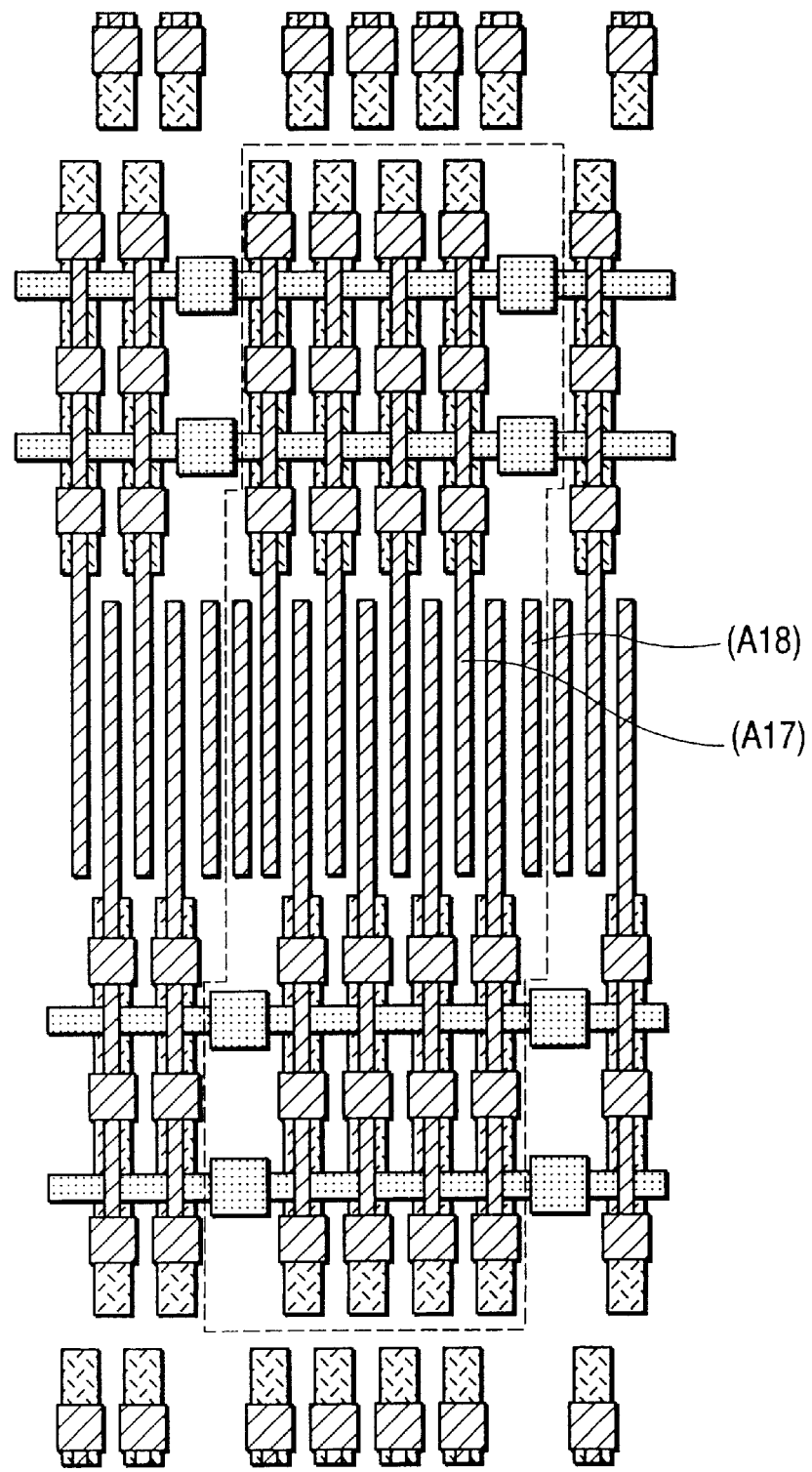
FIG. 22 is a top view of the memory mat constituting a structural element of the semiconductor device of the fourteenth embodiment of the present invention and shows the state after forming the data lines.

Next, the layout of this embodiment is explained along with the manufacturing process by utilizing FIG. 21 through FIG. 27. The area A22 enclosed by the dotted line in the figures forms the memory mat unit. First, an n type transistor is formed on the P type substrate surface. A layout is utilized for gate electrodes A15 to run along the active region A16 arrayed alongside. A CMOS peripheral circuit is formed at this same time on the outer side of the memory cell array. Also, a triple-layer well structure is used in the MOS transistor in order to utilize a range of voltages. At least two types of gate length MOS transistors are formed, since the transistors for sensing amps, MOS decoders and high voltage tolerance word drive circuit transistors have different voltage breakdown levels. An SOI substrate was not used in this embodiment however the above mentioned triple-layer well structure is not always needed when utilizing a thin layer SOI substrate. Afterwards, once the $SiO_2$ layer has been formed, etching of the $SiO_2$ layer is performed as a mask for the resist, and a portion A14 of the selection MOS diffusion layer is exposed. After forming the n type polycrystalline silicon layer in a thickness of 50 nm, etching of the $SiO_2$ layer is performed as a mask for the resist pattern A33 as shown in FIG. 21. This process allows a direct connection between the local data line A1 and the diffusion layer of the selection MOS, providing the advantage, that a process to remove the contact for the local data line (1) A1 is unnecessary. Further, the $SiO_2$ layer (thickness 100 nm), the n type polycrystalline silicon layer (thickness 50 nm), the $SiO_2$ layer (thickness 100 nm), the n type polycrystalline silicon layer (thickness 50 nm), and the $SiO_2$ layer (thickness 30 nm) are formed in that order; batch (collective) etching of the $SiO_2$ layer is performed as a mask for the resist pattern for the six layers that were formed, and the laminated structure A17 formed from the source line A3, the local data line (1) A1 and the local data line (2) A2 as shown in FIG. 22.

Figure 23:
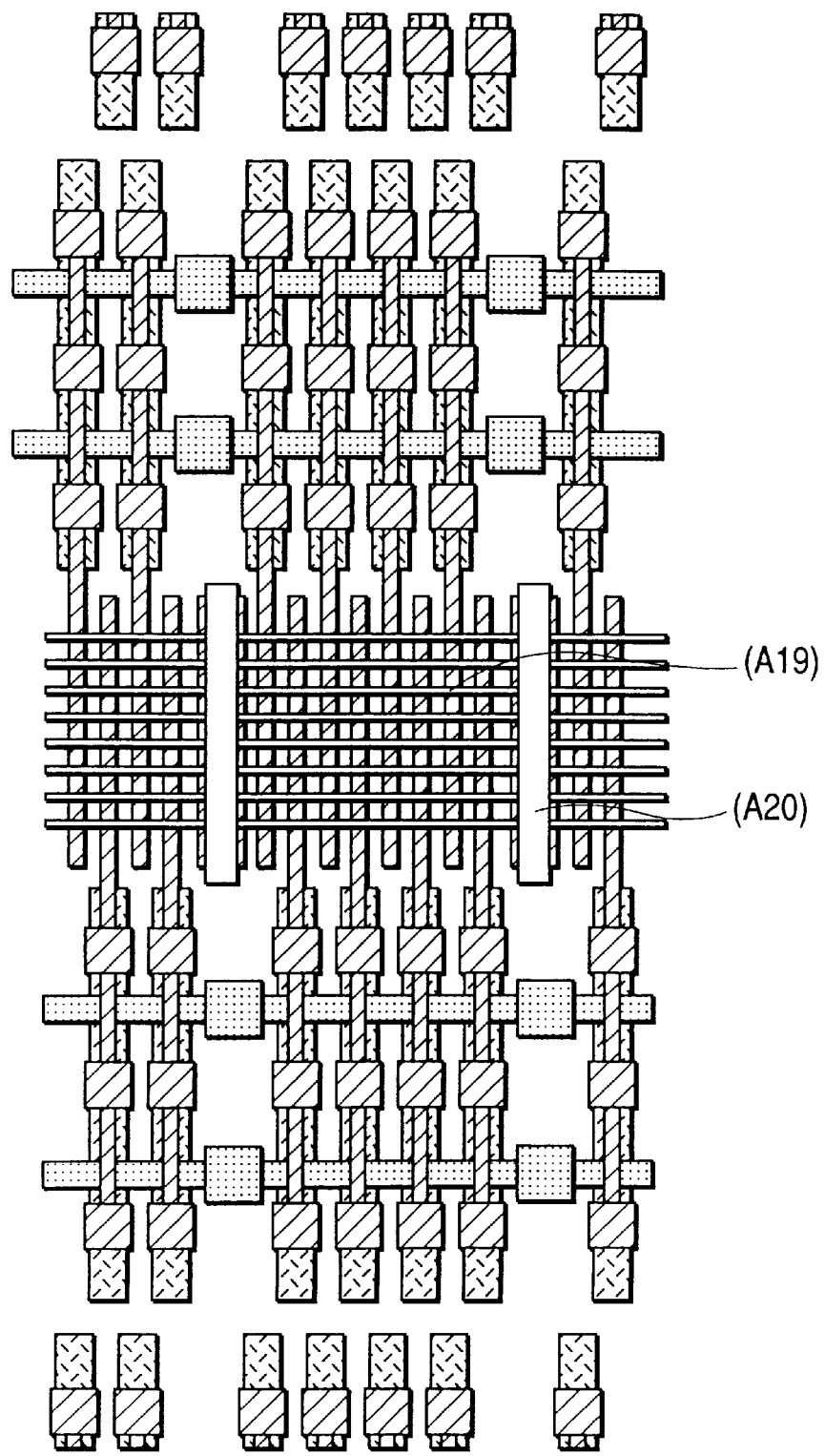
FIG. 23 is a top view of the memory mat constituting a structural element of the semiconductor device of the fourteenth embodiment of the present invention and shows the state after forming the resist pattern for forming the channels.
Figure 24:
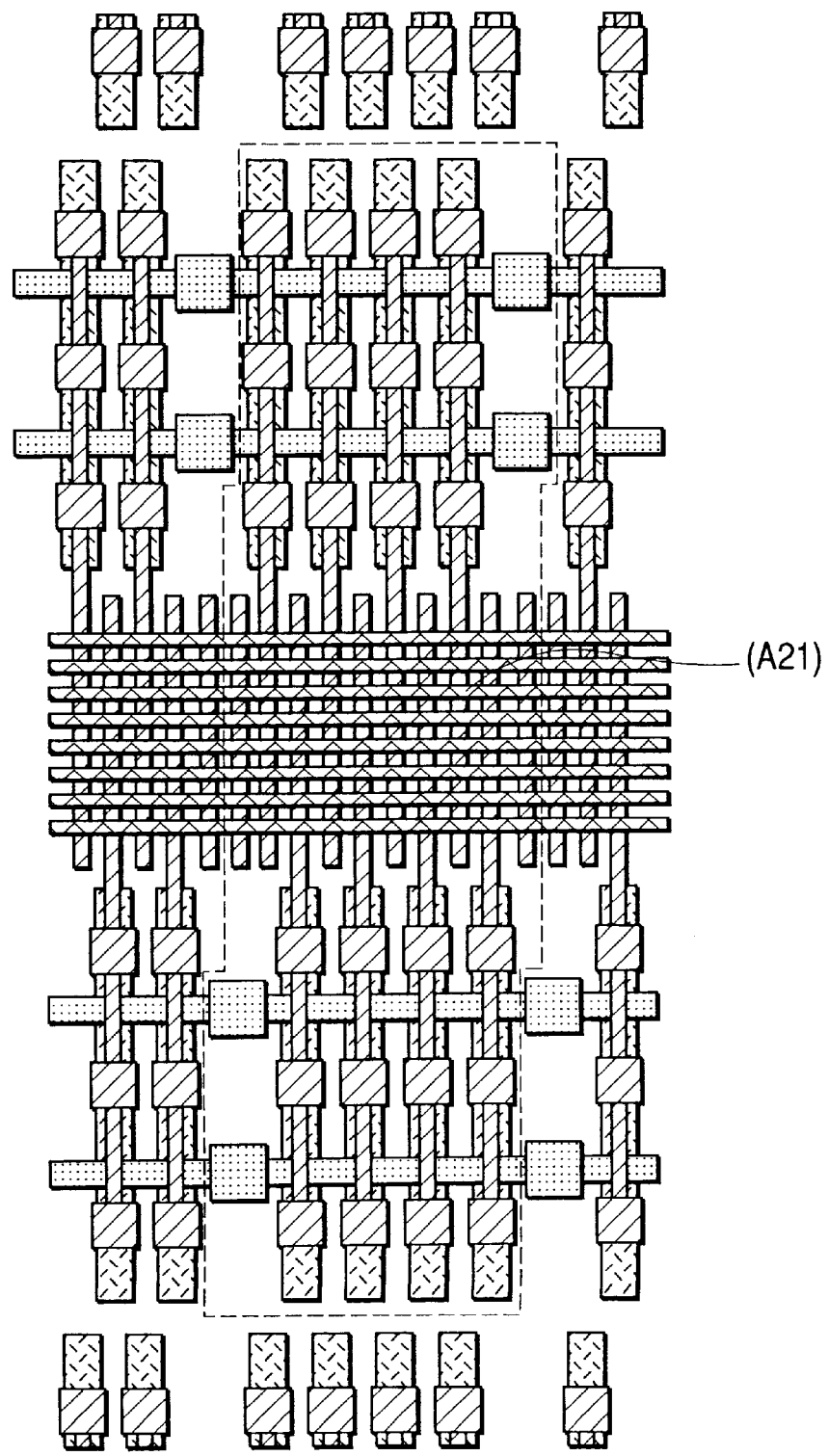
FIG. 24 is a top view of the memory mat constituting a structural element of the semiconductor device of the fourteenth embodiment of the present invention and shows the state after forming the word lines.
Figure 25:
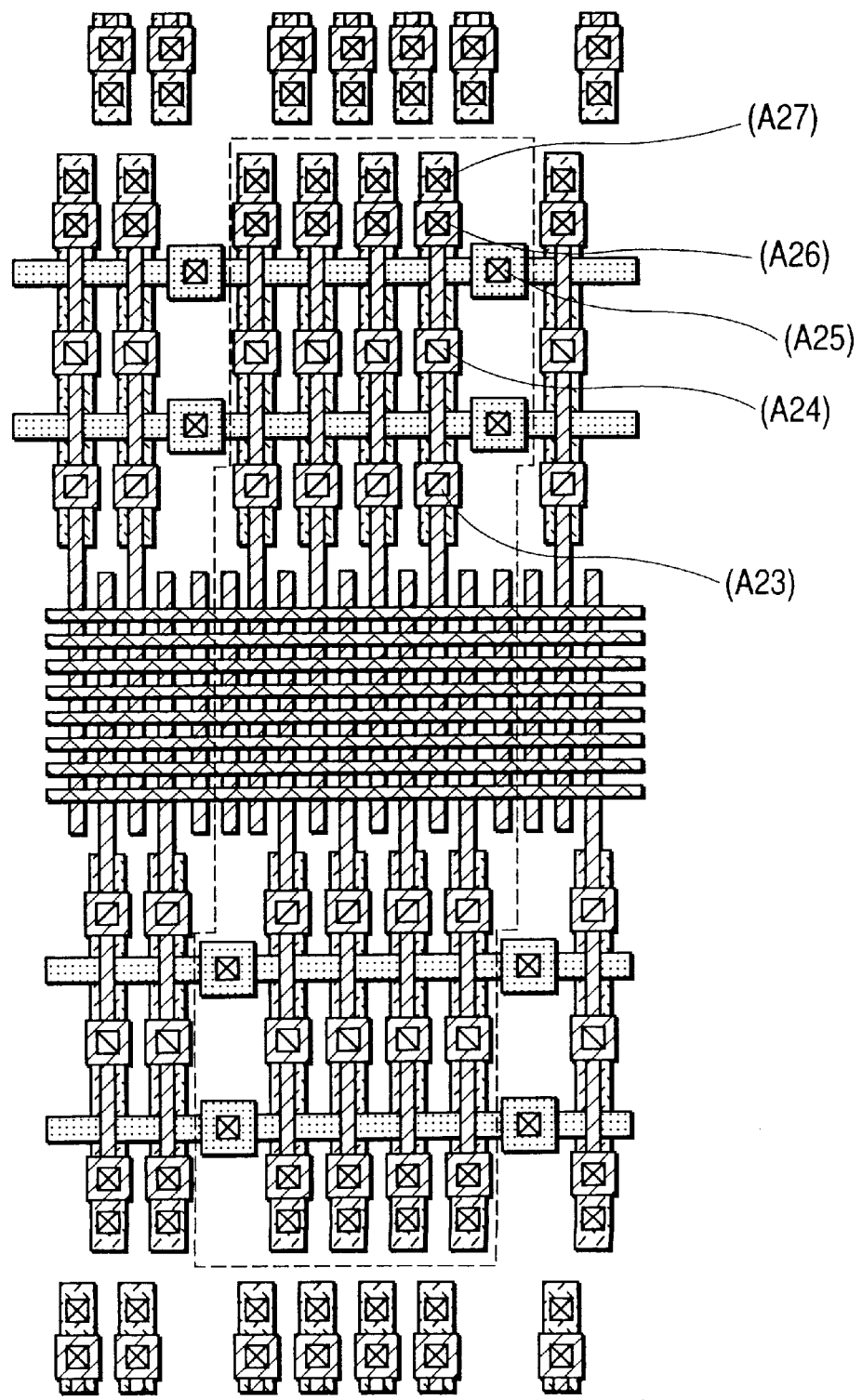
FIG. 25 is a top view of the memory mat constituting a structural element of the semiconductor device of the fourteenth embodiment of the present invention and shows the state after forming the contact holes.

Since these layers are formed in one batch (collectively), the lithography process is simple compared to fabricating a one layer memory structure in two layer shape. Further, a data line pattern A18 is formed at the boundaries between the memory mats. In the lithography process for a data line, this pattern allows easily detecting the optimal conditions of repetitive structures of about the same size exposed to light (drawing in EB process). Also, by setting adjoining structures on both sides the same for adjoining data lines, a local line can be set to the same static capacitance as the surrounding lines which is extremely beneficial for stable memory operation. Next, after forming an a-Si (amorphous silicon) layer in a thickness of 2.5 nm, crystallization by means of heat treatment is performed. After crystallization, an $SiO_2$ layer with a thickness of 15 nm is formed and then a resist pattern A19 is formed in a width of 0.1 micron running at a right angle to the data line as shown in FIG. 23.

Masking of this resist pattern A19 and then etching is performed. A fine $SiO_2$ line is formed running perpendicular to the substrate at the side of the $SiO_2$ layer A6 between the local data line (1) A1 and the source line A3 as well as the side of the $SiO_2$ layer A7 between the local data line (2) A2 and the source line A3. Here, establishing a dummy pattern A20 prevents the fine lines of the resist pattern from collapsing. Next, the $SiO_2$ pattern formed parallel to the substrate is trimmed by anisotropic dry etching. Performing this process prevent the polycrystalline silicon from joining adjacent local data lines. Next, the polycrystalline silicon thin layer is oxidized in an $O_2$ plasma environment. In order to prevent the oxidation at this time from progressing more than approximately 10 nm, the polycrystalline silicon thin layer below the previously formed fine line of $SiO_2$ is not oxidized and a fine pattern of an extremely thin polycrystalline silicon thin layer can be formed. This method is superior to making a fine line by dry etching due to the following reasons. One reason is that a fine pattern can be formed with resist by means of the dry etching effect and oxidizing effect from wet etching. The inventors foresaw at the early evaluation stage that a sufficient threshold shift could be obtained prior to and after the write operation by an extremely thin polycrystalline silicon thin layer having a fine channel line whose ratio of width and length was 2 or greater. Just as in this embodiment, when the layer thickness of the $SiO_2$ layer between the source line A3 and local data line A1 is 100 nm, forming a pattern of approximately 0.5 microns is necessary. The prototype fabricated by the inventors utilized a resist pattern with a width of 0.1 micron and at the completion of wet etching, a fine line of $SiO_2$ of 0.07 microns had been formed. An oxidizing effect from the side surfaces is thought to contribute to this process so that an extremely thin polycrystalline silicon layer with a fine channel line of 0.05 microns in width is formed after oxidation. A second reason is that since oxidation due to the $O_2$ plasma halts at approximately 10 nm, there is no possibility of over-trimming an excess amount from the channel line when making the channel. Once the channel is made and after forming (depositing) the thin $SiO_2$ layer A8 for use as the gate insulating film, the n type polycrystalline silicon layer is formed and etching performed on the photoresist mask to form the word line A21 as in FIG. 24.

If an n type polycrystalline silicon layer is formed thicker than half of the gap between data lines, then a steep step (or groove) can be built in at forming of the data line and the resist pattern easily formed. The presence of a dummy pattern of the preceding data line allows an established groove width between data lines and this (built-in groove) effect can obtained even for the boundary sections of the memory mat. Etching is also performed after forming the n type polycrystalline silicon layer, and after thinning the layer, a word line with lower resistance can then be formed by a deposition of silicide. The insulating film is formed after forming of the word lines, and the contact process performed once leveling has been accomplished as in FIG. 25. At this time, the contact A26 for the local data (2) A2, the contact A27 for the selection MOS diffusion layer A16, the contact A25 for the selection MOS gate electrode A15, and the contact A34 for the word line A21 can be formed after etching of the insulating film formed in the upper portion has been performed. In contrast, since the source line A3 is located below the local data line A2, the contact hole A23 for the source line A3 can be taken through the local data line (2) A2. Further, in order not to occupy a wide segment of the selection transistor active region width which is determined by the pitch, the contact hole A24 for connecting the global data line and the selection transistor, also passes through both the local data line (2) A2 and the source line A3. This structure allows a layout in which the contact hole and the data line overlap on each other. The local data line (1) A1 is not present here in this contact region since trimming is required after forming the local data line (1) A1 beforehand. In order to avoid electrical shorts with the layer around the hole, a side wall of insulating film is formed within the contact hole by etching using irregular dry etching once the hole and hole insulating layer have been formed.

Figure 29:
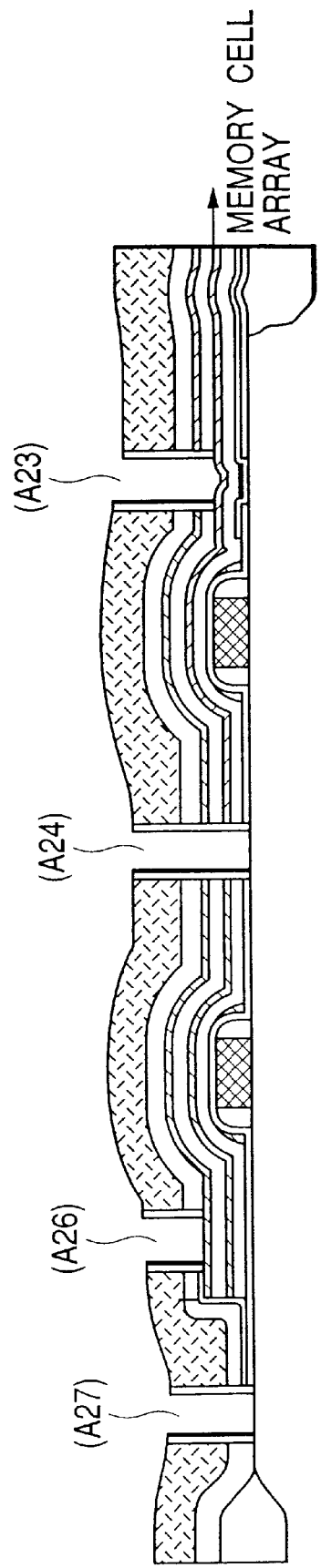
FIG. 29 is a cross sectional view illustrating the contact structure of the select MOS for the memory mat constituting a structural element of the semiconductor device of the fourteenth embodiment of the present invention.

A cross sectional view of the contact for the selection MOS portion after forming of the side wall is shown in FIG. 29.

Figure 28:
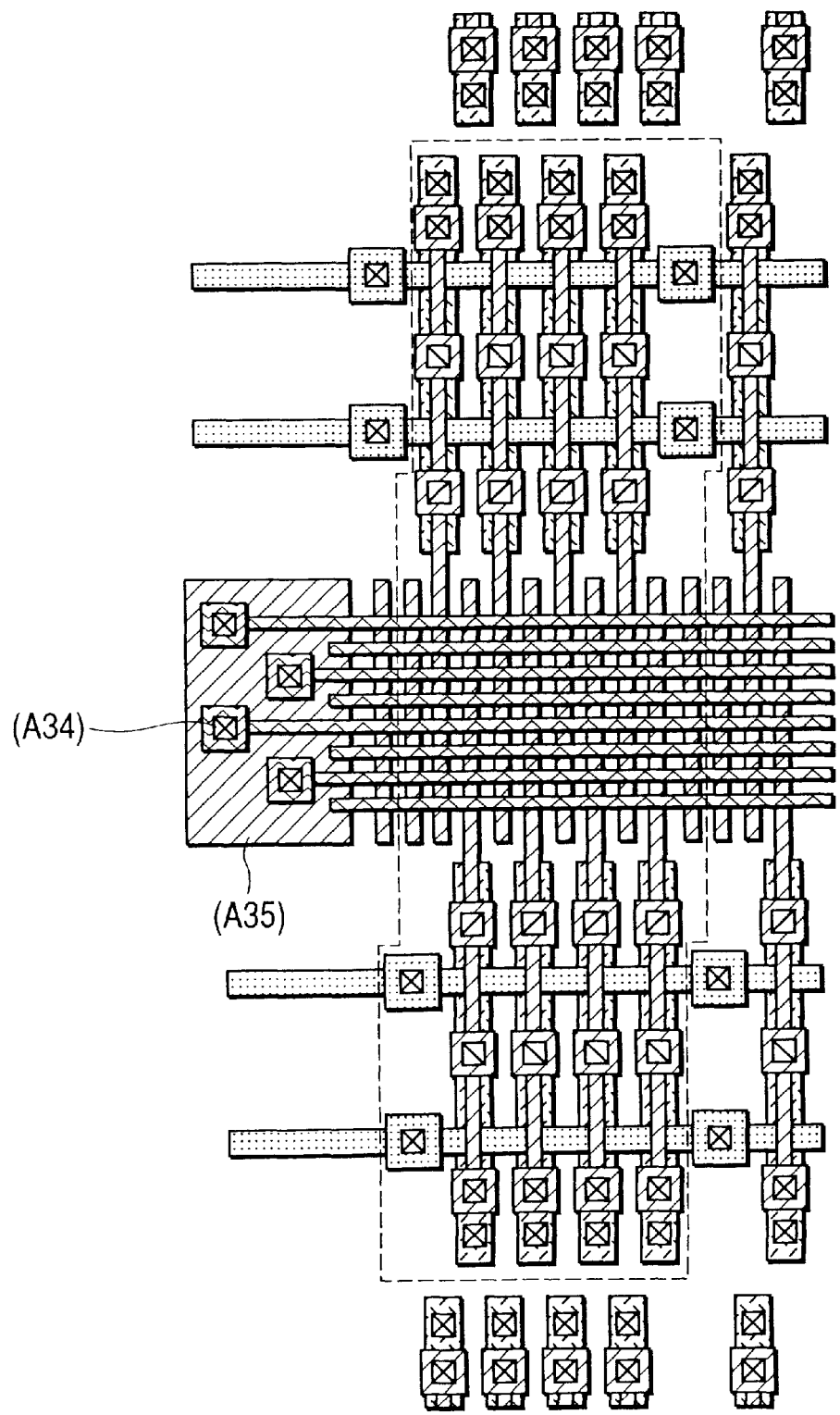
FIG. 28 is a top view of the memory mat constituting a structural element of the semiconductor device of the fourteenth embodiment of the present invention and shows the state after forming the contact holes, and in particular shows the contact pattern matching the word line in the end of the cell array.

The contact A34 for the word line of the end of the memory cell array is shown in FIG. 28.

Figure 26:
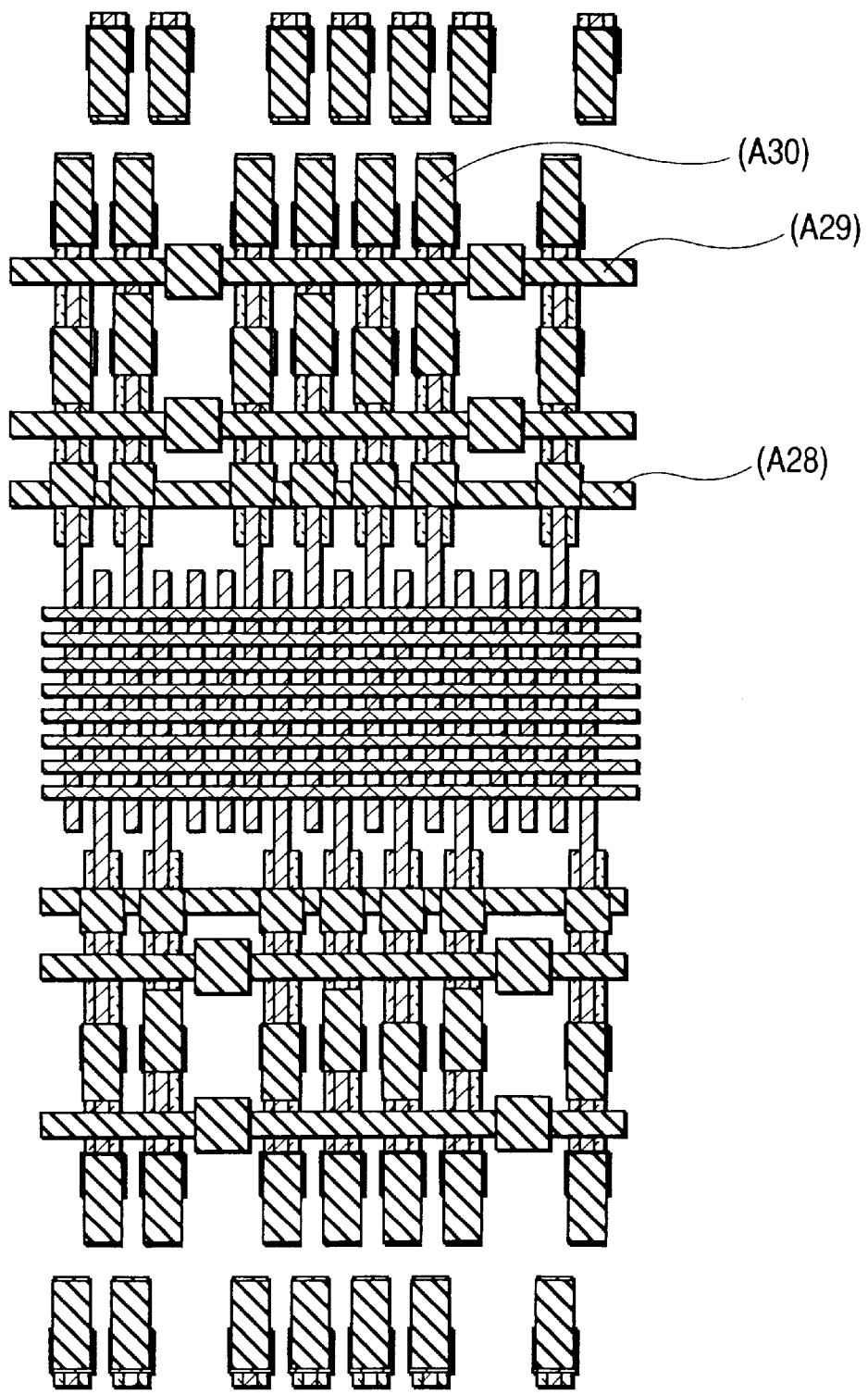
FIG. 26 is a top view of the memory mat constituting a structural element of the semiconductor device of the fourteenth embodiment of the present invention and shows the view after forming a first wiring layer.

A large dummy pattern A35 is formed from the same material as the laminated data lines yet different from the dummy data lines. The contact A34 is formed on this dummy pattern A35. The arrangement prevent being unable to obtain the effect from the built-in groove in the data line due to forming of the polycrystalline silicon layer as related in the section on making the word lines. After this step, metal is deposited, and etching performed after photoresist masking to form the first layer of metal wiring M1 as shown in FIG. 26.

Figure 27:
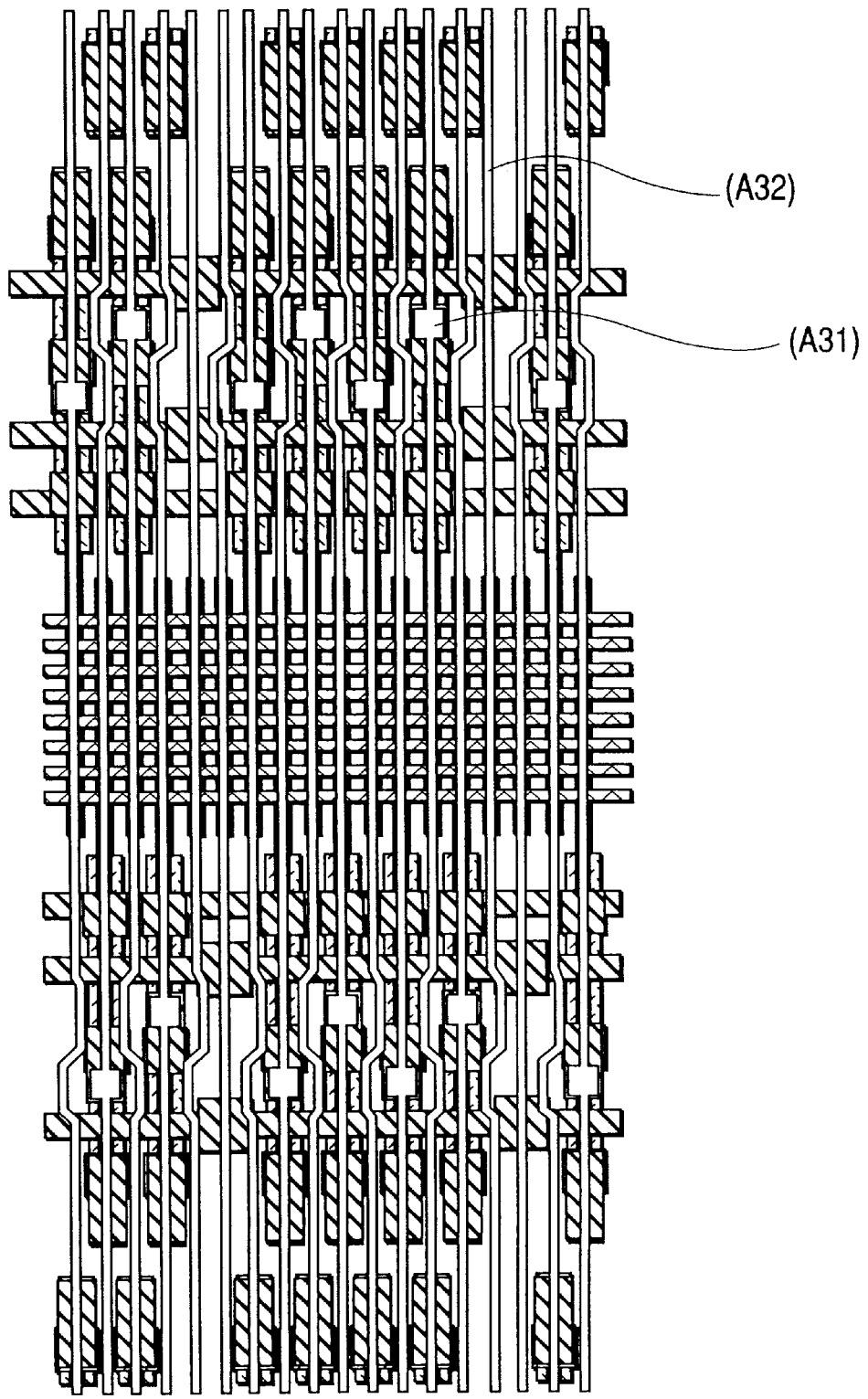
FIG. 27 is a top view of the memory mat constituting a structural element of the semiconductor device of the fourteenth embodiment of the present invention and shows the view after forming a second wiring layer.

The resistance in the M1 wiring A29 is lowered by back stamping (repoussage) of the polycrystalline silicon gate electrode A15. The wiring A28 for the source line A3 is also performed with M1. The connection (A30) with the local data line (2) A2 and with the selection MOS diffusion layer is also made. Further, once the insulating film between the layers has been formed, the contact holes are made, the metal deposited, and etching performed after photoresist masking to form the second layer of metal wiring M2 as shown in FIG. 27. The global data line A31 is formed with M2. Forming the global data line with M1 may prevent other wiring from being performed since the memory mat surface is run within a narrow pitch. Therefore, utilizing M2 or a higher wiring is necessary in the global data line A31. The same can also be said for the readout circuit connecting to the outer side of the memory cell array, in other words, connecting the read out circuit to a layer below the global data line, for instance M1 is necessary. In the global data lines also, placing a dummy pattern at the boundaries of the memory mat will allow obtaining the same effect as for the local data lines.

Fifteenth Embodiment

Figure 30A:
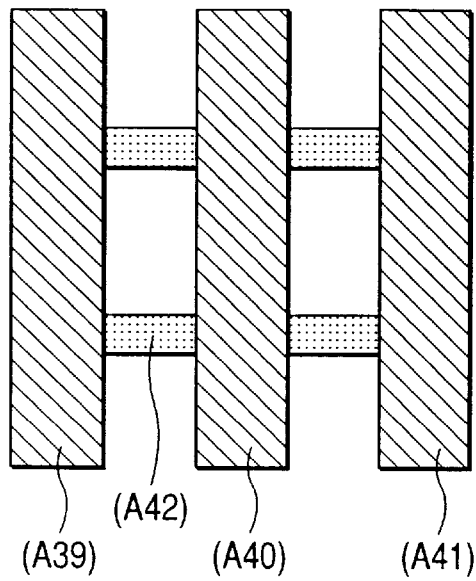
FIGS. 30(a) and 30(b) are structural views of the semiconductor memory element constituting a structural element of the semiconductor device of the fifteenth embodiment of the present invention.
Figure 30B:
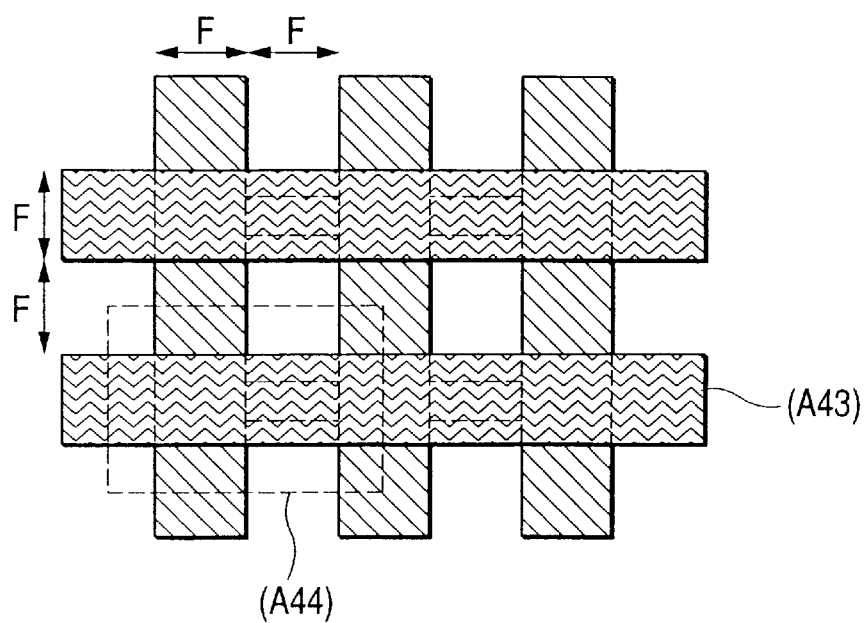
Figure 32:
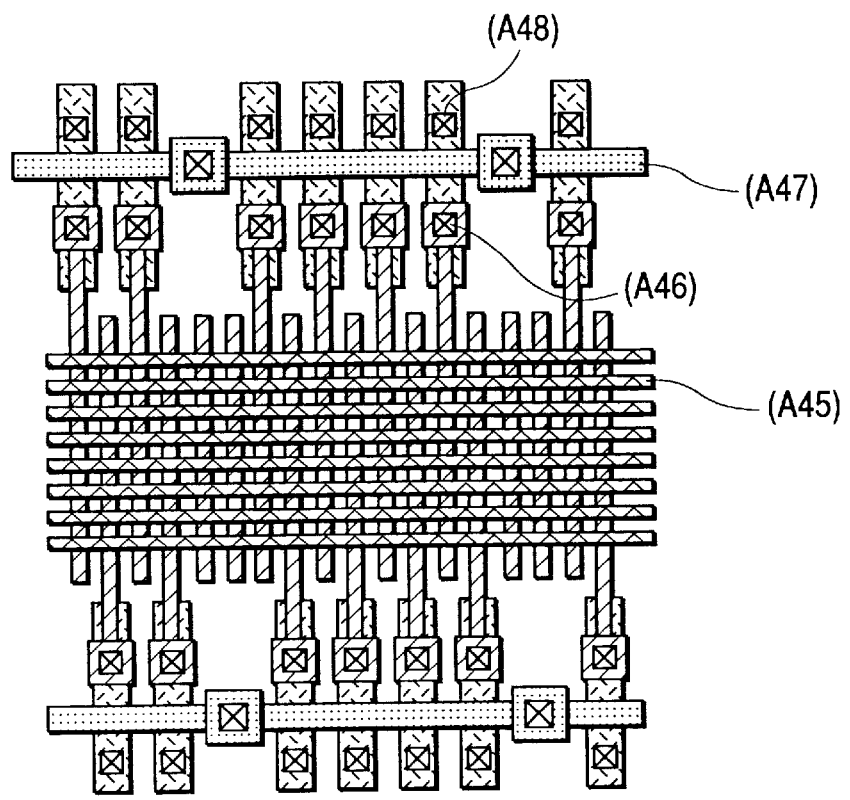
FIG. 32 is a top view of the memory mat constituting the structural element of the semiconductor device of the fifteenth embodiment of the present invention and shows the state after forming the contact holes.

The fifteenth embodiment of the present invention is next described while referring to FIGS. 30(a), 30(b) and FIG. 32.

FIGS. 30(a) and 30(b) are structural views of a section of the memory cell array comprising the memory device of this embodiment. FIG. 30(a) is a view after forming of the channels. FIG. 30(b) is a view after forming of the word lines. In the example in the fourteenth embodiment, two cells of memory elements were stacked vertically in the structure. This embodiment differs in being comprised of one cell but other structures are of the same operating principle.

The channel A38 runs in a shape vertically joining the local data line A37 and the source line A36. The electrical potential of the channel is controlled by the word line A47. The structure of this embodiment has a lower degree of integration than the structure of the fourteenth embodiment but is characterized in having few steps (grooves) while being made and has a large process margin.

FIG. 32 is top view of a memory mat. A view up to the contact process is shown and corresponds to FIG. 25 in the fourteenth embodiment. In the mat unit of course, a local data line connects to the global data line by way of a MOS transistor. In the fourteenth embodiment, the object was to select an upper or lower cell by means of a transistor, however in this embodiment, the object is to reduce the capacitance of the local data line electrically connecting to the global data line during operation. If the capacitance on the local data line can be reduced, then quicker and larger changes in electrical potential can be made to occur with the same electrical current flow, which in turn allows faster operation. This benefit is not limited to just this embodiment and structures with channels running vertically on the circuit board as in the fourteenth embodiment, but is also achieved even in structures in which the channels run parallel to the circuit board surface such as in FIGS. 31(a) and 31(b).

Figure 31A:
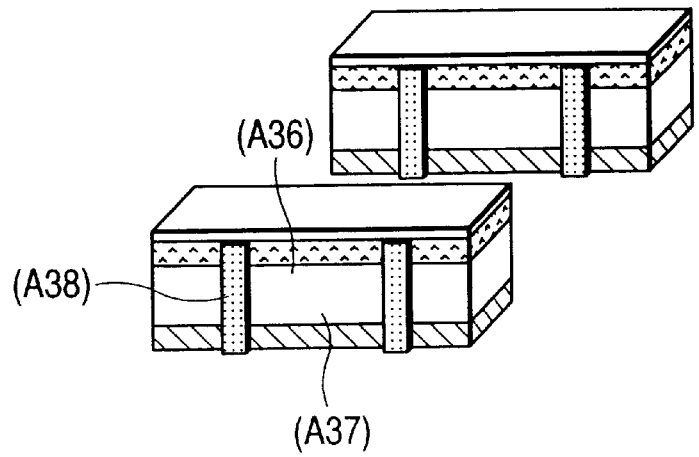
FIGS. 31(a) and 31(b) are structural views having a shape different from the semiconductor memory element constituting a structural element of the semiconductor device of the fifteenth embodiment of the present invention.
Figure 31B:
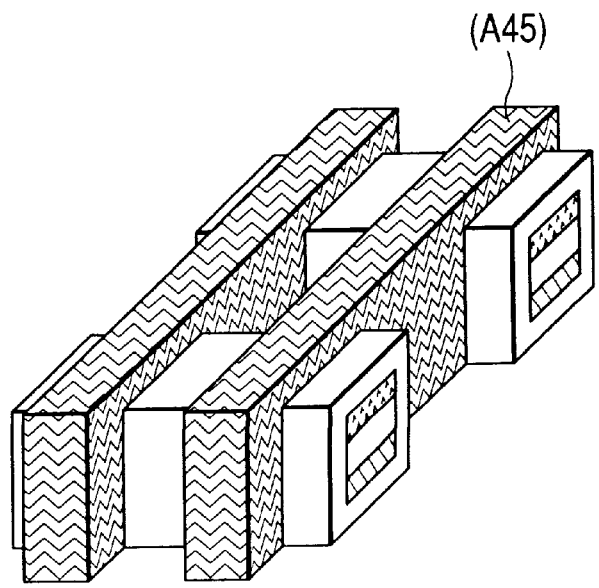

A basic example of cell array is shown in FIGS. 31(a) and 31(b). The upper view (FIG. 31(a)) of the six cell array structure is the state after channel forming. the state after forming the word lines is shown in FIG. 31(b). The structure has a local data line (1) A39 and a local data line (20 A41 with a common source line A40. The electrical potential of the channel is controlled by the word line A43. If a basic machining dimension for a cell structure is set as F, then the size of this structure is 6F2 and characterized in that fabrication is simple compared to cubic structures such as the example of this embodiment. The explanation now returns to FIG. 32. The contact holes comprise the contact hole A46 for connecting to the source line A36, the contact hole A47 for connecting to the MOS gate electrode, and the contact hole A48 for connecting the MOS diffusion layer to the global data line. This embodiment is characterized in that all contact holes can be made in the same process and that the number of manufacturing steps is kept small compared to the fourteenth embodiment.

Hereafter, working examples are related for performing the write, erase, write-verify, erase-verify, refresh and multi-value storage of the cell arrays for the sixteenth through the twenty-second embodiments.

Figure 33:
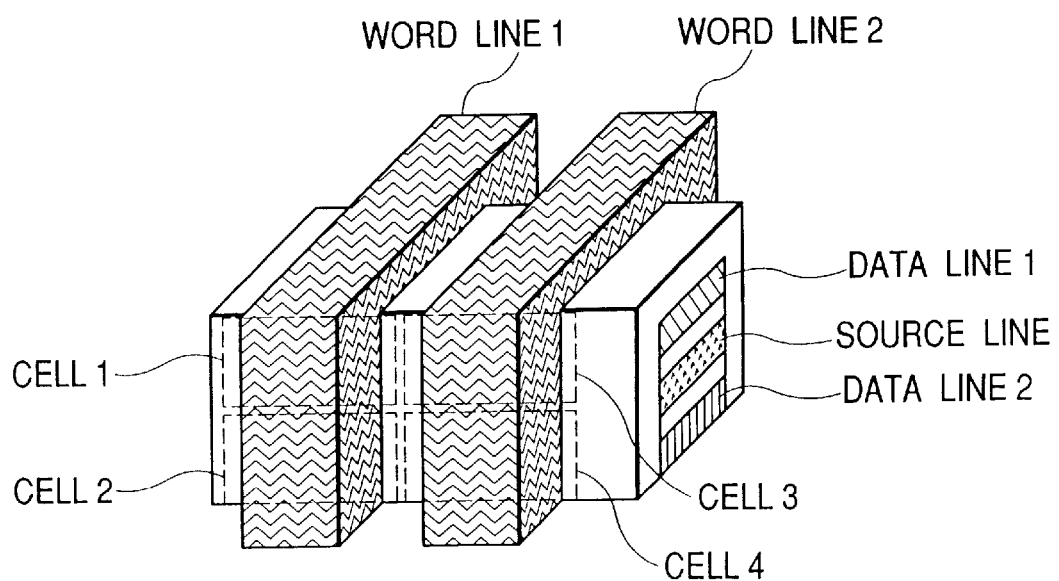
FIG. 33 is an upper oblique view showing the cell array utilized in describing the sixteenth embodiment through the twenty-second embodiments.

A typical array is shown in FIG. 33 and this array is utilized in the description. Of course, the memory cell structures shown up to now may also be utilized.

Sixteenth Embodiment

The operating sequence for read out, write and erase operations are shown in FIG. 34. Readout conditions are read out of information from cell 1, cell 2. Erase conditions are erasure of information from cell 1, cell 2. Write conditions are writing information "1" in cell 1 and writing information "0" in cell 2. In the readout operation, precharge is first performed (Step 1) and next the specified readout voltage is applied to the source, data lines and word lines (Step 2). Readout is performed with the flow of current sending information held in cell 1 along data line 1, and the flow of current sending information held in cell 2 along data line 2. The electrical current on word line 1 when a "0" is being held is sufficiently larger than current flowing when a "1" is being held, so that the two states are easily be set to be distinguished from each other.

By making a setting smaller than the threshold voltage, when holding the information "0" on word line 2, almost no current flows in cell 3 and cell 4, regardless of the information being held. Even when a large number of cells are arrayed the process is the same; a readout voltage is applied only to the word line controlling the cell for readout, and a low voltage potential is set on other word lines connected to the same data line. The erase operation is described next. Erase operation is performed collectively for cell 1 and cell 2. An information section is required as a list corresponding to cells which must be erased, in order to perform a verify operation for each erased bit. First, a write voltage is applied prior to the application of an erase voltage (Step 1).

Performing this step prevents application of an erase voltage to cells in which write operation was not performed after erase operations prior to the current erase operation and also helps suppress unwanted fluctuations in device characteristics. Next, a voltage is set on the data line corresponding to the cell list (Step 2).

The voltage potential (for instance 5 volts) applied to the data line connected to a cell whose erasure is incomplete, is set higher than the voltage potential (for instance 0 volts) applied to a data line whose cell erasure is complete. In order to check the status of a cell after a low voltage (for instance −10 volts) was applied (Step 3) to the word line for erasure, a specified voltage (for instance 0.5 volts) is applied to the word line and the change in voltage potential on the word line is sensed (Step 4, Step 5).

As a result, if the cell threshold value has become lower than a specified value, then that cell is deleted from the above mentioned list (list of cells targeted for erasure). Afterwards, the erase operation is ended when the list is blank but if cells still remain on the list, then the operation again returns to Step 2. Here, in Step 2, the voltage applied to cells deleted from the target erasure list is low (0 volts), and the difference in voltage potential (in this case, 10 volts) versus the word line is small so that unneeded erasure is not performed. This operation loop is repeated on cells requiring erasure until a threshold voltage has been achieved that is lower than a specified value.

Write operation is a process to write information constituted by a "0" or a "1" into cell 1 and cell 2. In the write operation, a voltage is set on the data line with a corresponding cell on the list targeted for writing of a "1" (Step 1).

The voltage potential (for instance 0 volts) applied to data lines for cells show writing of "1" is not complete, is set lower than the voltage applied to data lines for cells where writing of "1" or "0" is complete; and a large difference of voltage potential versus the word line is set. Next, in order to check the cell status after application (Step 2) of a high voltage (for instance 15 volts) for writing on a word line, a specified voltage (for instance 2.5 volts) is applied to the word line and the change in voltage potential is sensed (Step 3, Step 4).

As a result, the cell is deleted from the above list of cells targeted for writing, if the voltage sensed is higher than a specified threshold voltage. Afterwards, the write operation is ended if the list is empty but the operation returns to Step 2 if cells still remain in the list. In Step 2, the voltage (in this case 5 volts) applied to the data line is high for cells that were deleted from the list, and since the difference in voltage potential versus the word line (in this case 10 volts) is small, excessive changes in threshold values can be avoided. In this case, a target list of cells for writing "1" was used however, a list of cells where writing of "1" is complete or cells for writing of "0" can also be composed; the lists can be added to while performing write-verify operation and the write operation can also be completed at the point where all cells have been added to the list. The same arrangement can also be utilized for contents of the list for erase operations. Hereafter, the above definitions will also apply for the sake of simplicity.

In this embodiment, polycrystalline silicon was utilized in the data lines, the source lines, the word lines and the channels however use of this same material is not required and other semiconductor materials may be utilized, metal may also be utilized. Also an SOI substrate may be used and bulk silicon utilized in the data lines, source lines and channels. Resistance decreases when bulk silicon is used, allowing memory operation at higher speed. Non-doped polycrystalline silicon was utilized for the channels however polycrystalline silicon with impurities may also be used. Further, in this embodiment, the polycrystalline silicon thin layer (1) for the channels functioned as both an electrical path and a means for storing electrical charges to perform information storage, however the low resistance region in the thin layer may just be given the function of an electrical path and the accumulation of charges for storing information may be performed elsewhere. In this case, semiconductor material may be utilized as the material for accumulating the electrical charges and metal may also be used. Also in this case, just as explained previously for the element operating principle, the section for storing the electrical charges is basically a small structure enclosed by a high potential area. This structure is characterized by allowing use of different sizes and materials since the electrical path and the electrical charge storage section are designed separately.

Seventeenth Embodiment

Figure 36:
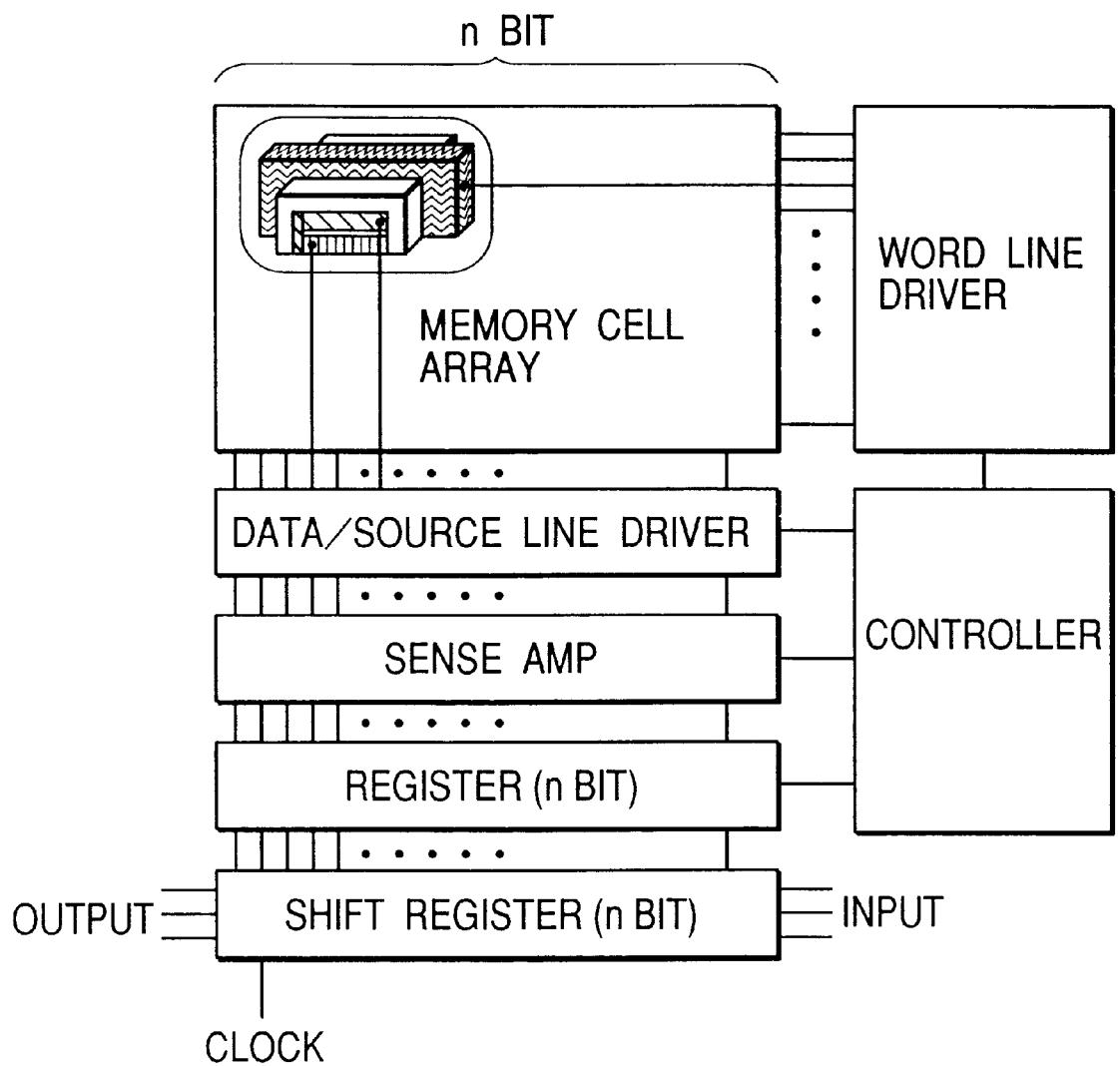
FIG. 36 is a block diagram of the semiconductor device of the seventeenth embodiment of the present invention.

The seventeenth embodiment of the present invention is shown in FIG. 35 and FIG. 36.

An example utilizing the register for the cell list illustrated in FIG. 34 for the sixteenth embodiment is shown in FIG. 35 and FIG. 36. The operating sequences are shown in FIG. 35. The structure of the memory device is shown in FIG. 36. The number of input/output lines can be reduced by carrying out external data exchanges in sequence utilizing a shift register. The operating principle of the memory cell structure is the same as the sixteenth embodiment. Each bit of the register corresponds to a data line. In this embodiment, cell 1 (and cell 3) correspond to the first bit of the register and cell 2 (and cell 4) correspond to the next bit of the register. In erase operation, incomplete erase operation is status 1, and completed erase operation status is 0. In other words, in cell 1 or cell 2 erase operation the {1, 0} of the register indicates that erase of cell 2 is complete or that erase of cell 2 is not complete. Afterwards, when returning to step 2, when the register bit matching the data line is 1, then an electrical potential for erase (for instance 5 volts) is applied to the data line. However when the register bit electrical potential is 0 (for instance 0 volts) then the erase verify loop ends when the register bits are all zero (0).

In write operation, when loading data in Step 1, the inverse bit information is shown for write information connected to the data line corresponding to each bit value of the register. In other words, the fact that the register is {0, 1} in Step 1 shows that information "1" is written in cell 1 and "0" is written in cell 2. Afterwards, from Step 2 onwards, when writing of information "1" in the cell is complete, a 0 is input in the corresponding register bit. When the corresponding register bit is 1 in Step 1, then an electrical potential (for instance 0 volts) is applied to the data line as the erase condition, and when the bit is 0, a high electrical potential (for instance 5 volts) is applied to the data line. When each bit of the register is 0, the write-verify loop ends.

Eighteenth Embodiment

The eighteenth embodiment of the present invention is shown in FIG. 37.

In this embodiment, erase-verify is not performed for each bit, and the erase loop is determined to be complete when the threshold value for all cells targeted for erasure is smaller than a specified threshold value. In this method, in the erasure method of step 2, an erase voltage is applied to all the selected cells. Control of each bit is not necessary in this method which is therefore characterized in having simple operation. Stabilization is required with respect to surplus erase voltage application so that erasure is not excessive. In terms of cell characteristics, erasure is defined in terms of electron injection, and the method for determining the end of the erasure loop when all of the cells targeted for erasure is larger than the threshold voltage may be used. In this method, the cells where the threshold value has risen have been erased so that when the erase loop has been repeated, electrical current flow ceases in almost all cells and the current consumption during erase operation can therefore be reduced.

Nineteenth Embodiment

Figure 38:
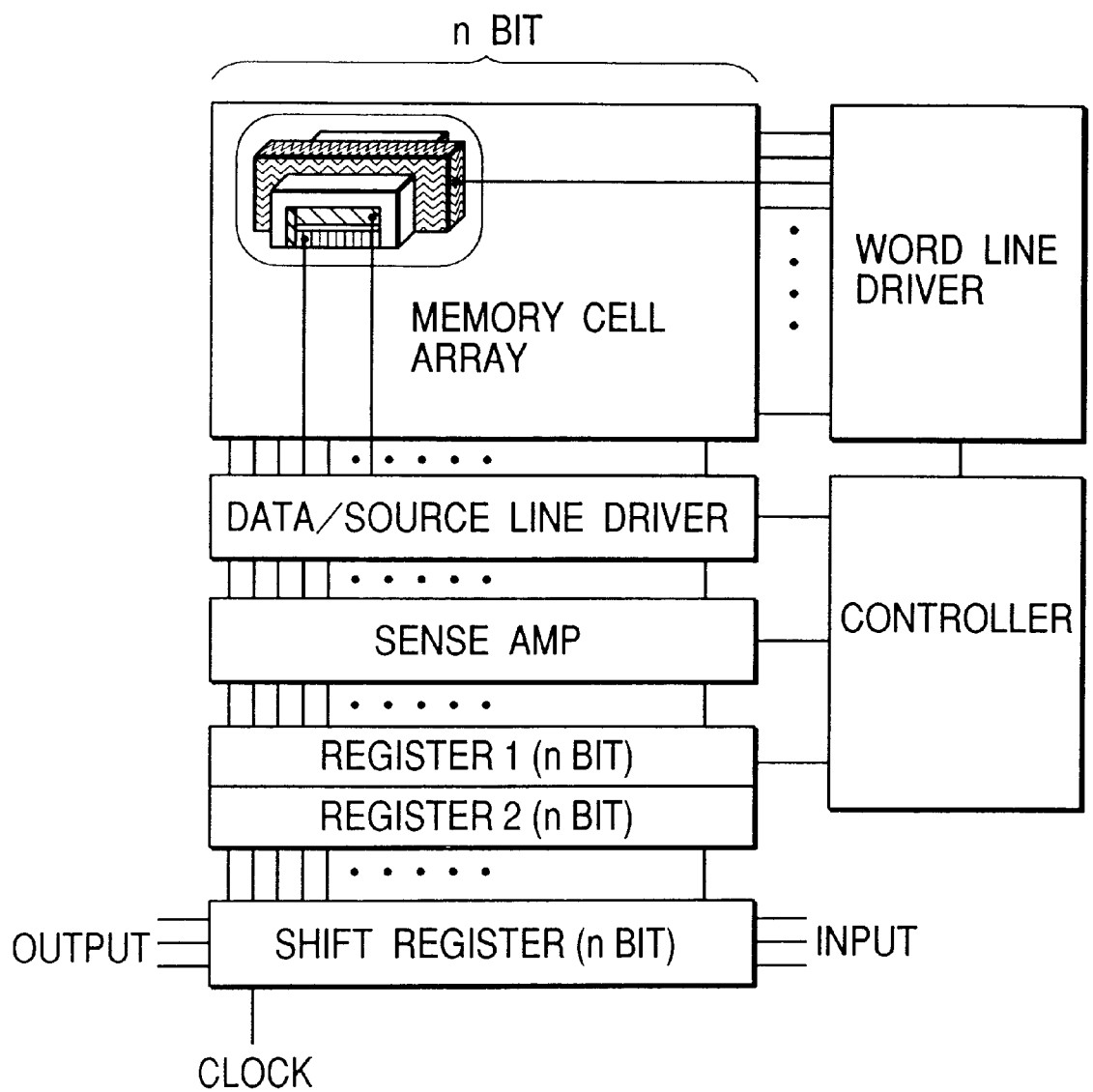
FIG. 38 is a block diagram of the semiconductor device of the nineteenth embodiment of the present invention.

The nineteenth embodiment of the present invention is shown in FIG. 38 and FIG. 39.

The memory cell structure is the same as in the seventeenth embodiment. Besides performing verifies for write and erase operations, this embodiment is also characterized in performing refresh operation during the holding of information. As related in the first embodiment, phenomenon such as thermal excitation and tunnel effect are likely to occur during write operation since the number of electrons being stored is small. The same situation is applicable to when holding information, and is a cause of instability during holding of information. However, a method to stabilize the holding of information by thickening (or enlarging the width of the potential barrier) the insulation film between the section supplying the stored electrical charges and the section where the electrical charges are stored is not desirable since the write time simultaneously becomes longer also. The memory of the present invention is characterized in being capable of high speed write and erasure compare to flash memories however, utilizing the refresh operation during information holding allows both high speed write and erase along with stable holding of information. Further, a DRAM is widely used as a volatile memory with high integration yet the memory cell of the present invention can comprise one cell in the space of one transistor and the structure of the memory cell is simple so that a highly integrated memory can be obtained.

A structural view of the memory device of this embodiment is shown in FIG. 38. This embodiment, unlike the seventeenth embodiment is characterized in utilizing two type of registers. The sequence for the refresh operation is shown in FIG. 39. Just as with the sixteenth embodiment, four adjoining cells are used. The readout, erase and write operation sequence is performed in the order for the seventeenth embodiment, and operation contents are repeated while selecting the word lines in sequence. The data of the word lines is read out and the contents stored in the register 1. Here, each bit of information in register 1 is inverted information of the memory cell. Next, the erase operation described in the seventeenth embodiment is performed. In the erase operation, the data that was read out as is from the register 2 is lost so that preparing a register 2 is necessary. The register 1 data is once again written into the memory cell. The series of operation is carried out in sequence while moving among the word lines. Information is thus stably held in the memory since the memory refresh operation is carried out in a period sufficiently shorter than the average time elapsed time in which memory can be lost. The register 1 or register 2 is utilized for verifying write and erase operations. Here, after first temporarily storing the information of the register 1 into the register 2, the erase operation may be utilized on the contents of the register 1. In this case, after erase operation is complete, the write operation is then performed after moving the register 2 information to the register 1. The write, erase and readout operations are the same as in the seventeenth embodiment. However, a change is also required in the readout operation when the potential barrier width or the potential barrier height between the electrical charge storage section and external sections has been made smaller in order to achieve faster write and erase operation. In such a case the stored (memory) information will be lost due to the readout operation so that the information that was readout must be rewritten. The operation sequence is the same as the refresh operation but differs in that the readout information is sent to an external location. This process is also the same for other embodiments performing refresh operations.

Twentieth Embodiment

Figure 40:
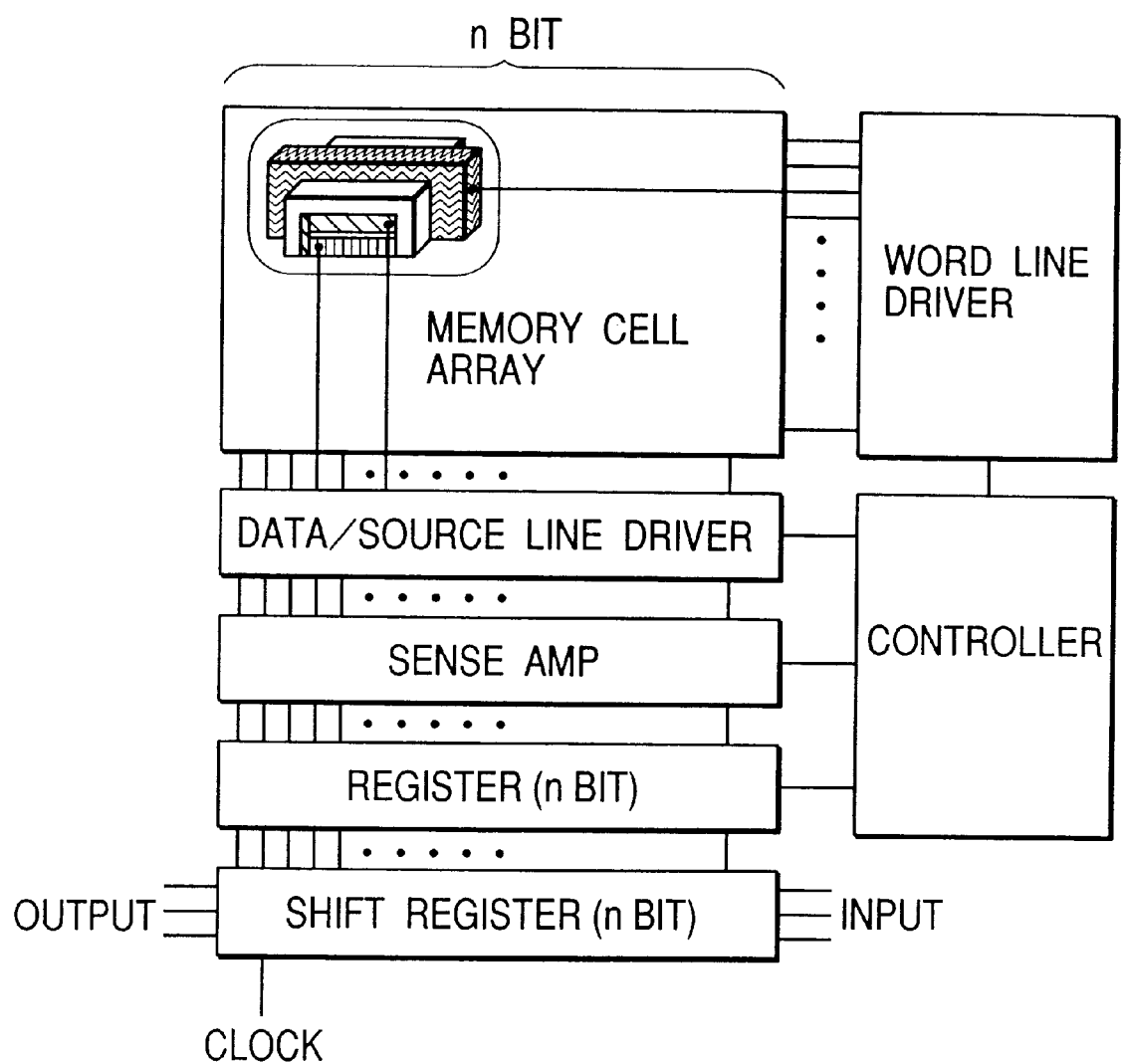
FIG. 40 is a block diagram of the semiconductor device of the twentieth embodiment of the present invention.

The twentieth embodiment of the present invention is shown in FIG. 40 and FIG. 41. A block diagram of the memory is shown in FIG. 40. The refresh operation sequence is shown in FIG. 41.

This embodiment differs from the nineteenth embodiment in that, erase-verify is not performed for each bit and the erase loop is determined to have ended when all cells targeted for erasure have a value lower than the specified threshold voltage. In all other points the operation is the same as for the nineteenth embodiment and is characterized in that there is no need to provide a register on each data line during erase operation since erase-verify is not performed for each bit, and that the second register is unnecessary.

Twenty-first Embodiment

Figure 42:
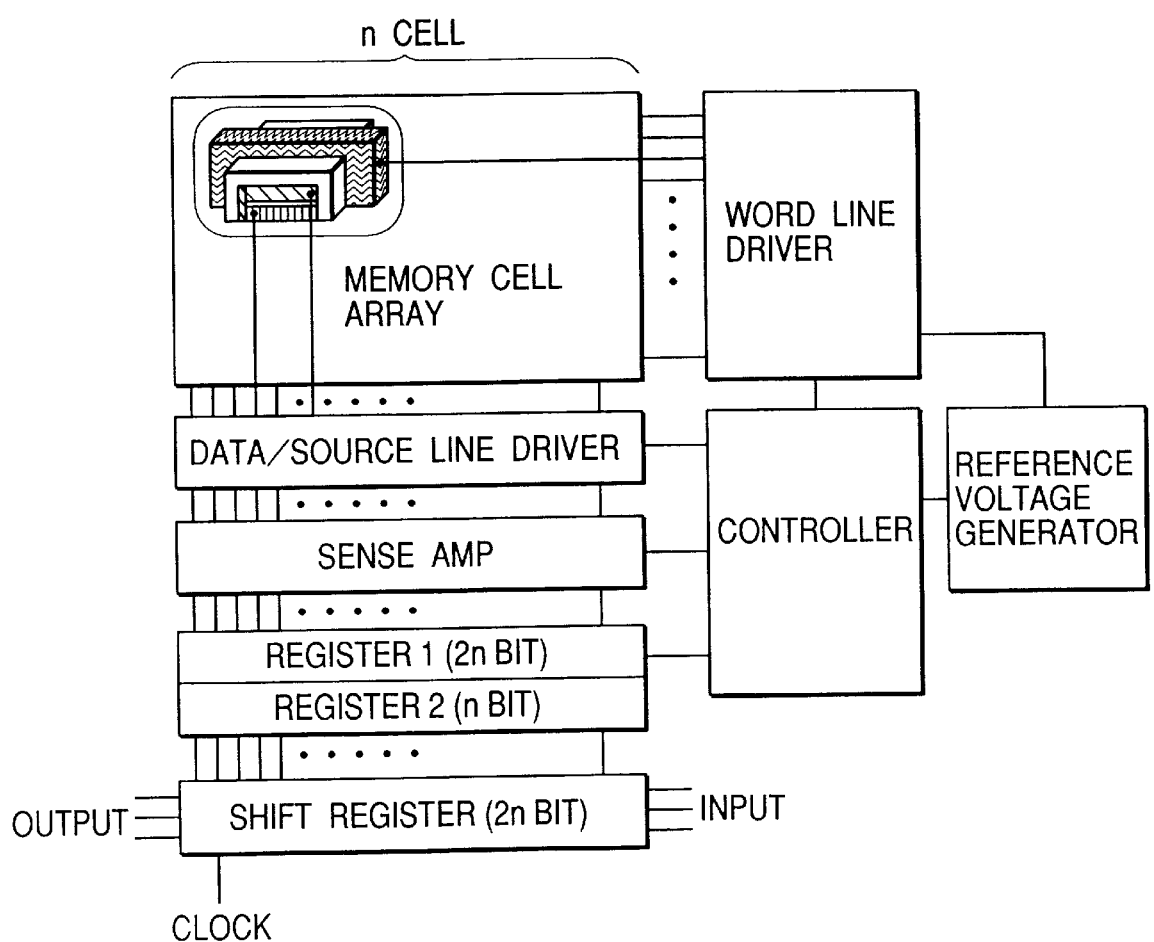
FIG. 42 is a block diagram of the semiconductor device of the twenty-first embodiment of the present invention.

A block diagram of the twenty-first embodiment of the present invention is shown in FIG. 42.

A characteristic of this embodiment is that information larger than one bit is stored in one cell (multi-value storage). The memory cell structure is the same as for the sixteenth embodiment.

Figure 43:
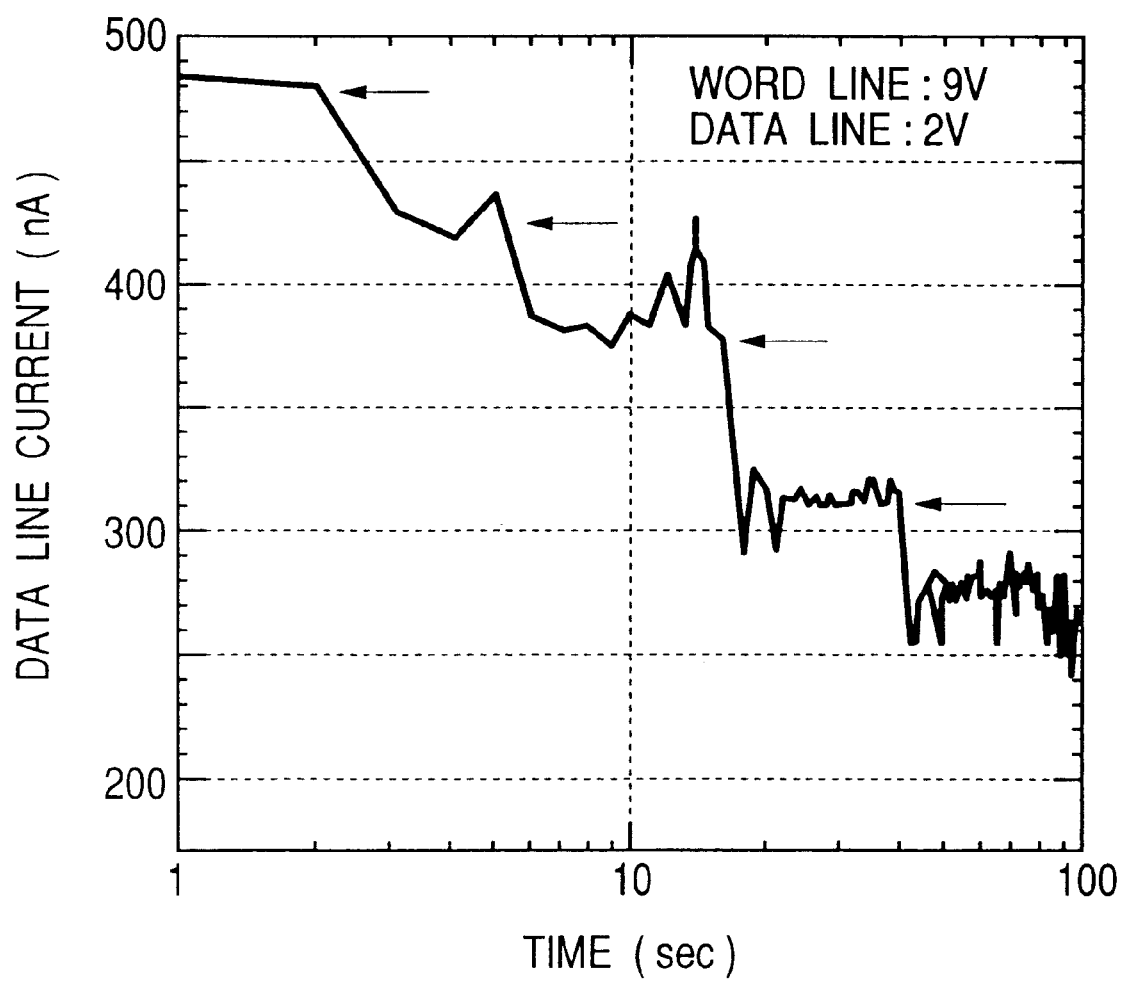
FIG. 43 is a graph showing changes occurring over time in the data line current of the memory cell of the twenty-first embodiment of the present invention.

Experiment results for cell unit characteristics are shown in FIG. 43. The figure shows changes in electrical current flow in a data line over elapsed time with the source line set at 0 volts, the data line at 2 volts and the word line at 9 volts. The electrical potential on the word line was not increased much, and the electron injection was slowed making observation of changes in current over time easier. As can be seen in the figure, when the electrons are accumulated one at a time in the memory storage area, a scattering or dispersion type shift occurs in the threshold voltage so that the electrical current changes in steps. Each of these dispersed threshold values is made to correspond to the information, making multi-value storage possible. For instance, a state where one electron is accumulated is shown by information "0, 0", while a two electron accumulation is shown by the information "0, 1", a three electron accumulation is shown by the information "1, 0" and four electrons by "1, 1" so that two bits of storage is possible. This embodiment is characterized by easy identification of status compared to performing multi-value storage to categorize consecutive characteristics. The structure of the memory device is the same as the nineteenth embodiment but differs in that the registers corresponding to each word line have a plurality of bits and also differs in the voltage and time settings for write operation and the readout operation. In this embodiment, one electron corresponds to one piece of information but as repeatedly mentioned, certain phenomenon are likely to occur at electron injection and discharge in the device characteristics, causing wide deviations or irregularities in memory holding, write and erase characteristics. Performing the refresh operation is effective in memory holding and verify operations for write and erase in order to achieve stable memory storage. Respective writing of multi-value information is performed by varying the write time (write pulse width or sum of the write pulse width). A proportional value is used for this write time. As related in the sixteenth embodiment, the memory storage area is small so that the injection of one electron has an effect on the probability of the next electron being injected, but this effect is due to dependence on an exponential function with respect to the number of electrons that are injected. This selective writing of information may also be accomplished by utilizing the plurality of values for write voltages rather than just the writing time. This writing voltage utilizes a proportional value since there is an equal probability that the next electron will be injected upon using electron injection to apply a write voltage from an external source in order to cancel out only the change in potential in the memory storage area. Needless to say, these various methods can be combined such as by using varying voltages and varying times. The readout operation however requires a reference voltage generator since a plurality of states must be read out. Multi-value memory storage also requires a holding means or technique to hold multiple values of information in order to perform verify operations or refresh operations of multi-value information.

Stable memory storage is achieved by setting a plurality of accumulated electrons (for instance making five electrons match information) to correspond to information rather than utilizing just one electron. The memory structure and operation sequence are the same. In order to use more electrons for memory storage, this embodiment is characterized in having a small effect on probability of phenomenon occurrence compared to the method of storage of one electron and more stable memory storage is thus achieved. Consequently other characteristics are that the refresh operation cycle can be lengthened and lower current consumption achieved.

Twenty-second Embodiment

The refresh operation of the twenty-second embodiment of the present invention is shown in FIG. 44.

This embodiment is characterized in that refresh operation is performed during memory holding but verify of write-erase is not performed. The same memory cell structure as in the twenty-second embodiment is utilized but the silicon crystal particles of the memory storage area have a size of approximately 4 nm. In an example using the write operation, and noting one crystal particle, when one electron is injected, the probability of a second crystal being injected decreases drastically. Restated, the time required for the second electron to be injected is very long compared to the time for injection of the first electron. Therefore, a write voltage has to be applied for a sufficient time longer than the average time for injection of one electron by incorporating some likely shift and furthermore this setting has to be for a time sufficiently shorter than the average time needed for two electrons to be input. Consequently, this embodiment achieves stable memory (storage) operation without a verify operation when storing one bit per cell or in multi-value storage of a plurality of bits in one cell.

Hereafter, are described specific examples of peripheral circuits with a small surface area, handling small electrical charges, having little noise and ideal for use with single-electron memories susceptible to noise, as well as a manufacturing process for these peripheral circuits and yet with no loss of desired characteristics in small surface area, high integrated memory cells as related previously for the twenty-third through the twenty-fifth embodiments.

Figure 45:
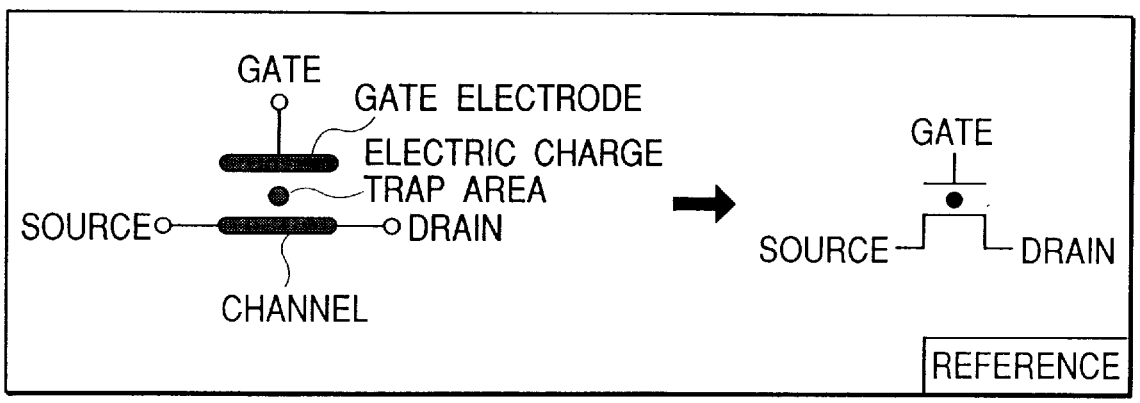
FIG. 45 is a drawing defining the symbols of a memory cell having a floating gate.

A definition of the reference symbols is shown in FIG. 45. In the subsequent explanations, the electric charge trap area is shown with the black dot as listed in the semiconductor memory element for this invention in FIG. 45 in order to distinguish it from an ordinary FET.

Twenty-third Embodiment

The configuration of the circuit for readout, erase and write in the semiconductor memory device of the twenty-third embodiment is shown by utilizing FIG. 46 through FIG. 49.

Figure 46:
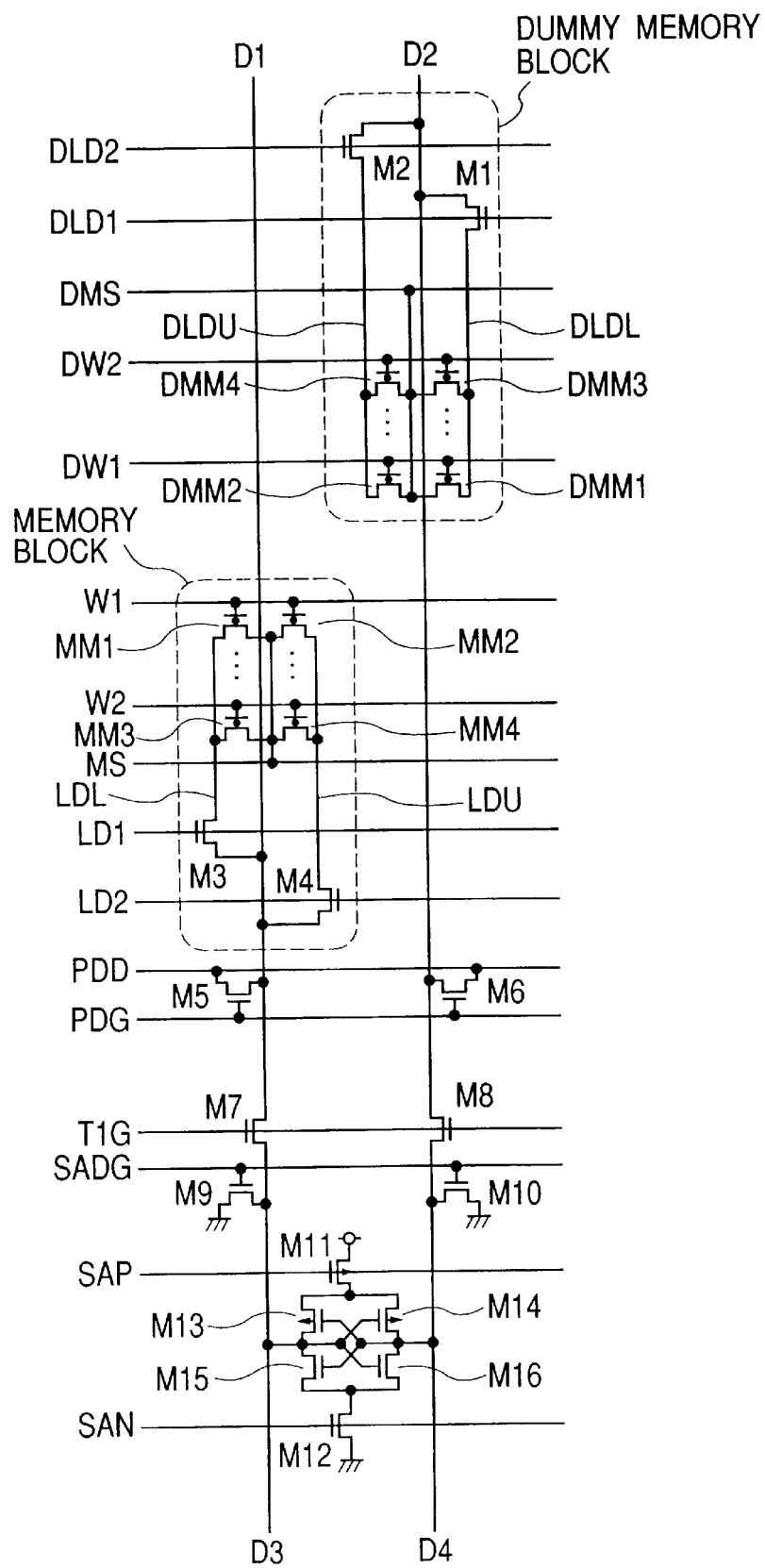
FIG. 46 is a drawing showing a circuit in the twenty-third embodiment of the present invention in which readout and write are performed in the memory cell array by time multiplexing.

A circuit diagram of this embodiment is shown in FIG. 47. FIG. 46 only shows one pair of data lines for purposes of simplification but in the actual semiconductor memory device, many lines are arrayed horizontally the same as shown here. In FIG. 46, the memory cells MM1, MM2, MM3, MM4 are a memory cell arrayed (stacked) in upper and lower layers. The MOS M3 and MOS M4 are selection MOS for the local data lines. The MM1, MM3 are lower layer memory cells and are connected by a local data line LDL in the lower layer. The MM2, MM4 are upper layer memory cells and are connected by a local data line LDU in the upper layer. The source line is common to both upper and lower cells. The LDL is connected to the local data line D1 by way of M3. The LDU is connected to the local data line D1 by way of M4. Hereafter, the set comprised of a memory cell array and the local data line selection MOS is referred to as a block. A global data line D2 corresponding to D1 is also present. On this data cell line D2 is the dummy cell block comprised of a dummy memory cell arrays DMM1, DMM2, DMM3, DMM4 and the local data line select MOS M1 and M2 which is connected in the same way as the memory cell block.

Figure 48:
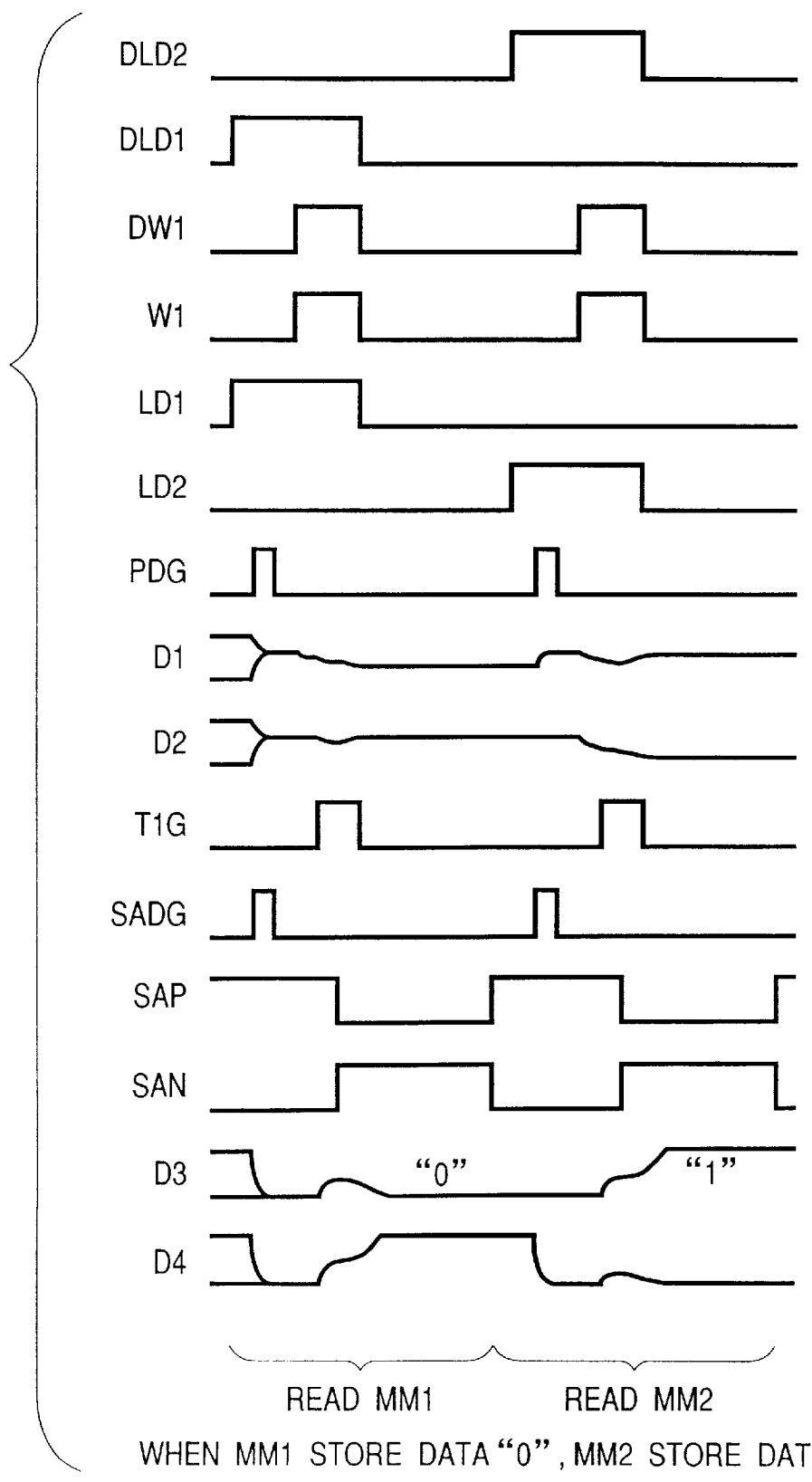
FIG. 48 is a drawing showing the readout-timing chart for the twenty-third embodiment of the present invention.
Figure 49:
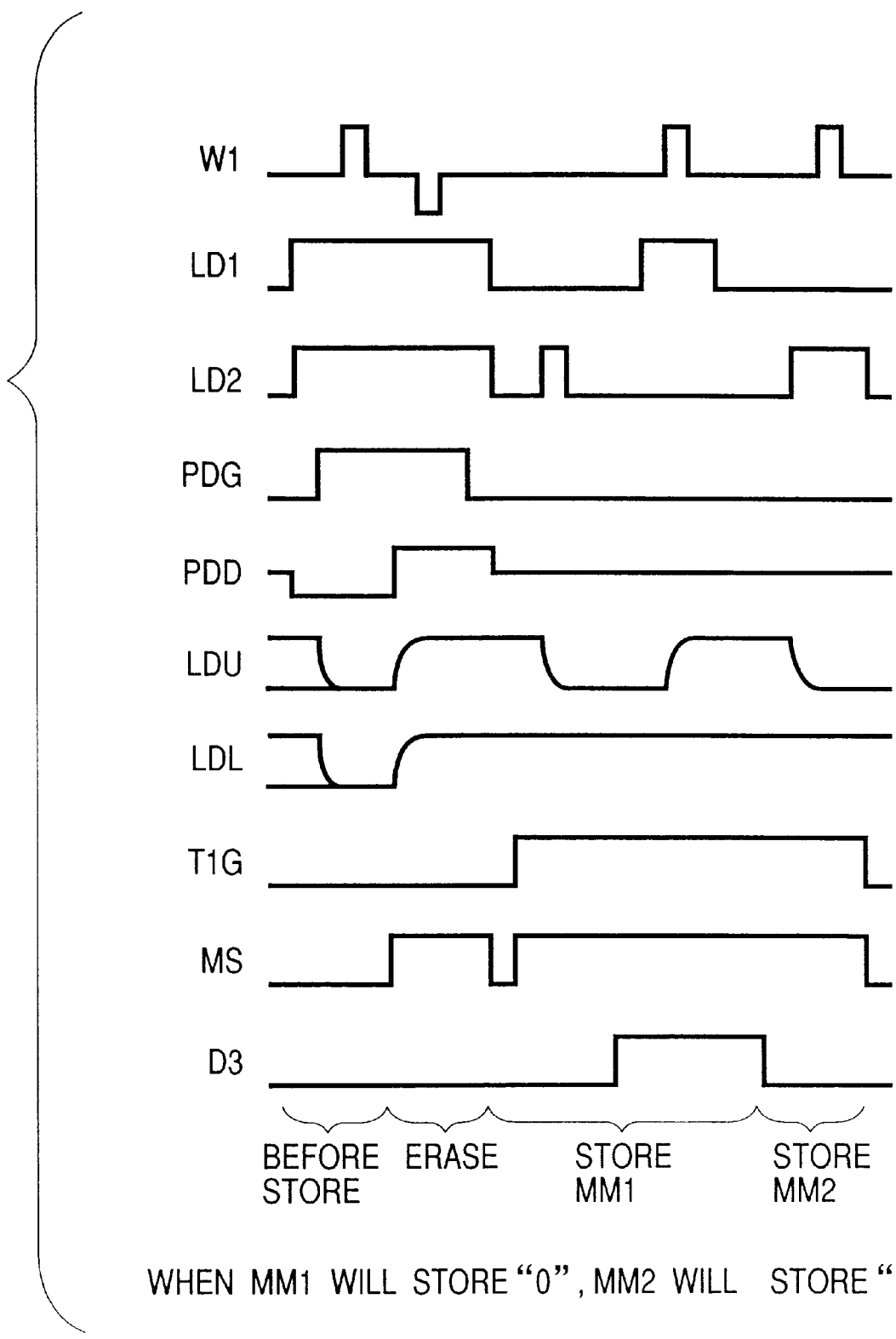
FIG. 49 is a timing chart for erase and write operations in the twenty-third embodiment of the present invention.

Timing diagrams of circuit operation are shown in FIG. 48 and FIG. 49. A pre/discharge MOS M5 and M6 are connected in order to discharge these circuits on the global data lines D1, D2. Further, these global data lines D1, D2 are connected by way of the transfer MOS M7 and M8, to sensing amplifiers (differential amplifier) comprised of M13, M14, M15, M16.

Power supplies MOS M11, M12 are connected in order to actuated the sensing amplifiers as needed. A sensing amplifier discharge MOS M9, M10 are provided on both the input/output lines D3, D4 in order to discharge these sensor amplifiers.

The readout, erase and write operation of this embodiment is described next. This embodiment is characterized in that read and write are performed by switching the upper and lower memory cells. Also, in the following description, a high memory cell threshold voltage is shown with a "1" while a low threshold voltage is shown with a "0". Further, a high logic level is shown with a "1" while a low level is shown with a "0". The logic levels and threshold voltages can of course be inverted if desired.

Before explaining the specific circuit operation in FIG. 47, an example of voltages applied to the memory cell during write and erase is described.

In readout operation, precharging (for instance 2.5 volts) is performed on the memory cell for readout (in this case MM1) and the local data line of the corresponding dummy cell (in this case DMM1), a readout voltage (for instance 2.5 volts) is applied to the word line (W1) and the dummy line (DW1) to turn on MM1, MM2 and discharging of the local data line (LDL) and dummy local data line (DLDL) then performed. The dummy memory cell DMM1 is set beforehand to a value between a threshold voltage of "1" and "0". So when the data of the MM1 is "0", the voltage on the LDL drops quickly and when "1" the DLDL voltage drops quickly and a high voltage is maintained on the LDL.

In erase operation, the upper and lower data lines LDL, LDU and the source line S are set to a high level (for example 5 volts), an erase voltage is applied to the word line W1 (for instance –10 volts), and lowering of all the memory cell threshold voltages then performed.

In write operation, the source line (S) is set to a high level (for instance 5 volts), the local data line LDL of the memory cell (in this case MM1) targeted for writing a "1" is set to 0 volts, while memory cells (in this case MM2) targeted for being written with a "0" are applied with a high voltage (for instance 5 volts) on the local data line LDU; and a write voltage (for instance 15 volts) is applied to the word line W1. The threshold voltage rises since 15 volts is applied across the word lines and data lines of MM1. This process is referred to as "1" writing. Only 10 volts is applied across the data lines, word lines and across source lines and word lines in MM2 so that a rise in the threshold voltage is suppressed. This process is referred to as "0" writing.

The above description, is one example of voltage values. Essentially, during write, the threshold voltage rises in a sufficiently short time and to a non-destructive level versus the write voltage application; during erase, the threshold voltage lowers in a sufficiently short time and to a non-destructive level versus the erase voltage application.

The voltage for the source line and local data line of the memory cell for writing a "0", holds the rise in threshold voltage to as high a level as possible versus the writing of "1" in the memory cell, during readout the word line voltage and local data line voltage hold the rise in unnecessary threshold voltage to as low a level as possible.

A detailed description of the readout operation is next related by utilizing the memory cells MM1, MM2, and the dummy cells DMM1, DMM2. Here, a "0" is written into the lower memory cell MM1 and a "1" is written into the higher memory cell MM2.

A timing chart for readout operation is shown in FIG. 48. First, the LD1, DLD1 are set to a high level, the local data line select MOS M3, the dummy local data line select MOS (M1) are turned on, and the local data line LDL and global data line D1, and the dummy local data line DLDL and the global data line D2 are connected. Next, the PDG is set to a high level, the precharge MOS M5, M6 are turned on and precharge of LDL, DLDL, D1 and D2 are performed. The SADG is set to a high level, the sensing amp discharger MOS M9, M10 are turned on and the voltage at both terminals D3, D4 of the sensing amplifier drops to ground potential. The word line W1 and the dummy word line DW1 next turn on and the data line starts to discharge. In this case, a "0" is written in the memory cell MM1 "0" so the threshold level is lower than the dummy memory cell DMM1, and the voltage drops faster on D1 than D2 so that discharge can be quickly performed. Next, the T1G is set to high level, the transfer MOS M7, M8 are turned on, and the global data line D1, D2 voltage is sent to the sensing amplifier. The SAP is then set to low level, the SAN is set to high level, the sensing amplifier activated MOS transistors M11, M12 are turned on, the sensing amplifier activated and the difference in voltage on the two input/output lines D3, D4 amplified up to the power supply voltage. This process allows the data of the lower memory cell MM1 to be read out, and the upper memory cell MM2 to be read out in the same way. At this time however, the M2, M4 (signal lines are LD2, DLD2) are utilized as the local data line select MOS. The word line W1 and the dummy word line DW1 are turned on, and when discharge of the data line begins, this time the threshold voltage for MM2 is higher than the DMM4 threshold voltage so that D1 discharges more slowly than D2 and a high voltage is maintained.

Next, the erase operation is explained. Prior to erasure, writing is performed at once for all cells. This writing is necessary in order to prevent excessive erasure of cells (threshold value does not rise) continuously written with "0". The LD1 and LD2 are set to a high level, the local data line select MOS M1, M2 are turned on, and the upper and lower local data line LDL, LDU are connected to the global data line D1. The PDD is set to a low voltage and the PDG is set to a high voltage, the data line pre/discharge MOS MS, M6 are turned on. A write voltage is applied to the word line W1 at the point where the LDL, LDU voltage reaches a high level. The PDD is set to a high voltage with the M1, M2, MS still turned on. An erase voltage is applied to the word line W1 at the point where the voltage of the upper and lower data lines LDL and LDU has set to high level. This process can simultaneously erase the upper and lower cells.

The write operation is explained next. An explanation is given for the occasion when the lower memory cell MM1 is written with a "0" and the upper memory MM2 is written with a "1". During write, the upper and lower data lines must be set to separate voltages. However, during write the memory cell is definitely on so that the voltage applied to the local data line must be static (unchanging). Consequently the writing of the upper and lower cells must be carried out separately. However, in order not to apply adverse effects to a cell while writing on the other cell, a dynamic voltage is applied to the local data line. The input/output line D3 of the sensing amplifier is set to low level, the LD2 is set to high level, the local data line select MOS (M4) level is turned on and the upper local data line LDU is set to low level. Next, the LD2 is set to low level and the M4 is turned off so that a dynamic voltage can be applied. The D3 is next set to high level, the LD1 is set to high level, the local data line select MOS M3 turned on and the lower local data line LDL set to high level. Then, then a high write voltage is applied to the word line WI while the M3 is still turned on. This process allows a "0" to be written in MM1. In this case, the M2 is strongly set to on so that the LDU voltage increases and the writing of "1" in MM2 is insufficient.

Next, the LD1 is set to low level, and a voltage is dynamically applied to the LDL by turning M3 off. Next, the D3 is set to low level, the LD2 is set to high level, M4 turns on and the LDU sets to low level. A write voltage is then applied to W1. A "1" is written into the MM2 by the voltage. In this case, MM1 is turned on but the LDL voltage does not change and writing of "0" in the MM1 is performed.

This embodiment is characterized in that the local data lines for each of the vertically stacked memory cells is connected to one global data line by way of a selection MOS transistor, and are switched in order during write operation and read operation so that there is no need to increase the number of global data lines or sensing amplifiers even if the memory cells are stacked, and an increase in the surface area (or size) of the peripheral circuits can therefore be avoided.

The memory cell of this embodiment is two layers however three layers may also be provided. Further, the local data line may be arranged on a flat plane rather than a stacked shape. A combination can also be used in which a set of stacked local data lines are arranged on a flat plane.

Twenty-fourth Embodiment

Figure 50:
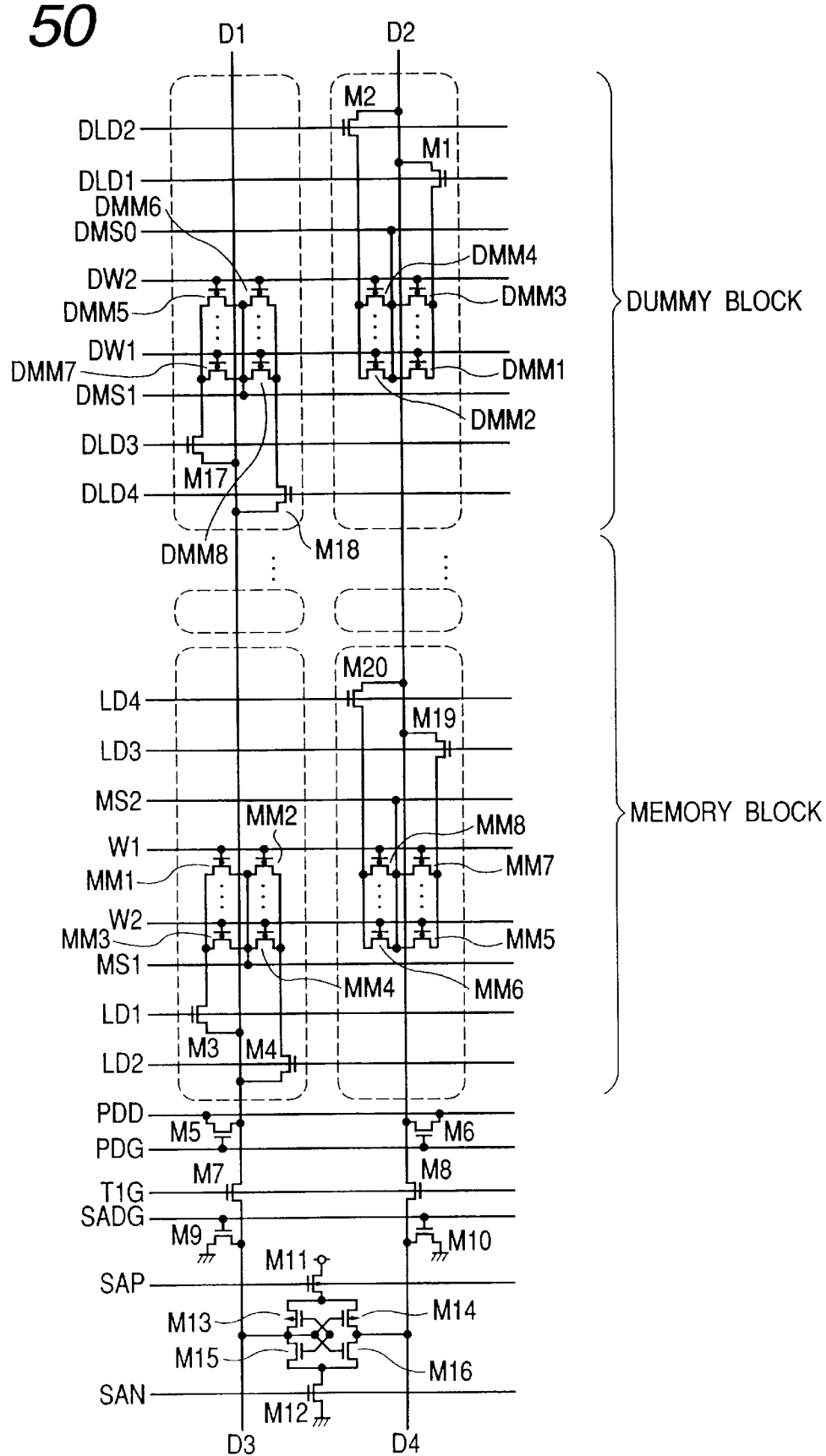
FIG. 50 is a drawing showing a circuit capable of placing a memory cell at all cross points of word lines and data lines for a folded data line structure in the twenty-fourth embodiment of the present invention.

The structure of the circuit for readout, write and erase circuits of the semiconductor memory device of the twenty-fourth embodiment is next explained utilizing FIG. 50. This embodiment differs from that in FIG. 46 in that memory cells are formed at all cross points of word lines and data lines.

Here, methods are known for positioning the sensing amplifier and data line relative to each other so that the matching data lines are placed in an open configuration on both side of the sensing amplifier, or in a folding configuration positioned in the same direction. The open configuration has the advantages that memory cells can be positioned at all cross points of the data lines and word lines and is highly integrated, however a disadvantage is that much noise is generated in the word lines. The folded configuration conversely, has the advantage that little noise is generated in driving the word lines yet also has the drawbacks that memory cells cannot be placed at all cross points of data lines and word lines. In this embodiment, memory cells are positioned at all cross points of the data lines and word lines in spite of the fact that a folded data line structure is utilized. When reading out the memory cell MM1, the memory cells MM7 and MM8 are also activated. However, the local data line selection MOS transistors M7 and M8 are off so that there are no adverse effects on the global data line D2. The memory cell is non-volatile with respect to readout so that there is also no change in data written in MM7 and MM8. Single-electron memories have the advantage of an extremely small structure yet the drawback of handling a small current flow causing vulnerability to noise. In the structure of this embodiment however, the data line structure is the folded line type which is not vulnerable to noise and the memory cell still retains the advantage of high integration.

In this embodiment, read out of all memory cells on the same word line is carried out in four steps. However, the write operation may be performed with two steps as in the twenty-third embodiment and erase performed in one step since the global data lines are separate.

This embodiment utilized a two-layer structure for memory cells however three or more layers may also be used. Also, the local data lines may be arranged on a flat plane without using a stacked configuration. A combination can be used in which a set of stacked local data lines are arranged on a flat plane. Also, use of just one local data line is sufficient. Basically, memory cells are formed at all intersections of corresponding global data lines and word lines.

Also the method of this embodiment was explained using a single-electron memory however if the read out of the memory cell is non-volatile, then other memories such as floating gate type memories or flash memories may be used.

Twenty-fifth Embodiment

Figure 51:
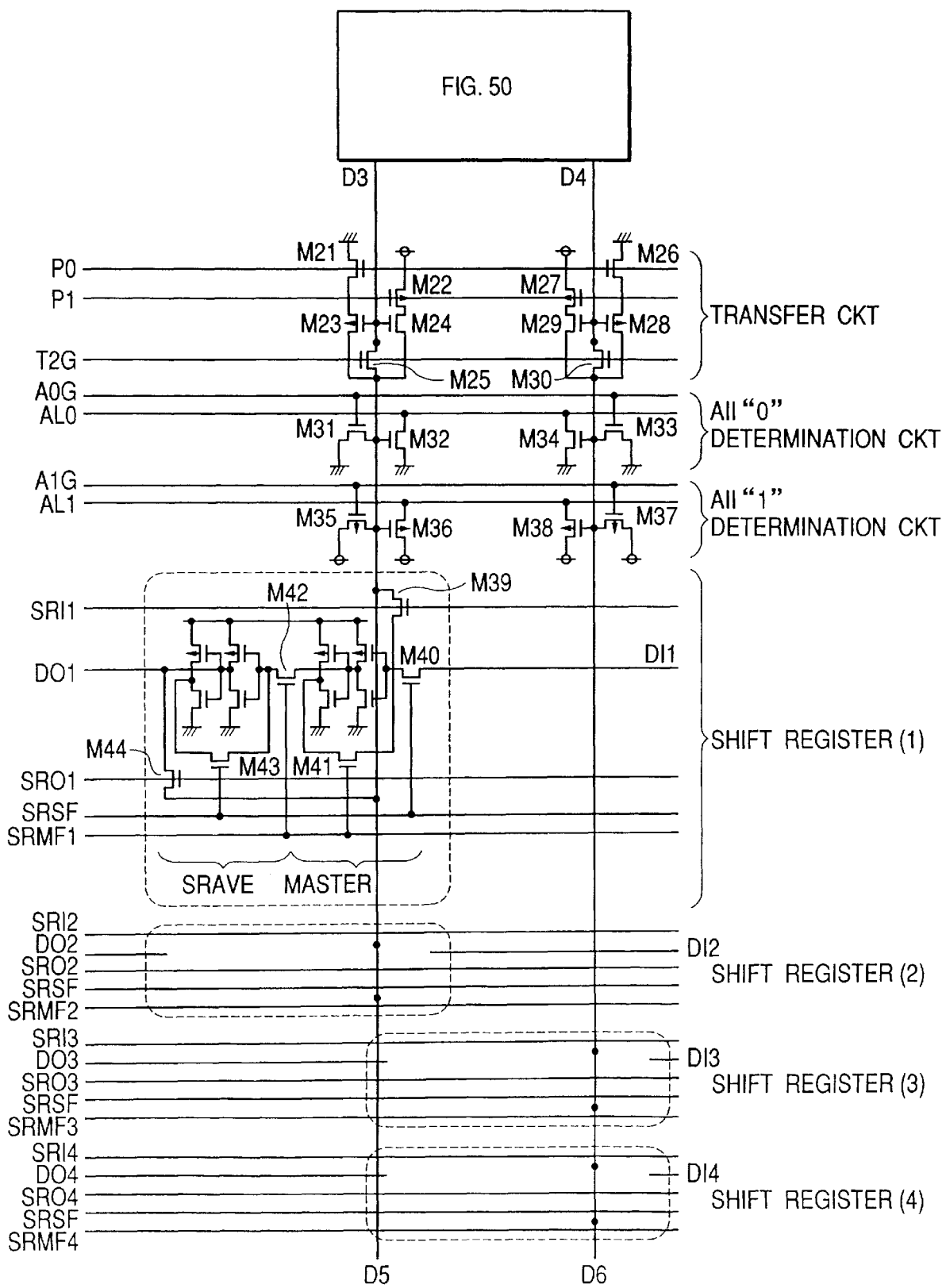
FIG. 51 is a drawing showing input/output circuits as well as verify circuits in the twenty-fifth embodiment of the present invention.

The structure of the input/output and verify circuit of the semiconductor memory device of the twenty-fifth embodiment are described using FIG. 51. The input/output and verify circuits are comprised of a transfer section to transfer data from the sensing amplifier to the shift register, an A11 "0" determination (discriminator) circuit to check whether or not the readout data is all "0", an A11 "1" determination (discriminator) circuit to check whether or not the readout data is all "1", and a shift register to temporarily accumulate data from the sensor amplifier, and then sequentially output this data externally. The shift register is used to input write data from an external source and send this data to the memory cells. The shift register is also used as a storage location for the write-end flag during the write-verify operation. There are a total of four shift registers corresponding to the upper and lower memory cells, with two shift registers provided on each global data line corresponding.

The circuits for the shift registers 2, 3 and 4 have been omitted in FIG. 51 and only the signal lines are shown. The structure shown in the twenty-fourth embodiment is utilized as the memory cell array however other structures may also be utilized.

Hereafter, a description is related in the order of readout, write, erase-verify and write-verify.

First, the readout operation is explained. When the data of the memory cell MM1 is read out using the procedure shown in the twenty-third and twenty-fourth embodiments, data appears on the input/output line D3 of the sensing amplifier. Next, the transfer circuit of PO is set to a high level, P1 is set to a low level and M21, M22 are turned on. If the data for D3 is "0" then M23 turns on and the "0" appears in the input/output line D5 of the shift register by way of the M21 and M23. If the data for D3 is "1", then M24 turns on, and the data "1" appears in the input/output line D5 of the shift register by way of the M22 and M24. Next, the SRMF is set to low level, master feedback for the shift register 1 is turned off, The SRI1 is set to high level M39 is turned on and data is input to the shift register 1. Afterwards, The SRMF1 is set to high level, the M41 is turned on, and data is held by applying the master feedback for the shift register 1. This procedure is repeated in the same way for the MM2, MM7 and MM8, and the respective data is input to the shift registers 2, 3, and 4. Finally, the SRMF and SRSF1, the SRSF2, the SRSF3 and the SRSF4 are alternately inverted, the four shift registers are operated simultaneously and the data output externally.

The write operation is related next. The data for input to the shift register is arranged in the DI1, DI2, DI3 and DI4, alternately inverted in the SRMF and SRSF1, the SRSF2, the SRSF3 and the SRSF4, the four shift registers operated simultaneously and the data transferred to a specified data line. When transfer of data is complete, the SRSF is set to a low level, the SRMF1, SRSF2, SRSF3 and the SRSF4 are set to high level and feedback applied only in the master section. After this step, the SR01, SRI1, T2G are set to high level as shown in the second embodiment, the M44, M39 and M25 are turned on, data transferred to the input/output line D3 of the sensing amplifier and write performed.

The erase-verify operation is next explained. Erase-verify is performing readout of memory cells that were erased, verifying that the erasure was correct and once again performing erasure on memory cells whose erasure was insufficient. Erasure can be performed simultaneously on both the upper and lower memory cells as shown in the second embodiment but erasure during erase-verify must separately for the upper and lower memory cells. First, readout is performed and data input to the shift register. Next, the AOG is set to high level, M31, M33 turned on and the input/output lines D5, D6 for the shift register are set to ground level. After next setting the AL0 to high level, a high impedance state is set. Next, the SRO1 is set to high level and M44 turned on, and the data of the shift register 1 then output. The data from the shift registers 2 through 4 is then sequentially output in the same way. If all of the data that is output is "0", then a high AL0 voltage is maintained without turning M32, M34 off. If even one of this output data is a "1", then M32 turns on and the AL0 voltage drops. The AL0 voltage is therefore monitored and a drop in voltage indicates the erase is incomplete.

The write-verify operation is explained next. Verifying that all the readout data is "0" was sufficient in the case of erase-verify however in write-verify the write data is different for each memory cell so that a graph is required showing the write is complete for each memory cell. In this embodiment, this graph is incorporated into the shift register. During the initial write operation, the data written into the shift register is inverted write data (This method is convenient due to the need to match the local data line voltages with the shift register values.). This inverted data is interpreted as a "1" on the write-end graph. In other words, a "0" indicates that writing of a "1" is not complete, a "1" on the other hand, indicates the writing of "1" is complete or was not necessary from the beginning ("0" write). Accordingly, read is performed after writing is complete, and the shift register data is rewritten to a "1" only when the readout data is a "1" and a check can also be made as to whether all the shift register data is "1". The shift register data is rewritten to "1" as described next only in the case when the read out data is a "1". During readout after finished writing, unlike normal readout, the P1 is set to low level but the PO is not set to high level. A high level is then transmitted by way of M22, M24 when the readout data is a "1", however when the readout data is a "0", neither of M21 or M24 turn on so that the shift register data is held. When updating of the write-end flag is finished, a check is made as to whether all the data is a "1". The A1G is first set to low level, the M35, M37 are turned on, and precharging performed on the input/output lines D5, D6 of the shift register. Next, after setting AL1 to low level, a high impedance state is set. The SRO1 is next set to high level and the shift register data is output. The data from the shift registers 2 through 4 is then sequentially output in the same way. If all of the data that is output is "1", then a low AL1 voltage is maintained without turning M36, M38 on. If even one of this output data is a "1", then M32 turns on and the AL1 voltage rises. The AL1 voltage is therefore monitored and a rise in voltage indicates the write is incomplete.

This embodiment achieves rewriting of the write-end flag only when the readout data is "1" during write-verify by using one side of the transfer circuit. Further, an increase in the size of the peripheral circuits is prevented by incorporating the write-end flag into the data input/output shift register. Also, the same dummy cell threshold voltage is used as a reference for each of the readout, write-verify, and erase-verify operations, thus allowing this embodiment to have a strong tolerance to noise.

Any arrangement that achieves static operation may be used as the shift register even if not the structure shown in FIG. 51. Also, if a latch is separately provided for transfer of data to the memory cell, then a shift register functioning by dynamic operation may be used.

Twenty-seventh Embodiment

Figure 52:
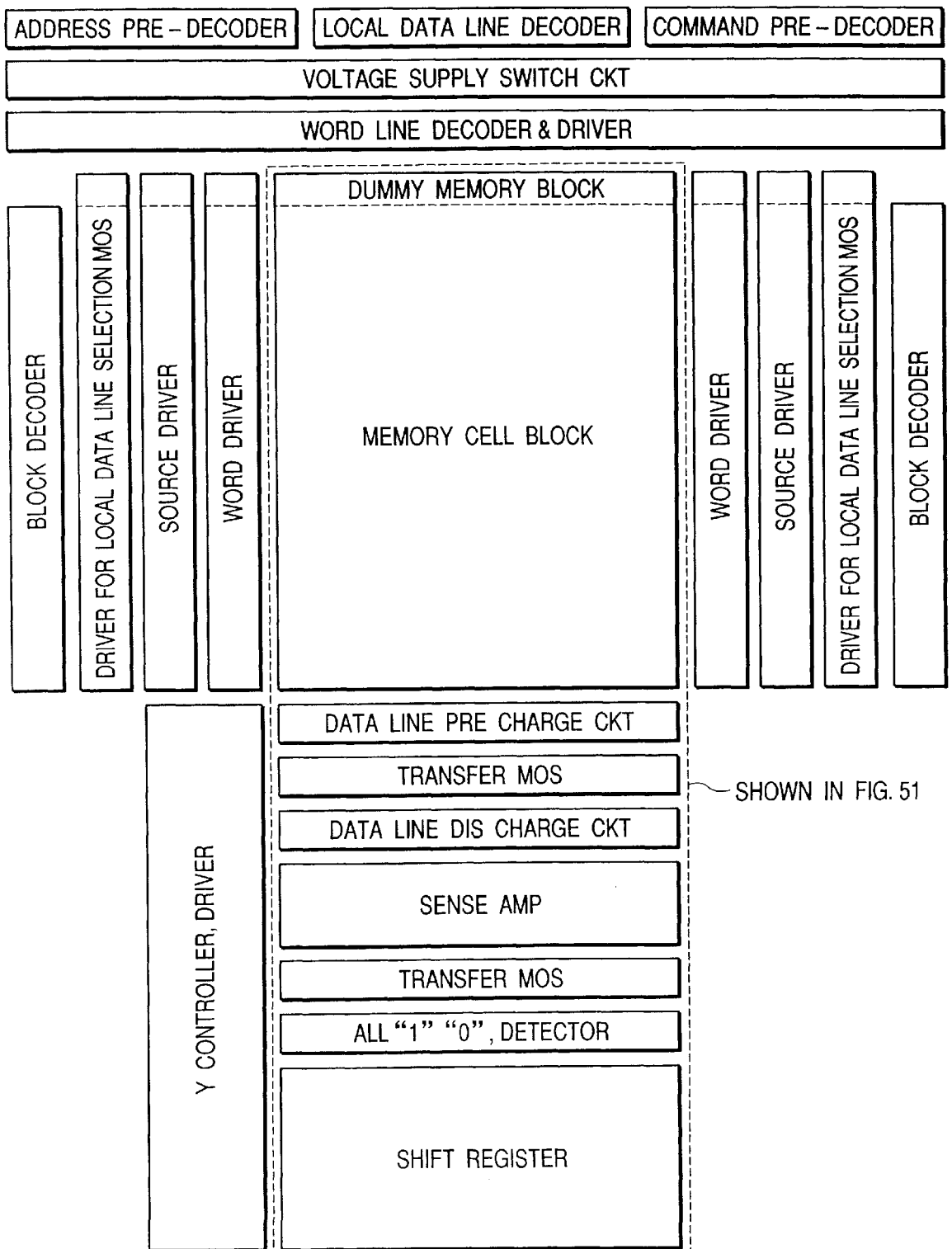
FIG. 52 is a block diagram of the semiconductor device of the twenty-sixth embodiment of the present invention.

The structure of the twenty-seventh embodiment is shown in FIG. 52. The semiconductor memory device of this embodiment is essentially the structure of the twenty-sixth embodiment added with a decoder, a drive circuit and a control circuit. A plurality of memory blocks are positioned in the center and one of these is a dummy memory block. The operation is described next. First, a command indicating an operation such as readout, erase or write is input into the command pre-decoder. A voltage corresponding to each command is then supplied to each of the drive circuits by means of a voltage switching circuit, according to the command that was input. An address signal is next input into the address decoder and a memory cell selected. If a signal is then input with the specified timing such as shown for the twenty-fifth embodiment while in this state, then readout, erase or write will be performed on the corresponding target memory cell.

The memory cell selection method is next explained in detail. address signal is input to the address pre-decoder and the local data line decoder. The signal from the address pre-decoder is split into two signals and input to the block decoder and the word line decoder. This process allows one word line of one block to be selected.

Selection of the upper and lower data lines is accomplished by way of signals from the local data line decoder. The upper and lower local data lines may be selected separately or may be selected simultaneously however this selection is determined by the command pre-decoder. This embodiment enables a semiconductor memory device to be achieved on a large scale.

Twenty-eighth Embodiment

Figure 53:
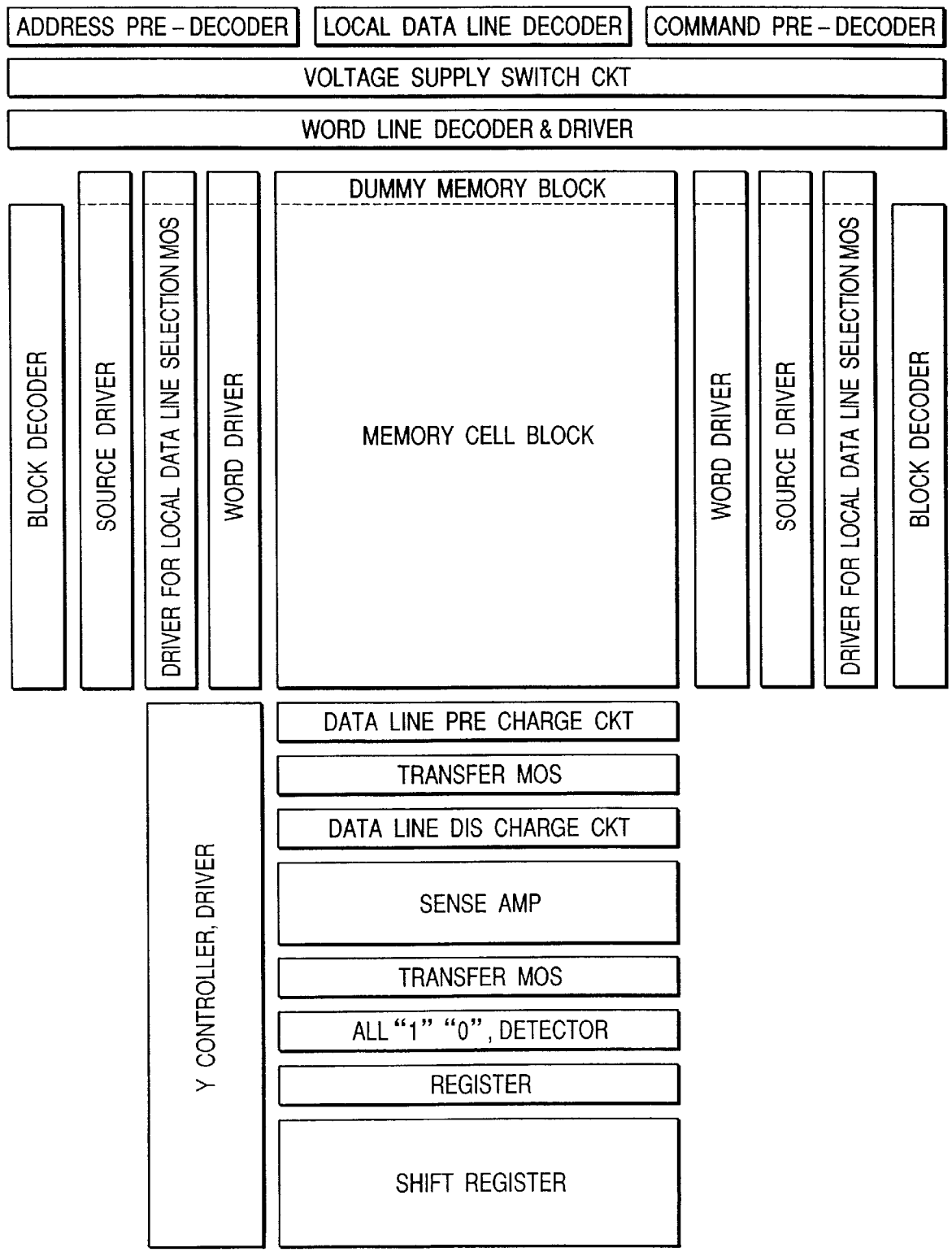
FIG. 53 is a block diagram of the semiconductor device of the twenty-seventh embodiment of the present invention.

The structure of the twenty-eighth embodiment is shown in FIG. 53. This embodiment has one additional shift register added to shift register of the twenty-seventh embodiment thus allowing refresh operation.

This invention, configured as described above, provides a semiconductor memory device with high integration yet small size and a control method thereof.

What is claimed is:

1. A semiconductor memory device having memory cell blocks each comprised of a plurality of memory cells positioned at the cross points of intersecting word lines and data lines, and a peripheral circuit to supply signals to said word lines and said data lines; and said memory cell being comprised of a substrate, a first area laminated on said substrate, an insulating film, a second area, a channel region interconnecting said first area and said second area, a gate electrode for applying an electrical field to said channel region, and an electric charge trap area and wherein information storage is performed by changing the semiconductor threshold voltage by controlling the quantity of carriers in said electric charge trap area and wherein at least a portion of said peripheral circuit is a CMOS circuit comprised of nMOS transistors and pMOS transistors.

2. A semiconductor device according to claim 1 wherein minute particles in said electric charge trap area have an average size within 10 nm and are comprised of semiconductor or metallic material.

3. A semiconductor memory element according to claim 1 wherein said channel region is a semiconductor thin layer having an average thickness within 10 nm.

4. A semiconductor memory device according to claim 1 wherein said channel region serves as an electric charge trap area.

5. A semiconductor memory device according to claim 1 wherein at least one of a first region or a second region is formed within a substrate.

6. A semiconductor memory element according to claim 1 wherein said first region or a drain region is comprised of polycrystalline silicon.

7. A semiconductor memory element according to claim 1 wherein the effective width of said channel region has a minimum value within 20 nm.

8. A semiconductor memory element according to claim 1 wherein the structure positioned with a plurality of memory cells is stacked structure of two layers or more.

9. A semiconductor memory device according to claim 8 wherein two memory cells of said first region having an upper and lower positional relationship are each connected to the same data line by way of respective selection transistors.

10. A semiconductor memory device according to claim 1 wherein said semiconductor memory device has a control circuit to perform three steps consisting of a first step to apply a write voltage to said memory cell, a second step to read out the information stored in said memory cell after said first step and, a third step to again apply a write voltage when the writing of information for a memory cell in said second step was insufficient.

11. A semiconductor memory device according to claim 10 having an information holding circuit to hold information written (or an element list for writing information "0" or information "1") in said memory cell in said memory cell external section and wherein the write operation is performed once again when information stored in said information holding circuit after application of a write voltage does not match the information state of said semiconductor memory element.

12. A semiconductor memory device according to claim 10 wherein two or more bits of information can be stored in one memory cell by utilizing a plurality of values in write voltages applied to said memory cell.

13. A semiconductor memory device according to claim 1 wherein said CMOS circuit contains a MOS transistor with a triple layer well structure.

14. A semiconductor memory device having a laminated structure comprising a first local data line, a first intermediate layer on said first local data line, a source line on said first intermediate layer, a second intermediate layer on said source line, and a second local data line on said second intermediate layer; and a first channel region connected to said source line and said first local data line positioned on the side surface of said laminated structure, and a second channel region connected to said source line and said second local data line positioned on the side surface of said laminated structure, an electric charge trap area enclosed by a potential barrier positioned in close vicinity or inside said channel region, and a word line connected by way of said channel region and gate insulating film and two semiconductor information elements formed above and below at the cross points of said local data line and word line, and wherein information storage is performed by changing the semiconductor threshold voltage by controlling the quantity of carriers in said electric charge trap area, and semiconductor memory elements are arranged in a serial array by arranging a plurality of said local data lines and word lines, and said first and said second local data line are connected to the same global data line by way of the select transistors.

15. A semiconductor memory device according to claim 14 wherein said select transistors each have different gate electrodes.

16. A semiconductor memory device according to claim 14 wherein said global data line is placed to overlap said first and said second local data lines.

17. A semiconductor memory device according to claim 14 wherein a contact hole for connecting the global data line and selection transistor is positioned between the contact holes for connecting said first and said second local data lines and selection transistor.

18. A semiconductor memory device according to claim 14 wherein said first and said second local data lines have different gate electrodes and further connect to the same global data line by way of the shared structure of a diffusion layer for the selection transistor, and the contact hole for the global data line and said shared diffusion layer runs through at least one local data line.

19. A semiconductor memory device according to claim 14 having a dummy data line formed of the same material and in parallel with said local data line, having essentially the same line width as the local data line, and said dummy data line is not used for storing of information.

20. A semiconductor memory device according to claim 14 having an insulating film formed on the inside wall of the contact hole corresponding to said source line or said local data line.

21. A semiconductor memory device according to claim 14 wherein a semiconductor material deposited on the side surface of an insulating film isolating said source line and said local data line has an oxidized insulating film.

22. A semiconductor memory device according to claim 14 wherein said semiconductor memory has a semiconductor element formed on a semiconductor substrate surface; and the contact hole position overlaps the gate electrode or the diffusion layer of the semiconductor element formed on said semiconductor substrate, and also at least the source data line or local data line.

23. A semiconductor memory device according to claim 14 having a dummy pattern not used as the local data line but made from the same material as the local data line and further having a structure in which the contact hole for the word line is positioned on said dummy pattern.

24. A semiconductor memory device according to claim 14 having a dummy pattern not used as the local data line but made from the same material as the local data line and an insulating film spanning one micron or more in the longitudinal direction of the dummy pattern on the side surface of the insulating film of said dummy pattern.

25. A semiconductor memory device according to claim 14 wherein a power supply line for the readout circuit for read out of information from said semiconductor memory element runs parallel to the word line.

26. A semiconductor memory device according to claim 14 wherein said global data line utilizes the second layer from the bottom or the topmost metal wiring layer.

27. A semiconductor memory device according to claim 14 having a readout circuit for read out of information from said semiconductor memory element connected to said global data line and the wiring for said information readout circuit utilizes the metal wiring of a layer below the global data line.

28. A semiconductor memory device according to claim 14 wherein said local data line is connected to the global data line by way of a MOS transistor.

29. A semiconductor memory device according to claim 14 wherein said first and second local data lines are connected to the same global data line by way of selection transistors each having different gate electrodes, and said first and second local data lines are mutually input with inverted signals by the respective connected gate electrodes.

30. A semiconductor memory device according to claim 14 having a control device to perform a first action to erase information stored in said semiconductor memory element, a second action to once again perform erasure of said semiconductor element when the erasure after said first action is incomplete, a third action to write a "0" information or a "1" information on said semiconductor element, a fourth action to once again write on said semiconductor element when the writing performed after said third action was incomplete, and a fifth action to read out information stored in said semiconductor element, and further having a register to hold a "0" information or a "1" information in the external section of said semiconductor device, and a means to hold a list of said semiconductor memory elements for which erasure is complete or a list of said semiconductor memory elements whose erasure is incomplete after said first action and, a means to hold information written in said semiconductor memory element during said third action, and a means to hold a list of said semiconductor memory elements for which erasure is complete or a list of said semiconductor memory elements whose erasure is incomplete after said third action and, a means using same said register to hold information readout from said semiconductor memory element during said fifth action.

31. A semiconductor memory circuit according to claim 14 having an action to write a. "0" information or a "1" information on said semiconductor element, a second action to once again write on said semiconductor element when the writing performed after said first action was incomplete, and further having a register to hold a list of said semiconductor memory elements for which writing is complete or a list of said semiconductor memory elements whose writing is incomplete after said first action, and having a means to once again write said register values on said semiconductor memory elements for which writing is complete.

32. A semiconductor memory device according to claim 31 wherein a means to rewrite the values of said register when the information showing completion of said write is a high level voltage is comprised of one p type MOS transistor and one n type MOS transistor, and wherein a source for said n type MOS transistor is connected to a high level power supply, said p type MOS transistor drain is connected to said n type MOS transistor drain, information showing completion of said write is input to the gate of said n type MOS transistor, source of said n type MOS transistor is connected to the input terminal of a register holding information showing that said writing is complete, and a control signal is input to the gate of said p type MOS transistor.

33. A semiconductor memory device according to claim 31 wherein a means to rewrite the values of said register when the information showing completion of said write is a low level voltage is comprised of one n type MOS transistor and one p type MOS transistor, and wherein a source for said p type MOS transistor is connected to a low level power supply, said n type MOS transistor drain is connected to said p type MOS transistor drain, information showing completion of said write is input to the gate of said p type MOS transistor, source of said p type MOS transistor is connected to the input terminal of a register holding information showing that said writing is complete, and a control signal is input to the gate of said n type MOS transistor.

34. A semiconductor memory device formed on a substrate and comprised of a plurality of memories for storing information by the accumulation or discharge of electrical charges and wherein a set of two of said memory cells are disposed vertically on said substrate, said plurality of memories are respectively connected to data lines and word lines, and when selecting at least one of a plurality of memory cells, an address signal is input to an address pre-decoder and local data line decoder, one word line is selected by a signal from the address pre-decoder, a data line is selected by means of the signal from the local data line decoder, and in selection of applicable data, data lines for a set of two of said vertically disposed memory cells are in some cases selected simultaneously and in some cases selected separately.

* * * * *

UNITED STATES PATENT AND TRADEMARK OFFICE
CERTIFICATE OF CORRECTION

PATENT NO.     : 6,040,605
DATED          : March 21, 2000
INVENTOR(S)    : Sano et al.

It is certified that error appears in the above-identified patent and that said Letters Patent is hereby corrected as shown below:

<u>Title page,</u>
Item [73], "Assignee:  Hitachi, Ltd., Tokyo, Japan" should be changed to
-- Assignees:  Hitachi, Ltd; Hitachi Device Engineering Co., Ltd., both of Tokyo, Japan. --

Signed and Sealed this

Seventh Day of January, 2003

JAMES E. ROGAN
*Director of the United States Patent and Trademark Office*